(12) United States Patent
Sekine

(10) Patent No.: US 9,444,459 B2
(45) Date of Patent: Sep. 13, 2016

(54) LOGIC CIRCUIT AND SEMICONDUCTOR DEVICE

(75) Inventor: Yusuke Sekine, Yamoto (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 465 days.

(21) Appl. No.: 13/461,282

(22) Filed: May 1, 2012

(65) Prior Publication Data

US 2012/0280715 A1 Nov. 8, 2012

(30) Foreign Application Priority Data

May 6, 2011 (JP) ................... 2011-103821

(51) Int. Cl.
*H03K 19/20* (2006.01)
*H03K 19/094* (2006.01)
*H03K 19/00* (2006.01)

(52) U.S. Cl.
CPC ...... *H03K 19/0016* (2013.01); *H03K 19/0013* (2013.01); *H01L 2924/0002* (2013.01)

(58) Field of Classification Search
CPC ................... H03K 19/17728; H03K 19/1733; H03K 19/173; H03K 19/20
USPC ........... 326/83, 93, 95, 98, 108, 114, 54–55, 326/102–104, 112–113, 121–122
See application file for complete search history.

(56) References Cited

U.S. PATENT DOCUMENTS

| | | | |
|---|---|---|---|
| 3,775,693 A | 11/1973 | Proebsting | |
| 4,800,303 A | 1/1989 | Graham et al. | |
| 5,039,883 A * | 8/1991 | On | 326/50 |
| 5,508,641 A * | 4/1996 | Appenzeller et al. | 326/113 |
| 5,528,032 A | 6/1996 | Uchiyama | |
| 5,731,856 A | 3/1998 | Kim et al. | |
| 5,744,864 A | 4/1998 | Cillessen et al. | |
| 5,781,062 A | 7/1998 | Mashiko et al. | |
| 5,808,483 A * | 9/1998 | Sako | 326/113 |
| 5,980,092 A | 11/1999 | Merryman et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Rhyne; "Fundamentals of Digital Systems Design"; 1973; pp. 70-71; N.J.

(Continued)

*Primary Examiner* — Anh Tran
(74) *Attorney, Agent, or Firm* — Fish & Richardson P.C.

(57) ABSTRACT

The logic circuit includes an input terminal, an output terminal, a main logic circuit portion that is electrically connected to the input terminal and the output terminal, and a switching element electrically connected to the input terminal and the main logic circuit portion. Further, a first terminal of the switching element is electrically connected to the input terminal, a second terminal of the switching element is electrically connected to a gate of at least one transistor included in the main logic circuit portion, and the switching element is a transistor in which a leakage current in an off state per micrometer of channel width is lower than or equal to $1 \times 10^{-17}$ A.

27 Claims, 25 Drawing Sheets

(56) References Cited

U.S. PATENT DOCUMENTS

| | | | |
|---|---|---|---|
| 6,049,883 A | 4/2000 | Tjandrasuwita | |
| 6,078,194 A | 6/2000 | Lee | |
| 6,204,695 B1 | 3/2001 | Alfke et al. | |
| 6,281,710 B1 | 8/2001 | Poirier et al. | |
| 6,294,274 B1 | 9/2001 | Kawazoe et al. | |
| 6,479,329 B2 | 11/2002 | Nakajima et al. | |
| 6,563,174 B2 | 5/2003 | Kawasaki et al. | |
| 6,573,754 B2 | 6/2003 | Menczigar et al. | |
| 6,727,522 B1 | 4/2004 | Kawasaki et al. | |
| 6,822,478 B2 | 11/2004 | Elappuparackal | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,076,748 B2 | 7/2006 | Kapoor et al. | |
| 7,105,868 B2 | 9/2006 | Nause et al. | |
| 7,202,863 B2 * | 4/2007 | Kimura et al. | 345/204 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,394,294 B2 | 7/2008 | Akahori | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,582 B2 | 8/2009 | Lee et al. | |
| 7,595,665 B2 | 9/2009 | Park et al. | |
| 7,674,650 B2 | 3/2010 | Akimoto et al. | |
| 7,732,819 B2 | 6/2010 | Akimoto et al. | |
| 7,952,392 B2 | 5/2011 | Koyama et al. | |
| 8,305,109 B2 | 11/2012 | Okazaki et al. | |
| 8,373,443 B2 | 2/2013 | Koyama et al. | |
| 9,083,334 B2 | 7/2015 | Koyama et al. | |
| 2001/0013796 A1 | 8/2001 | Li et al. | |
| 2001/0046027 A1 | 11/2001 | Tai et al. | |
| 2002/0036529 A1 | 3/2002 | Furusawa et al. | |
| 2002/0056838 A1 | 5/2002 | Ogawa | |
| 2002/0132454 A1 | 9/2002 | Ohtsu et al. | |
| 2003/0036529 A1 | 2/2003 | Christianson et al. | |
| 2003/0129853 A1 | 7/2003 | Nakajima et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0119114 A1 * | 6/2004 | King | 257/327 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0038582 A1 | 2/2006 | Peeters | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119394 A1 * | 6/2006 | Dronavalli | 326/121 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0024318 A1 | 2/2007 | Mamidipaka | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0161165 A1 | 7/2007 | Liu et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0206959 A1 | 8/2008 | Takayama et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0027083 A1 * | 1/2009 | Kimura et al. | 326/82 |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0256784 A1 | 10/2009 | Ahn | |
| 2009/0278122 A1 | 11/2009 | Hosono et al. | |
| 2009/0280600 A1 | 11/2009 | Hosono et al. | |
| 2009/0310734 A1 * | 12/2009 | Umezaki | 377/64 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0062992 A1 | 3/2011 | Okazaki et al. | |
| 2011/0069047 A1 | 3/2011 | Koyama et al. | |
| 2011/0084731 A1 | 4/2011 | Kawae | |
| 2011/0089975 A1 | 4/2011 | Yamazaki et al. | |
| 2011/0090184 A1 | 4/2011 | Yamazaki et al. | |
| 2011/0101332 A1 | 5/2011 | Yamazaki et al. | |
| 2011/0101351 A1 | 5/2011 | Yamazaki | |
| 2011/0102018 A1 | 5/2011 | Shionoiri et al. | |
| 2011/0121878 A1 | 5/2011 | Kato et al. | |
| 2011/0156027 A1 | 6/2011 | Yamazaki et al. | |
| 2011/0285372 A1 | 11/2011 | Takahashi et al. | |
| 2011/0285426 A1 | 11/2011 | Takahashi et al. | |
| 2011/0285442 A1 | 11/2011 | Saito | |
| 2012/0032785 A1 | 2/2012 | Kamata | |
| 2012/0057396 A1 | 3/2012 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 09-064715 A | 3/1997 |
| JP | 11-505377 A | 5/1999 |

(56) References Cited

FOREIGN PATENT DOCUMENTS

| JP | 2000-044236 A | 2/2000 |
|---|---|---|
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-219882 A | 9/2008 |
| JP | 2011-086929 A | 4/2011 |
| TW | 201110322 | 3/2011 |
| WO | 2004/114391 A1 | 12/2004 |
| WO | WO-2011/034012 | 3/2011 |

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4)a: Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

(56) References Cited

OTHER PUBLICATIONS

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using Cg-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YbFe2O4, and Yb2Fe3O7 Types of Structures for Compounds in the In2O3 and SC2O3—A2O3—Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.
Taiwanese Office Action (Application No. 101115376) Dated May 24, 2016.

\* cited by examiner

10

20

30

40

310

400

410

520

620

FIG. 19A  FIG. 19B
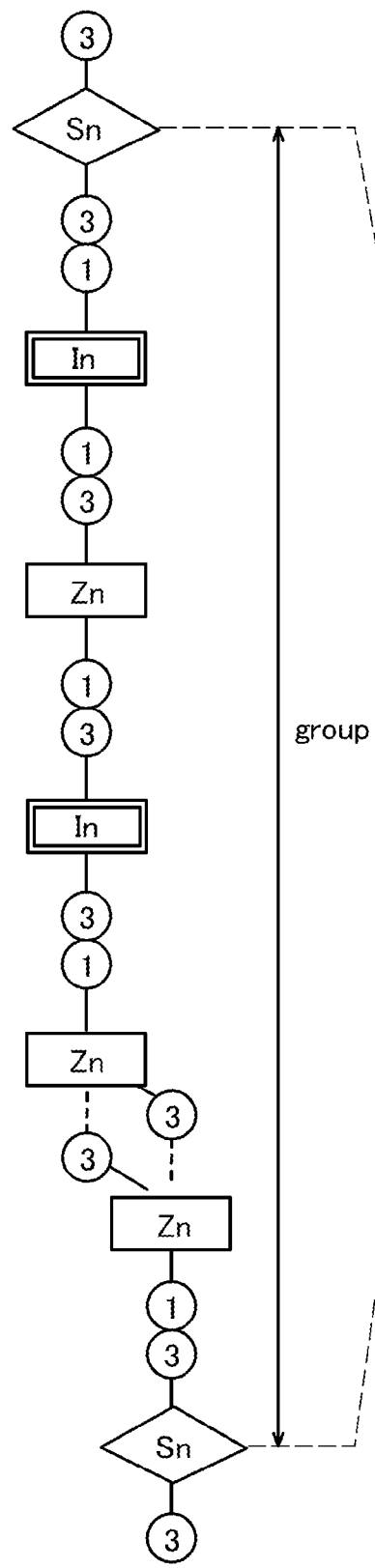
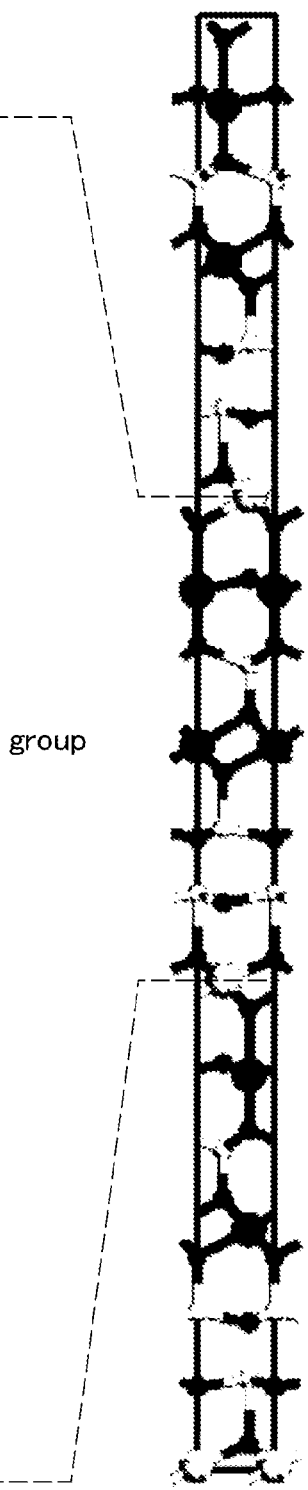
FIG. 19C
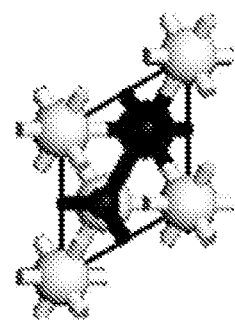
- ● In
- ☾ Sn
- ⸱ Zn
- • O

LOGIC CIRCUIT AND SEMICONDUCTOR DEVICE

BACKGROUND OF THE INVENTION

1. Field of the Invention

The present invention relates to a logic circuit including a semiconductor element such as a transistor. The invention further relates to a semiconductor device including the logic circuit.

The semiconductor device in this specification refers to all devices that can function by utilizing semiconductor characteristics; a semiconductor circuit including the logic circuit and an electronic device such as an electro-optic device and a light-emitting display device each including the semiconductor circuit are all semiconductor devices.

2. Description of the Related Art

A general circuit including transistors formed by using a Si wafer or SOI (silicon on insulator) substrate can operate at a low voltage by microfabrication, and thus the circuit (and a semiconductor device including the circuit as well) has low power consumption.

Logic circuits for performing arithmetic processing operate when a power is supplied (the power supply is ON), and stop the operation when the power supply is stopped (the power supply is OFF). In the logic circuits, when the power supply is OFF, the contents of the processing performed right before the power supply is OFF are erased.

For example, as a logic circuit including a sequential circuit for storing logic states, such as a register circuit, a latch circuit, or a flip-flop circuit, there is a logic circuit in which a virtual power line and a virtual ground line are provided between a real power line and a real ground line, a p-channel transistor is provided between the real power line and the virtual power line, an n-channel transistor is provided between the real ground line and the virtual ground line, and the sequential circuit is provided between the virtual power line and the virtual ground line (see Patent Document 1). The logic circuit can operate in such a manner that the p-channel transistor and the n-channel transistor repeat turning on and turning off periodically so as to prevent a lack of data to be held in the logic circuit.

Further, the logic circuit can be configured by using a CMOS circuit including an n-channel transistor and a p-channel transistor, in which case, however, the off-state current is increased by microfabrication of a MOS transistor. Thus, there is a problem of increase in power consumption in a non-operating period (power consumption in a standby mode, hereinafter also referred to as standby power). For example, in a silicon MOS transistor having a channel length reduced to approximately 0.1 µm or less, even when the voltage applied to a gate when a potential of the source is used as a reference potential (this voltage is also referred to as Vgs) is lower than the threshold voltage, the value of current between the source and a drain cannot be zero. In this specification, current which flows between the source and the drain when the Vgs of the transistor is lower than the threshold voltage thereof is referred to as off-state current.

To prevent the increase of the standby power due to the off-state current, a technique using a switching transistor has been proposed (see Patent Document 2). The technique disclosed in Patent Document 2 is as follows: a switching transistor having low off-state current compared to a CMOS circuit is provided between a power supply and the CMOS circuit; the switching transistor is turned off when the CMOS circuit does not operate (when the CMOS circuit is not in operation) so that standby power is reduced.

REFERENCE

Patent Document

[Patent Document 1] Japanese Published Patent Application No. H09-064715
[Patent Document 2] Japanese Published Patent Application No. 2008-219882

SUMMARY OF THE INVENTION

However, as in the technique disclosed in Patent Document 1, when the virtual power line and the virtual ground line are provided in addition to the real power line and the real ground line and when transistors of opposite conductivity types are formed, the number of steps for fabricating a logic circuit is increased and the transistors occupy a larger area in the logic circuit; therefore, such a technique is not suitable for microfabrication of the logic circuit.

Further, as in the technique disclosed in Patent Document 2, when the switching transistor is provided, the channel width of the switching transistor needs to be equivalent to or more than that of a transistor included in a CMOS circuit, in order to supply sufficient current to the CMOS circuit and secure operation of the CMOS circuit. Therefore, in terms of fabrication process, it is difficult to suppress the off-state current of the switching transistor itself by making the channel width of the switching transistor smaller than the channel width of a transistor included in an integrated circuit.

From the above, an object of one embodiment of the invention is to provide a logic circuit which is suitable for microfabrication and in which, a potential input right before a power supply is OFF can be held while the power supply is OFF during arithmetic processing. It is another object to provide a semiconductor device including the logic circuit.

One embodiment of the invention is as follows: in a logic circuit which is provided between a high-potential-side power supply potential line and a low-potential-side power supply potential line and which includes one or more input terminals and one or more output terminals, a switching element (e.g., a transistor) having extremely low off-state current is provided in a current path (also referred to as leakage path) that decreases a potential input to the logic circuit or a potential obtained by arithmetic processing, so that the input potential or the potential obtained by the arithmetic processing is held even after the power supply to the logic circuit is OFF.

One embodiment of the invention is a logic circuit including an input terminal, an output terminal, a main logic circuit portion that is electrically connected to the input terminal and the output terminal, and a switching element electrically connected to the input terminal and the main logic circuit portion. Further, a first terminal of the switching element is electrically connected to the input terminal, a second terminal of the switching element is electrically connected to a gate of at least one transistor included in the main logic circuit portion, and the switching element is a transistor in which a leakage current in an off state per micrometer of channel width is lower than or equal to $1 \times 10^{-17}$ A.

According to another embodiment of the invention, the above logic circuit may include a plurality of input terminals. In that case, a plurality of switching elements are provided so that the number of the plurality of switching elements is the same as the number of the plurality of input terminals. Further, the first terminal of each of the plurality of switching elements is electrically connected to a corresponding input terminal among the plurality of input terminals, and the second terminal of each of the plurality of switching elements is electrically connected to the gate of at least one transistor included in the main logic circuit portion.

Another embodiment of the invention is a logic circuit including an input terminal; an output terminal; a main logic circuit portion that is electrically connected to the input terminal, the output terminal, a high-potential-side power supply potential line, and a low-potential-side power supply potential line. Further, the main logic circuit portion includes a first switching element and a second switching element in current paths formed between the high-potential-side power supply potential line and the output terminal and between the low-potential-side power supply potential line and the output terminal. Furthermore, a first terminal of the first switching element is electrically connected to the high-potential-side power supply potential line and a second terminal of the first switching element is electrically connected to the output terminal, a first terminal of the second switching element is electrically connected to the low-potential-side power supply potential line and a second terminal of the second switching element is electrically connected to the output terminal, and the first switching element and the second switching element are transistors in each of which a leakage current in an off state per a micrometer of channel width is lower than or equal to $1 \times 10^{-17}$ A. That is, the first and second switching elements are electrically connected to the output terminal in the current paths.

According to another embodiment of the invention, the above logic circuit may include at least three switching elements in the current paths. Further, among the at least three switching elements, a first terminal of at least one switching element is electrically connected to the high-potential-side power supply potential line and a second terminal of the at least one switching element is electrically connected to the output terminal. Furthermore, among the at least three switching elements, a first terminal of the other switching elements is electrically connected to low-potential-side power supply potential line and a second terminal of the other switching elements is electrically connected to the output terminal. That is, even when three or more switching elements are provided in the above current paths, the three or more switching elements are electrically connected to the output terminal.

Examples of the above main logic circuit portion according to one embodiment of the invention include a NOT circuit, a NAND circuit, a NOR circuit, an AND circuit, an OR circuit, an XOR circuit, and an XNOR circuit.

In the above logic circuit according to one embodiment of the invention, in the transistor whose leakage current in an off state per micrometer of channel width is $1 \times 10^{-17}$ A or lower, a channel formation region can be formed using a wide-gap semiconductor such as an oxide semiconductor. In particular, the channel formation region is preferably formed using an oxide semiconductor which has a hydrogen concentration of $5 \times 10^{19}/cm^3$ or lower and in which the amount of oxygen exceeds the stoichiometric composition ratio. The oxide semiconductor in this specification refers to a metal oxide showing semiconductor characteristics. The oxide semiconductor also refers to a metal oxide containing one or more elements selected from indium, gallium, tin, and zinc.

Another embodiment of the invention is a semiconductor device including the above logic circuit according to one embodiment of the invention.

Accordingly, it is possible to provide a logic circuit in which, a potential input right before a power supply is OFF can be held while the power supply is OFF, and after the power supply is ON again, arithmetic processing can be started again immediately from the state right before the power supply is OFF.

By using an oxide semiconductor for an n-channel transistor included in the logic circuit, a CMOS circuit in the logic circuit can be formed by overlapping the n-channel transistor with a p-channel transistor, enabling microfabrication of the logic circuit. Further, since the off-state current of the transistor including an oxide semiconductor is extremely low, it is possible to provide a logic circuit capable of being microfabricated and operating with low power consumption and a semiconductor device including the logic circuit. Note that in this specification, the power consumption includes power consumption in a standby mode (standby power).

BRIEF DESCRIPTION OF THE DRAWINGS

In the accompanying drawings:

FIGS. 19A to 19C are diagrams illustrating the structure of an oxide material according to one embodiment of the invention;

DETAILED DESCRIPTION OF THE INVENTION

Figure 1A:
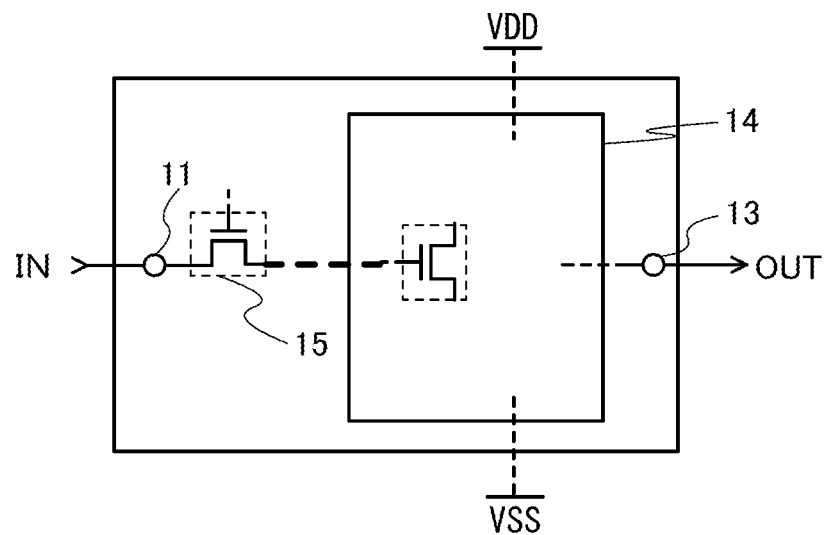
FIGS. 1A and 1B are block diagrams illustrating logic circuits according to embodiments of the invention.

Embodiments of the invention will be described below with reference to the accompanying drawings. However, the invention is not limited to the description below, and those skilled in the art will appreciate that a variety of modifications can be made to the modes and details without departing from the spirit and scope of the invention. Therefore, the invention should not be construed as being limited to the description in the following embodiments. Note that the same portions or portions having the same function in the structure of the invention described below are denoted by the same reference numerals in common among different drawings and repetitive description thereof will be omitted.

Note that in each drawing described in this specification, the size, the film thickness, or the region of each component is exaggerated for clarity in some cases. Therefore, embodiments of the invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

In this specification, the expression "A is electrically connected to B" or "A and B are electrically connected" includes a case where A and B are directly connected to one another and a case where A and B are connected to one another with an object interposed therebetween. Note that A, B, and the object are capable of transferring electric signals between A and B, such as a switching element like a transistor, a capacitor, a resister, an inductor, a terminal, a circuit, a wiring, an electrode, or a conductive film.

In this specification, a "source" includes a source electrode, a region or an object electrically connected to the source electrode (e.g., a source region or a source terminal), and the like. Further, a "drain" includes a drain electrode, a region or an object electrically connected to the drain electrode (e.g., a drain region or a drain terminal), and the like. Since a source and a drain of a transistor change depending on the conductivity type, the operating condition, and the like of the transistor, it is difficult to define which is a source or a drain. Therefore, one of a source terminal and a drain terminal is referred to as first terminal and the other thereof is referred to as second terminal for distinction. Note that a "gate" includes a gate electrode, a region or an object electrically connected to the gate electrode (e.g., a gate terminal), and the like.

Embodiment 1

This embodiment shows an example of a logic circuit according to one embodiment of the invention. First, a logic circuit including one or more input terminals and one or more output terminals is described. Note that in this specification, the logic circuit does not include a high-potential-side power supply potential line nor a low-potential-side power supply potential line, and the output terminal is not electrically connected to a fixed potential or a ground potential, i.e., there is no leakage.

A logic circuit 10 illustrated in FIG. 1A includes a main logic circuit portion 14, a transistor 15 electrically connected to an input terminal 11 to which an input potential signal (IN) is input, and an output terminal 13 from which an output potential signal (OUT) obtained by arithmetic processing is output. The main logic circuit portion 14 is electrically connected to a high-potential-side power supply potential line and a low-potential-side power supply potential line. The input terminal 11 is electrically connected to a first terminal of the transistor 15, and a second terminal of the transistor 15 is electrically connected to a gate of a transistor included in the main logic circuit portion 14. The main logic circuit portion 14 may include another transistor, a capacitor, a resistor, and the like.

When the transistor 15 is turned on (when the Vgs of the transistor 15 is higher than the threshold voltage thereof), the main logic circuit portion 14 performs the arithmetic processing based on the input potential signal. That is, when a high potential is input to the gate of the transistor 15, depending on the input potential signal, the logic circuit 10 outputs a high potential which is a high-potential-side power supply potential (also referred to as VDD) corresponding to the high-potential-side power supply potential line (not illustrated) or a low potential which is a low-potential-side power supply potential (also referred to as VSS) corresponding to the low-potential-side power supply potential line (not illustrated). Note that in this specification, the high-potential-side power supply potential (VDD) can be a given positive potential. Further, the low-potential-side power supply potential (VSS) is lower than the high-potential-side power supply potential, and can be a ground potential or 0 V, for example.

In the logic circuit 10, the transistor 15 is a transistor having extremely low off-state current. In the transistor having extremely low off state current, for example, the value of the off-state current per unit channel width (1 μm) at room temperature (25° C.) is 10 aA/μm ($1 \times 10^{-17}$ A/μm) or less, 1 aA/μm ($1 \times 10^{-18}$ A/μm) or less, 1 zA/μm ($1 \times 10^{-21}$ A/μm) or less, or 1 yA/μm ($1 \times 10^{-24}$ A/μm) or less.

As described above, since the transistor 15 in the logic circuit 10 has extremely low off-state current, after the transistor 15 is turned off (after the Vgs of the transistor 15 becomes lower than the threshold voltage thereof), even when the power supply is OFF during the arithmetic processing, the logic circuit 10 can hold a potential of a node formed between the second terminal of the transistor 15 and the gate of the transistor included in the main logic circuit portion 14 which is electrically connected to the second terminal of the transistor 15. Then, after the power supply is ON again, by turning on the transistor 15, the arithmetic processing can be started again based on the potential held in the node. That is, the arithmetic processing can be started again from the state right before the power supply is OFF. Therefore, an input potential signal does not need to be supplied when the power supply is ON again, and the arithmetic processing can be started again immediately. Further, power consumption of the logic circuit 10 can be reduced.

In this specification, the expression "power supply is OFF" means to set a state where there is no potential difference between the high-potential-side power supply potential line and the low-potential-side power supply potential line. Further, the expression "power supply is ON" means to set a state where a potential difference occurs between the high-potential-side power supply potential line and the low-potential-side power supply potential line.

The logic circuit according to one embodiment of the invention is not limited to a logic circuit including one input terminal and one output terminal, and may be a logic circuit including a plurality of input terminals and a plurality of output terminals. For example, the logic circuit can be configured as a variety of circuits, such as a logic circuit including two input terminals and one output terminal, a logic circuit including two input terminals and two output terminals, and a logic circuit including a plurality of input terminals and one output terminal. In that case, a transistor having extremely low off-state current is electrically connected between each of the plurality of input terminals and the gate of one or more transistors included in the main logic circuit portion.

Figure 1B:
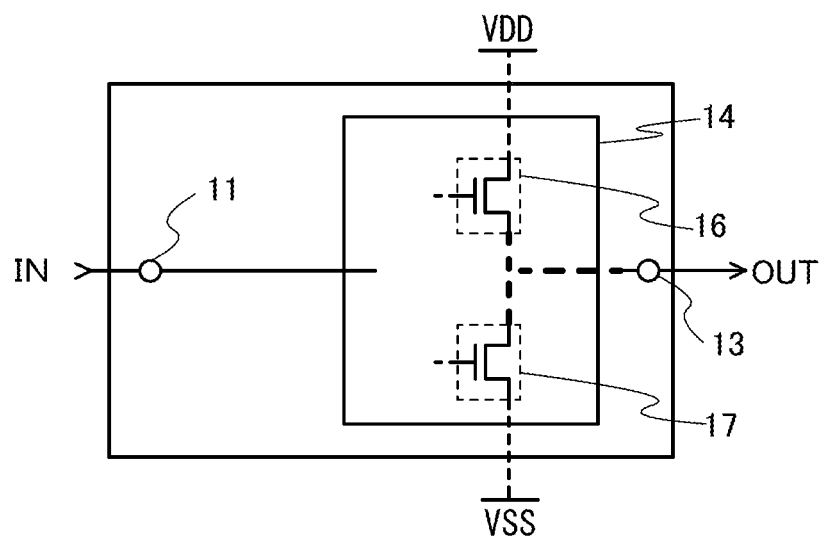

The following shows a modification example of the logic circuit 10. A logic circuit 20 illustrated in FIG. 1B, which is the modification example, includes the main logic circuit portion 14 including two or more transistors having extremely low off-state current, the input terminal 11, and the output terminal 13.

In the main logic circuit portion 14, in current paths formed between the high-potential-side power supply potential line and the output terminal 13 and between the low-potential-side power supply potential line and the output terminal 13, a first transistor 16 and a second transistor 17 are electrically connected to the output terminal.

The high-potential-side power supply potential line is electrically connected to a first terminal of the first transistor 16, and the output terminal 13 is electrically connected to a second terminal of the first transistor 16. The low-potential-side power supply potential line is electrically connected to a first terminal of the second transistor 17, and the output terminal 13 is electrically connected to a second terminal of the second transistor 17.

In the main logic circuit portion 14, between the first terminal of the first transistor 16 and the high-potential-side power supply potential line, between the second terminal of the first transistor 16 and the second terminal of the second transistor 17, and between the first terminal of the second transistor 17 and the low-potential-side power supply potential line, another transistor, a capacitor, a resistor, and the like may be electrically connected.

The logic circuit 20 performs arithmetic processing while the first transistor 16 and the second transistor 17 are on.

In the logic circuit 20, the first transistor 16 and the second transistor 17 have extremely low off-state current, like the transistor 15. Note that examples of the first transistor 16 and the second transistor 17 are the same as the example of the transistor 15.

As described above, since the first transistor 16 and the second transistor 17 in the logic circuit 20 have extremely low off-state current, after the first transistor 16 and the second transistor 17 are turned off (after the Vgs of the first transistor 16 becomes lower than the threshold voltage thereof and the Vgs of the second transistor 17 is lower than the threshold voltage thereof), even when the power supply is OFF during the arithmetic processing, the logic circuit 20 can hold a potential of a node formed between the output terminal 13, the second terminal of the first transistor 16, and the second terminal of the second transistor 17. Then, after the power supply is ON again, by turning on the first transistor 16 and the second transistor 17 (by making the Vgs of the first transistor 16 higher than the threshold voltage thereof and the Vgs of the second transistor 17 higher than the threshold voltage thereof), the arithmetic processing can be started again from the state right before the power supply is OFF. Therefore, an input potential signal is does not need to be supplied when the power supply is ON again, and the arithmetic processing can be started again immediately. Further, power consumption of the logic circuit 20 can be reduced.

In the logic circuit according to one embodiment of the invention, depending on the configuration of the main logic circuit portion, two or more transistors having extremely low off-state current need to be provided in the logic circuit including a plurality of input terminals and one output terminal.

Figure 2A:
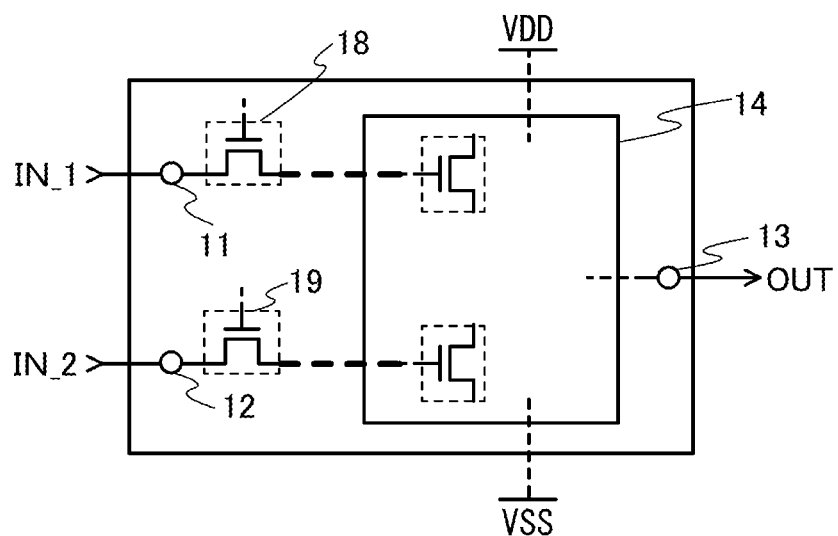
FIGS. 2A and 2B are block diagrams illustrating logic circuits according to embodiments of the invention.
Figure 2B:
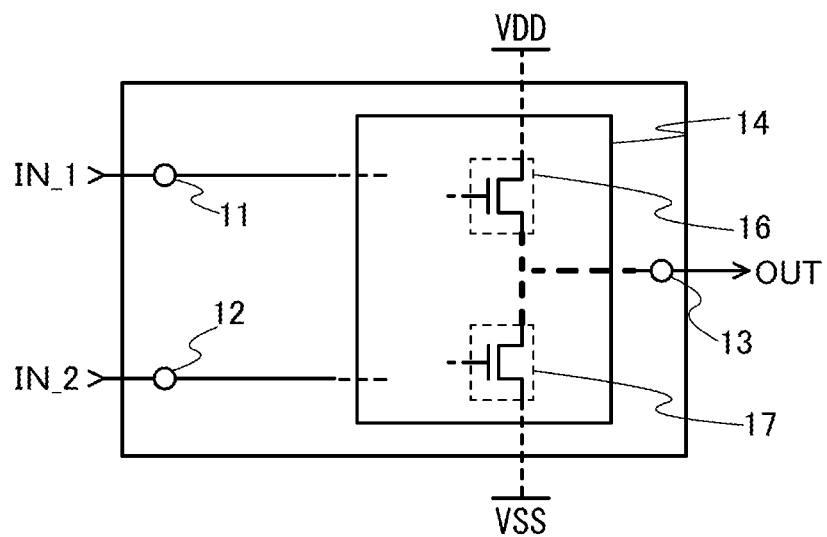

FIGS. 2A and 2B show a logic circuit 30 and a logic circuit 40, respectively, each of which includes two input terminals and one output terminal. The logic circuit 30 includes two input terminals, one output terminal, and transistors having extremely low off-state current, which are provided between the respective input terminals and the main logic circuit portion 14.

The logic circuit 30 includes the main logic circuit portion 14, a first transistor 18 electrically connected to the first input terminal 11 for supplying an input potential signal (IN_1), a second transistor 19 electrically connected to a second input terminal 12 for supplying an input potential signal (IN_2), and the output terminal 13 for outputting an output potential signal (OUT) obtained by arithmetic processing. The main logic circuit portion 14 is electrically connected to the high-potential-side power supply potential line and the low-potential-side power supply potential line. The first input terminal 11 is electrically connected to a first terminal of the first transistor 18, and the second input terminal 12 is electrically connected to a first terminal of the second transistor 19. A second terminal of the first transistor 18 and a second terminal of the second transistor 19 are electrically connected to respective gates of transistors included in the main logic circuit portion 14. The main logic circuit portion 14 may include another transistor, a capacitor, a resister, and the like.

The logic circuit 30 performs arithmetic processing while the first transistor 18 and the second transistor 19 are on.

In the logic circuit 30, the first transistor 18 and the second transistor 19 have extremely low off-state current, like the transistor 15 in the logic circuit 10. Note that examples of the first transistor 18 and the second transistor 19 are the same as the example of the transistor 15.

As described above, since the first transistor 18 and the second transistor 19 in the logic circuit 30 have extremely low off-state current, after the first transistor 18 and the second transistor 19 are turned off (after the Vgs of the first transistor 18 becomes lower than the threshold voltage thereof and the Vgs of the second transistor 19 is lower than the threshold voltage thereof), even when the power supply is OFF during the arithmetic processing, the logic circuit 30 can hold potentials of the following nodes: a node formed between a second terminal of the first transistor 18 and a gate of a transistor which is electrically connected to the second terminal of the first transistor 18 and is included in the main logic circuit portion 14; and a node formed between a second terminal of the second transistor 19 and a gate of a transistor which is electrically connected to the second terminal of the second transistor 19 and is included in the main logic circuit portion 14. Then, after the power supply is ON again, by turning on the first transistor 18 and the second transistor 19

(by making the Vgs of the first transistor 18 higher than the threshold voltage thereof and the Vgs of the second transistor 19 higher than the threshold voltage thereof), the arithmetic processing can be started again based on the potentials held in the nodes. That is, the arithmetic processing can be started again from the state right before the power supply is OFF. Therefore, an input potential signal does not need to be supplied when the power supply is ON again, and the arithmetic processing can be started again immediately. Further, power consumption of the logic circuit 30 can be reduced.

The following shows a logic circuit 40 illustrated in FIG. 2B, which is a modification example of the logic circuit 30. The logic circuit 40 includes two input terminals, one output terminal, and transistors having extremely low off-state current in a main logic circuit portion, like the logic circuit 20 illustrated in FIG. 1B.

The logic circuit 40 illustrated in FIG. 2B includes the main logic circuit portion 14 including two or more transistors, the first input terminal 11, the second terminal 12, and the output terminal 13 for outputting an output potential signal (OUT) obtained by arithmetic processing.

In the main logic circuit portion 14, in current paths formed between the high-potential-side power supply potential line and the output terminal 13 and between the low-potential-side power supply potential line and the output terminal 13, the first transistor 16 and the second transistor 17 are electrically connected to the output terminal.

The high-potential-side power supply potential line is electrically connected to the first terminal of the first transistor 16, and the output terminal 13 is electrically connected to the second terminal of the first transistor 16. The low-potential-side power supply potential line is electrically connected to the first terminal of the second transistor 17, and the output terminal 13 is electrically connected to the second terminal of the second transistor 17.

In the main logic circuit portion 14, between the first terminal of the first transistor 16 and the high-potential-side power supply potential line, between the second terminal of the first transistor 16 and the second terminal of the second transistor 17, and between the first terminal of the second transistor 17 and the low-potential-side power supply potential line, another transistor, a capacitor, a resistor, and the like may be electrically connected.

The logic circuit 40 performs arithmetic processing while the first transistor 16 and the second transistor 17 are on.

In the logic circuit 40, the first transistor 16 and the second transistor 17 have extremely low off-state current, like the transistor 15 in the logic circuit 10. Note that examples of the first transistor 16 and the second transistor 17 are the same as the example of the transistor 15.

The operation principle of the logic circuit 40 is the same as that of the logic circuit 20. That is, a potential of a retention node is a potential of a node formed between the output terminal 13, the second terminal of the first transistor 16, and the second terminal of the second transistor 17. Therefore, an input potential signal does not need to be supplied when the power supply is ON again, and the arithmetic processing can be started again immediately. Further, power consumption of the logic circuit 40 can be reduced.

In the logic circuits 10, 20, 30, and 40, the transistor(s) included in the main logic circuit portion 14 can also be a transistor(s) having extremely low off-state current, which can be applied to the transistor 15 in the logic circuit 10. In this manner, the potential of the retention node can be prevented from being decreased by passing through the transistor(s) and being decreased, and the power consumption can be further reduced.

From the above, by reducing the power consumption of the logic circuits 10, 20, 30, and 40, a semiconductor device including at least one of the logic circuits 10, 20, 30, and 40 can also have lower power consumption. Further, by reducing the power consumption of the logic circuits 10, 20, 30, and 40, an external circuit for operating the logic circuits 10, 20, 30, and 40 can have a lighter load. Thus, the functionality of a semiconductor device including at least one of the logic circuits 10, 20, 30, and 40 and the external circuit can be expanded.

Note that the contents of this embodiment or part thereof can be combined freely with the contents of other embodiments or part thereof.

Embodiment 2

This embodiment shows examples of the logic circuit described in Embodiment 1. Specifically, a NOT circuit (inverter circuit) is described with reference to FIGS. 3A and 3B. Note that in some circuit diagrams, a circuit symbol using a dotted line and "OS" are shown together in order to indicate that the transistor includes an oxide semiconductor. Further, since the logic circuits described in this embodiment are examples of the logic circuit described in Embodiment 1, the reference numerals used in Embodiment 1 are used as appropriate.

[Configuration Example and Operation Example of the Logic Circuit]

Figure 3A:
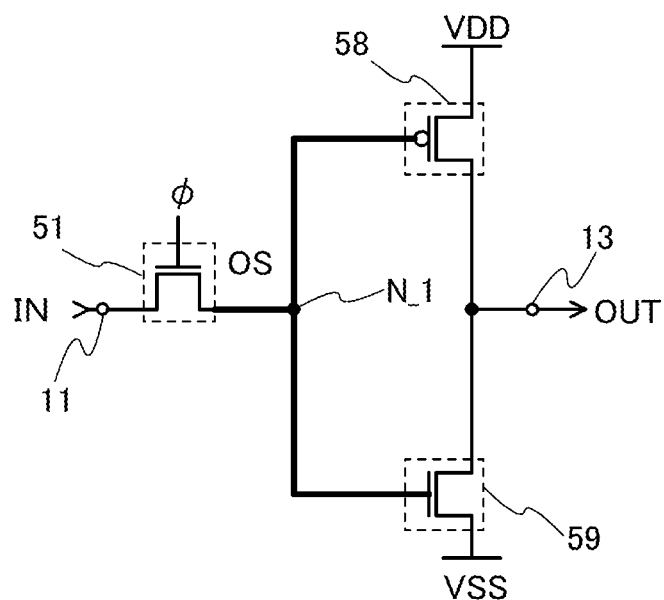
FIGS. 3A and 3B are circuit diagrams illustrating logic circuits according to embodiments of the invention.

A logic circuit 50 illustrated in FIG. 3A is a logic circuit in which an n-channel transistor is additionally provided and electrically connected to a NOT circuit. Although this embodiment shows a circuit in which the NOT circuit is configured by a CMOS circuit that is suitable for microfabrication, the NOT circuit may be configured to include a resistor, a diode, and the like.

The logic circuit 50 includes an n-channel transistor 51, a p-channel transistor 58, and an n-channel transistor 59. In particular, the n-channel transistor 51 has extremely low off-state current.

In the logic circuit 50, a first terminal of the n-channel transistor 51 is electrically connected to the input terminal 11 for supplying an input potential signal (IN); a second terminal of the n-channel transistor 51, a gate of the p-channel transistor 58, and a gate of the n-channel transistor 59 are electrically connected to one another; the high-potential-side power supply potential line for supplying a high-potential-side power supply potential (VDD) is electrically connected to a first terminal of the p-channel transistor 58; the low-potential-side power supply potential line for supplying a low-potential-side power supply potential (VSS) is electrically connected to a first terminal of the n-channel transistor 59; and a second terminal of the p-channel transistor 58, a second terminal of the n-channel transistor 59, and the output terminal 13 for outputting an output potential signal (OUT) are electrically connected to one another.

In the logic circuit according to one embodiment of the invention, the low-potential-side power supply potential (VSS) may be any potential lower than the high-potential-side power supply potential (VDD). That is, the low-potential-side power supply potential may be any potential having a potential difference between the first terminal of the transistor electrically connected to the high-potential-side power supply potential line and the first terminal of the transistor electrically connected to the low-potential-side power supply potential line. For example, the low-potential-side power supply potential can be a ground potential or 0 V. Note that the same can be applied to other later-described logic circuits according to embodiments of the invention.

The logic circuit 50 performs arithmetic processing in a manner similar to that in a conventional NOT circuit when a potential φ of a gate of the n-channel transistor 51 is a high potential (when the Vgs of the n-channel transistor 51 is higher than the threshold voltage thereof). For example, when a high-potential input potential signal is input to the input terminal 11, a low potential, i.e., the low-potential-side power supply potential (VSS) is output from the output terminal 13. Further, when a low-potential input potential signal is input to the input terminal 11, a high potential, i.e., the high-potential-side power supply potential (VDD) is output from the output terminal 13.

The following shows circuit operation when the power supply is OFF during the operation of the logic circuit 50. In a conventional NOT circuit, when the power supply is OFF during the circuit operation, a potential difference between the high-potential-side power supply potential (VDD) and the low-potential-side power supply potential (VSS) is lost, so that a data during the arithmetic processing is volatilized.

In contrast, since the n-channel transistor 51 has extremely low off-state current, after the potential φ of the gate of the n-channel transistor 51 is made low (after the Vgs of the n-channel transistor 51 becomes lower than the threshold voltage thereof), even when the power supply is OFF, the logic circuit 50 can hold a potential of a node N_1 because the node N_1 can be brought into a floating state. Note that the node N_1 is a portion denoted by a thick line including a portion indicated with "N_1" in FIG. 3A. The potential can be held for a sufficiently long period without providing a capacitor at the retention node (node N_1); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potential φ of the gate of the n-channel transistor 51 high (by making the Vgs of the n-channel transistor 51 higher than the threshold voltage thereof), the arithmetic processing can be started again based on the potential held in the node N_1. Therefore, an input potential signal does not need to be supplied when the power supply is ON again, and the arithmetic processing can be started again immediately. Further, power consumption of the logic circuit 50 can be reduced.

Figure 3B:
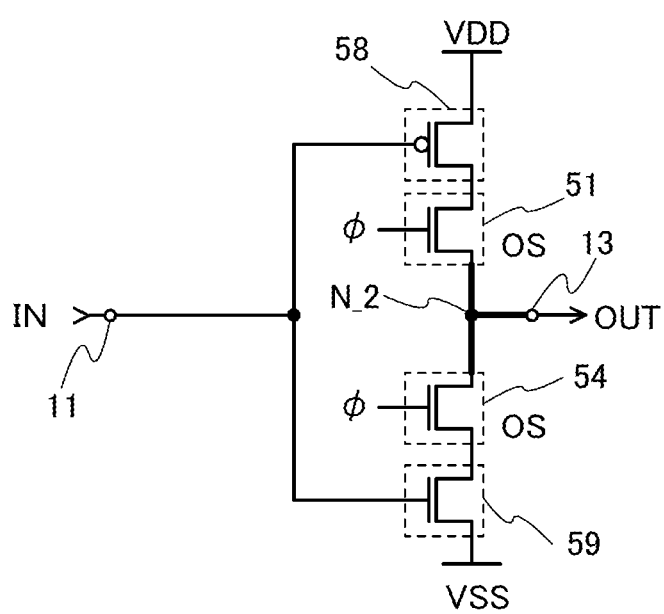

The logic circuit 50 is a mode where the potential of the node electrically connected to the second terminal of the n-channel transistor 51 is held; there may be a modification example of the logic circuit 50 where the potential of the node electrically connected to the output terminal 13 is held. Next, a logic circuit 55 is illustrated in FIG. 3B. Note that the logic circuit 55 is described by using the reference numerals as the logic circuit 50 in FIG. 3A as appropriate.

The logic circuit 55 includes the n-channel transistor 51, an n-channel transistor 54, the p-channel transistor 58, and the n-channel transistor 59. In particular, the n-channel transistors 51 and 54 have extremely low off-state current.

In the logic circuit 55, the input terminal 11 for supplying an input potential signal (IN) is electrically connected to the gate of the p-channel transistor 58 and the gate of the n-channel transistor 59; the high-potential-side power supply potential line for supplying a high-potential-side power supply potential (VDD) is electrically connected to the first terminal of the p-channel transistor 58; the second terminal of the p-channel transistor 58 is electrically connected to the first terminal of the n-channel transistor 51; the low-potential-side power supply potential line for supplying a low-potential-side power supply potential (VSS) is electrically connected to the first terminal of the n-channel transistor 59; the second terminal of the n-channel transistor 59 is electrically connected to a first terminal of an n-channel transistor 54; and the second terminal of the n-channel transistor 51, a second terminal of the n-channel transistor 54, the output terminal 13 for outputting an output potential signal (OUT) are electrically connected to one another. Note that the gate of the n-channel transistor 51 and a gate of the n-channel transistor 54 have the same potential.

When the potentials φ of the gates of the n-channel transistors 51 and 54 are made high, the logic circuit 55 performs arithmetic processing in a manner similar to that in a conventional NOT circuit, like the logic circuit 50.

The following shows circuit operation when the power supply is OFF during the operation of the logic circuit 55. In a conventional NOT circuit, when the power supply is OFF during the circuit operation, a data during the arithmetic processing is volatilized.

In contrast, since the n-channel transistors 51 and 54 have extremely low off-state current, after the potentials φ of the gates of the n-channel transistors 51 and 54 are made low (after the Vgs of the n-channel transistor 51 becomes lower than the threshold voltage thereof and the Vgs of the n-channel transistor 54 becomes lower than the threshold voltage thereof), even when the power supply is OFF, the logic circuit 55 can hold a potential of a node N_2 because the node N_2 can be brought into a floating state. Note that the node N_2 is a portion denoted by a thick line including a portion indicated with "N_2" in FIG. 3B. The potential can be held for a sufficiently long period without providing a capacitor at the retention node (node N_2); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 51 and 54 high (by making the Vgs of the n-channel transistor 51 higher than the threshold voltage thereof and making the Vgs of the n-channel transistor 54 higher than the threshold voltage thereof), an input potential signal does not need to be supplied when the power supply is ON again, and the arithmetic processing can be started again immediately. Further, power consumption of the logic circuit 55 can be reduced.

In the logic circuits 50 and 55, the n-channel transistors 51 and 54 can be transistors having extremely low off-state current. For example, like the transistor 15 described in Embodiment 1, each of the n-channel transistors 51 and 54 has a value of off-state current per unit channel width (1 μm) at room temperature (25° C.) of 10 aA/μm ($1 \times 10^{-17}$ A/μm) or less, 1 aA/μm ($1 \times 10^{-18}$ A/μm) or less, 1 zA/μm ($1 \times 10^{-21}$ A/μm) or less, or 1 yA/μm ($1 \times 10^{-24}$ A/μm) or less.

The transistor having extremely low off-state current can be achieved by forming a channel formation region using a wide-gap semiconductor such as an oxide semiconductor. Further, the channel formation region is preferably formed using an oxide semiconductor where the concentration of hydrogen serving as a carrier donor is extremely reduced. Thus, the channel formation region is preferably formed using an oxide semiconductor where the hydrogen concentration is $5 \times 10^{19}/cm^3$ or lower, more preferably, $5 \times 10^{18}/cm^3$ or lower, and in which oxygen exceeds the stoichiometric composition ratio. The hydrogen concentration in the oxide semiconductor used for forming the channel formation region is measured by secondary ion mass spectrometry (SIMS).

An oxide semiconductor is preferably a metal oxide containing at least indium (In) or zinc (Zn). In particular, both In and Zn are preferably contained. As a stabilizer for reducing variation in electrical characteristics of a transistor using the oxide semiconductor, gallium (Ga) is preferably additionally contained. Alternatively, tin (Sn) is preferably contained as a stabilizer. Alternatively, hafnium (Hf) is preferably contained as a stabilizer. Alternatively, aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

The carrier concentration in the oxide semiconductor is preferably lower than $1.0 \times 10^{14}/cm^3$. By decreasing the carrier concentration, the off-state current of the transistor can be reduced.

In the logic circuits 50 and 55, there is no particular limitation on the p-channel transistor 58 and the n-channel transistor 59 as long as a transistor is formed using a substrate including a semiconductor material.

As in the case of the n-channel transistors 51 and 54, by forming the channel formation region of the n-channel transistor 59 using an oxide semiconductor where the concentration of hydrogen serving as a carrier donor is extremely reduced to the above hydrogen concentration, the logic circuits 50 and 55 can have further reduced power consumption.

In terms of microfabrication, the NOT circuit according to one embodiment of the invention is preferably configured like the logic circuit 50 where transistors having extremely low off-state current are arranged such that the number of transistor elements is reduced as much as possible because the number of the elements is smaller and thus the transistors occupy a smaller area than in the logic circuit 55. Further, in terms of high-speed operation of the circuit, the NOT circuit according to one embodiment of the invention is preferably configured like the logic circuit 55 where the potential of the node electrically connected to the output terminal is held, i.e., the circuit where the potential obtained by arithmetic processing is held, because the arithmetic processing can be started again more immediately.

Furthermore, in the NOT circuits (the logic circuits 50 and 55) according to embodiments of the invention, the configuration other than the transistors having extremely low off-state current (the configuration corresponding to a conventional NOT circuit) is not limited to a CMOS circuit. For example, the p-channel transistor which is a component of the circuit configuration may be replaced with an n-channel enhancement transistor. The n-channel enhancement transistor is an n-channel transistor in which a first terminal of the transistor is connected to a gate thereof so as to be continuously turned on (to maintain the on state) regardless of time. That is, the n-channel enhancement transistor functions as a resistor. Therefore, by applying the n-channel enhancement transistor in place of the p-channel transistor which is a component of the circuit configuration, the transistors in the logic circuits 50 and 55 can have the same conductivity type. Thus, the fabrication steps can be reduced, the yield of the logic circuits 50 and 55 can be increased, and the manufacturing cost can be reduced. The n-channel enhancement transistor may also be a transistor in which a channel formation region is formed using an oxide semiconductor having the above hydrogen concentration. In this manner, even when the transistors in the logic circuit are only n-channel transistors, the logic circuits 50 and 55 can have lower power consumption.

From the above, by reducing the power consumption of the logic circuits 50 and 55, a semiconductor device including at least one of the logic circuit 50 and the logic circuit 55 can also have lower power consumption. Further, by reducing the power consumption of the logic circuits 50 and 55, an external circuit for operating the logic circuits 50 and 55 can have a lighter load. Thus, the functionality of a semiconductor device including at least one of the logic circuit 50 and the logic circuit 55 and the external circuit can be expanded.

Note that the contents of this embodiment or part thereof can be combined freely with the contents of other embodiments or part thereof.

Embodiment 3

This embodiment shows another example of the logic circuit described in Embodiment 1. Specifically, a NAND circuit is described with reference to FIGS. 4A and 4B. Note that in some circuit diagrams, a circuit symbol using a dotted line and "OS" are shown together in order to indicate that the transistor includes an oxide semiconductor. Further, for the logic circuits described in this embodiment, the reference numerals used in Embodiment 1 are used as appropriate.

[Configuration Example and Operation Example of the Logic Circuit]

Figure 4A:
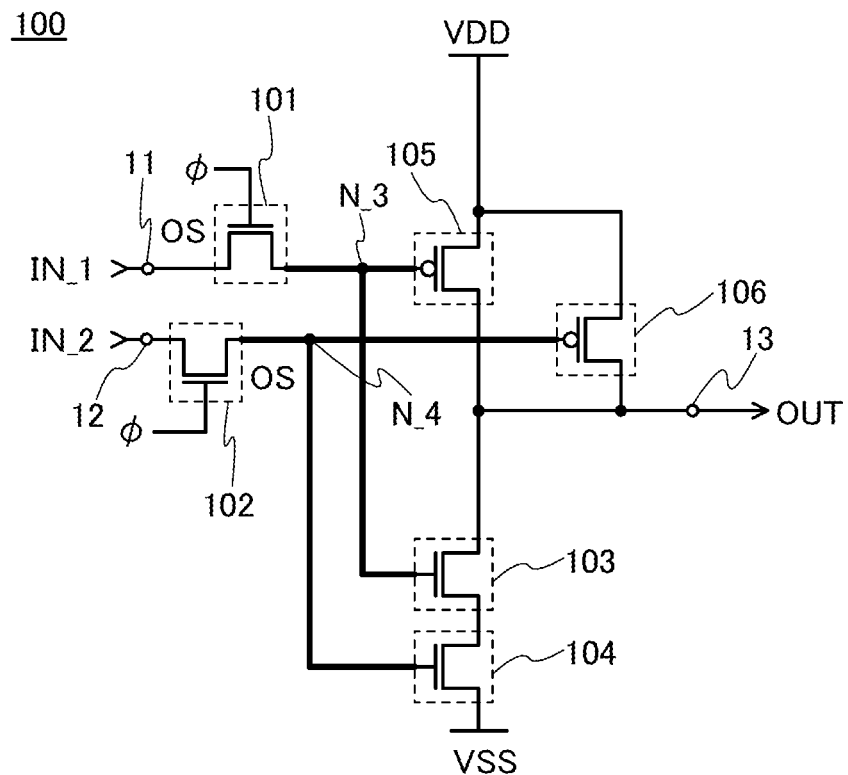
FIGS. 4A and 4B are circuit diagrams illustrating logic circuits according to embodiments of the invention.

A logic circuit 100 illustrated in FIG. 4A is a logic circuit in which an n-channel transistor is additionally provided and electrically connected to a NAND circuit. Although this embodiment shows a circuit in which the NAND circuit is configured by a CMOS circuit that is suitable for microfabrication, the NAND circuit may be configured to include a resistor, a diode, and the like. In each of FIGS. 4A and 4B, the NAND circuit has two input terminals; one of them is denoted by the first input terminal 11, and the other is denoted by the second input terminal 12.

The logic circuit 100 includes an n-channel transistor 101, an n-channel transistor 102, an n-channel transistor 103, an n-channel transistor 104, a p-channel transistor 105, and a p-channel transistor 106. In particular, the n-channel transistors 101 and 102 have extremely low off-state current.

In the logic circuit 100, a first terminal of the n-channel transistor 101 is electrically connected to the first input terminal 11 for supplying an input potential signal (IN_1); a second terminal of the n-channel transistor 101, a gate of the p-channel transistor 105, and a gate of the n-channel transistor 103 are electrically connected to one another; a first terminal of the n-channel transistor 102 is electrically connected to the second input terminal 12 for supplying an input potential signal (IN_2); a second terminal of the n-channel transistor 102, a gate of the p-channel transistor 106, and a gate of the n-channel transistor 104 are electrically connected to one another; the high-potential-side power supply potential line for supplying a high-potential-side power supply potential (VDD), a first terminal of the p-channel transistor 105, and a first terminal of the p-channel transistor 106 are electrically connected to one another; the low-potential-side power supply potential line for supplying a low-potential-side power supply potential (VSS) is electrically connected to a first terminal of the n-channel transistor 104; a second terminal of the n-channel transistor 104 is electrically connected to a first terminal of the n-channel transistor 103; and a second terminal of the p-channel transistor 105, a second terminal of the p-channel transistor 106, a second terminal of the n-channel transistor 103, and the output terminal 13 for outputting an output potential signal (OUT) are electrically connected to one another. Note that the gate of the n-channel transistor 101 and a gate of the n-channel transistor 102 have the same potential.

When the potentials φ of the gates of the n-channel transistors 101 and 102 are made high (when the Vgs of the n-channel transistor 101 becomes higher than the threshold voltage thereof and the Vgs of the n-channel transistor 102 becomes higher than the threshold voltage thereof), the logic circuit 100 performs arithmetic processing in a manner similar to that in a conventional NAND circuit. For example, when high-potential input potential signals are input to the first input terminal 11 and the second input terminal 12, a low potential, i.e., a low-potential-side power supply potential (VSS) is output from the output terminal 13. Further, when a low-potential input potential signal is input to either the first input terminal 11 or the second input terminal 12, a high potential, i.e., a high-potential-side power supply potential (VDD) is output from the output terminal 13.

The following shows circuit operation when the power supply is OFF during the operation of the logic circuit 100. In a conventional NAND circuit, when the power supply is OFF during the circuit operation, a potential difference between the high-potential-side power supply potential (VDD) and the low-potential-side power supply potential (VSS) is lost, so that a data during the arithmetic processing is volatilized.

In contrast, since the n-channel transistors 101 and 102 have extremely low off-state current, after the potentials φ of the gates of the n-channel transistors 101 and 102 are made low (after the Vgs of the n-channel transistor 101 becomes lower than the threshold voltage thereof and the Vgs of the n-channel transistor 102 is lower than the threshold voltage thereof), even when the power supply is OFF, the logic circuit 100 can hold potentials of a node N_3 and a node N_4 because the nodes N_3 and N_4 can be brought into floating states by making the potentials φ of the gates of the n-channel transistors 101 and 102 low (by making the Vgs of the n-channel transistor 101 lower than the threshold voltage thereof and the Vgs of the n-channel transistor 102 lower than the threshold voltage thereof). Note that the node N_3 is a portion denoted by a thick line including a portion indicated with "N_3" in FIG. 4A, and the node N_4 is a portion denoted by a thick line including a portion indicated with "N_4" in FIG. 4A. The potentials can be held for a sufficiently long period without providing capacitors at the retention nodes (nodes N_3 and N_4); however, when the holding period needs to be longer, capacitors may be provided in such a manner that one electrode of each of the capacitors is electrically connected to the corresponding retention node and the other electrode thereof is electrically connected to the low-potential-side power supply potential line.

Then, after the power supply is ON again, by making the potentials φ of the gates of the n-channel transistors 101 and 102 high, the arithmetic processing can be started again based on the potentials held in the nodes N_3 and N_4. Therefore, an input potential signal does not need to be supplied when the power supply is ON again, and the arithmetic processing can be started again immediately. Further, power consumption of the logic circuit 100 can be reduced.

Figure 4B:
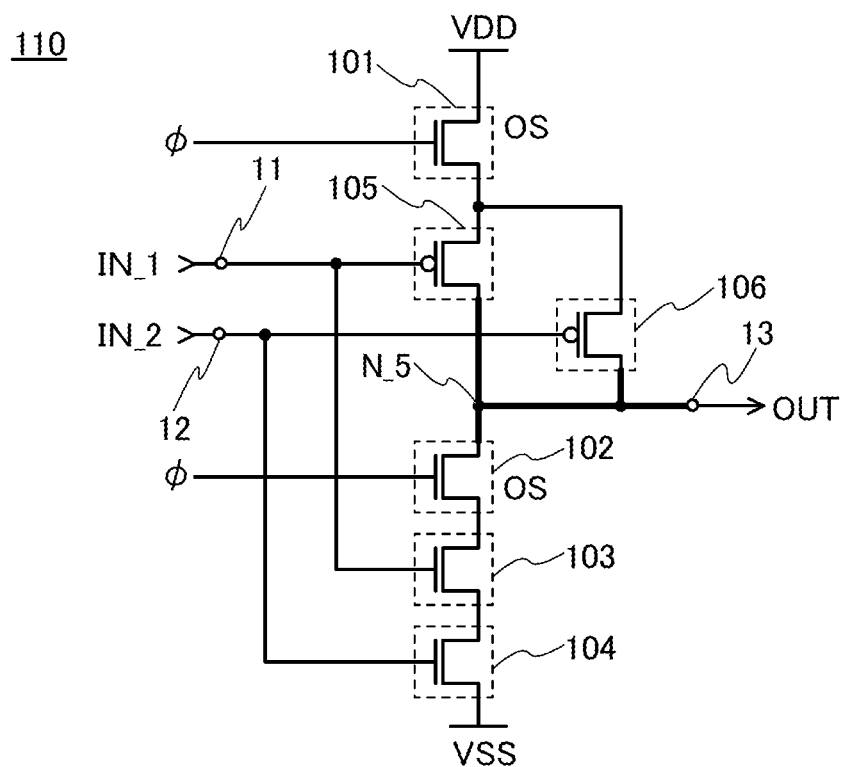

The logic circuit 100 is a mode where the potentials of the nodes electrically connected to the respective second terminals of the n-channel transistors 101 and 102 are held; there may be a modification example of the logic circuit 100 where the potential of the node electrically connected to the output terminal 13 is held. Next, a logic circuit 110 corresponding to such a mode is illustrated in FIG. 4B. Note that the logic circuit 110 is described by using the reference numerals as the logic circuit 100 in FIG. 4A as appropriate.

The logic circuit 110 includes the n-channel transistors 101, 102, 103, and 104 and the p-channel transistors 105 and 106. In the logic circuit 110, the connection relation between the transistors included in the circuit is different from that in the logic circuit 100. Note that the n-channel transistors 101 and 102 have extremely low off-state current.

In the logic circuit 110, the first input terminal 11, the gate of the n-channel transistor 103, and the gate of the p-channel transistor 105 are electrically connected to one another; the second input terminal 12, the gate of the n-channel transistor 104, and the gate of the p-channel transistor 106 are electrically connected to one another; the high-potential-side power supply potential line for supplying a high-potential-side power supply potential (VDD) is electrically connected to the first terminal of the n-channel transistor 101; the second terminal of the n-channel transistor 101, the first terminal of the p-channel transistor 105, and the first terminal of the p-channel transistor 106 are electrically connected to one another; the low-potential-side power supply potential line for supplying a low-potential-side power supply potential (VSS) is electrically connected to the first terminal of the n-channel transistor 104; the second terminal of the n-channel transistor 104 is electrically connected to the first terminal of the n-channel transistor 103; the second terminal of the n-channel transistor 103 is electrically connected to the first terminal of the n-channel transistor 102; and the second terminal of the p-channel transistor 105, the second terminal of the p-channel transistor 106, the second terminal of the n-channel transistor 102, and the output terminal 13 are electrically connected to one another. Note that the gate of the n-channel transistor 101 and the gate of the n-channel transistor 102 have the same potential.

When the potentials φ of the gates of the n-channel transistors 101 and 102 are made high, the logic circuit 110 performs arithmetic processing in a manner similar to that in a conventional NAND circuit, like the logic circuit 100.

The following shows circuit operation when the power supply is OFF during the operation of the logic circuit 110. In a conventional NAND circuit, when the power supply is OFF during the circuit operation, a data during the arithmetic processing is volatilized.

In contrast, since the n-channel transistors 101 and 102 have extremely low off-state current, after the potentials φ of the gates of the n-channel transistors 101 and 102 are made low, even when the power supply is OFF, the logic circuit 110 can hold a potential of a node N_5 because at least the node N_5 can be brought into a floating state by making the potentials φ of the gates of the n-channel transistors 101 and 102 low. Note that the node N_5 is a portion denoted by a thick line including a portion indicated with "N_5" in FIG. 4B. The potential can be held for a sufficiently long period without providing a capacitor at the retention node (node N_5); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 101 and 102 high, an input potential signal does not need to be supplied when the power supply is ON again, and the arithmetic processing can be started again immediately. Further, power consumption of the logic circuit 110 can be reduced.

Figure 5A:
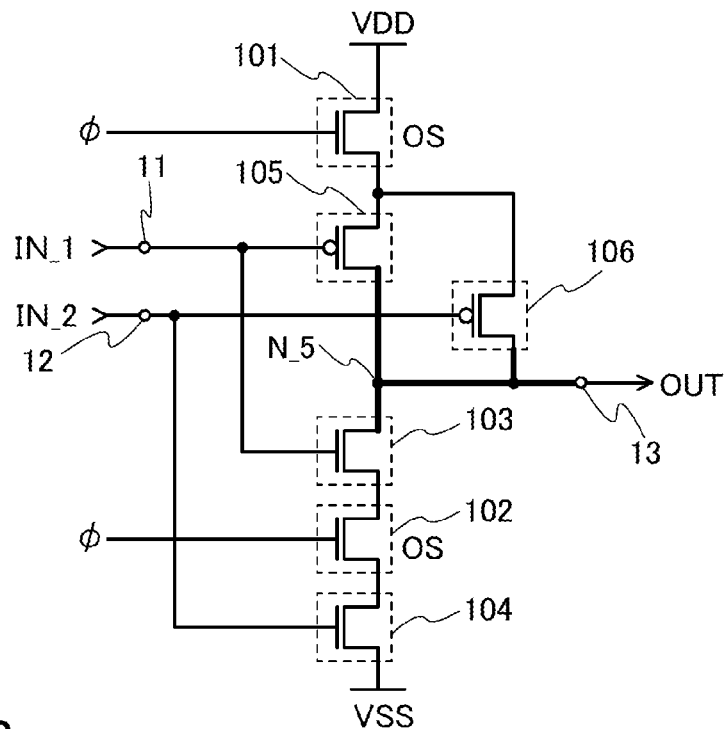
FIGS. 5A and 5B are circuit diagrams illustrating logic circuits according to embodiments of the invention.
Figure 5B:
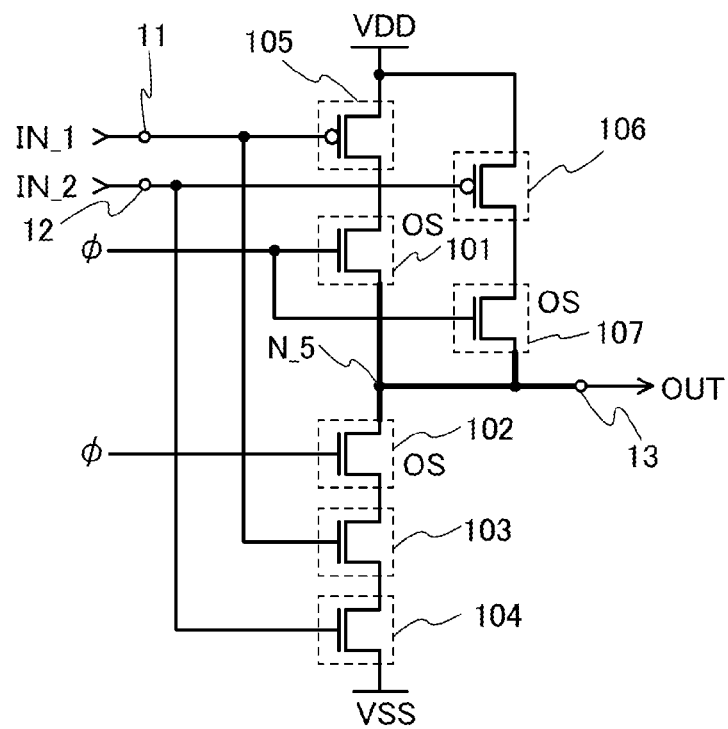

In this embodiment, the positions of the n-channel transistors 101 and 102 having extremely low off-state current are not limited to those in the logic circuits 100 and 110 as long as the n-channel transistors 101 and 102 are arranged in a current path (leakage path) for reducing an input potential to be held when the power supply is OFF. FIGS. 5A and 5B illustrate other examples of the logic circuit in which the positions of the transistors having extremely low off-state current are different from those in the logic circuits 100 and 110. FIG. 5A is a circuit diagram illustrating one of the examples, a logic circuit 120; and FIG. 5B is a circuit diagram illustrating another example, a logic circuit 130. Note that in the logic circuits 120 and 130, the reference numerals used in the logic circuit 100 in FIG. 4A are used as appropriate.

The logic circuit 120 includes the n-channel transistors 101, 102, 103, and 104 and the p-channel transistors 105 and 106. Note that the n-channel transistors 101 and 102 have extremely low off-state current.

In the logic circuit 120, the first input terminal 11, the gate of the n-channel transistor 103, and the gate of the p-channel transistor 105 are electrically connected to one another; the second input terminal 12, the gate of the n-channel transistor 104, and the gate of the p-channel transistor 106 are electrically connected to one another; the high-potential-side power supply potential line for supplying a high-potential-side power supply potential (VDD) is electrically connected to the first terminal of the n-channel transistor 101; the second terminal of the n-channel transistor 101, the first terminal of the p-channel transistor 105, and the first terminal of the p-channel transistor 106 are electrically connected to one another; the low-potential-side power supply potential line for supplying a low-potential-side power supply potential (VSS) is electrically connected to the first terminal of the n-channel transistor 104; the second terminal of the n-channel transistor 104 is electrically connected to the first terminal of the n-channel transistor 102; the second terminal of the n-channel transistor 102 is electrically connected to the first terminal of the n-channel transistor 103; and the second terminal of the p-channel transistor 105, the second terminal of the p-channel transistor 106, the second terminal of the n-channel transistor 103, and the output terminal 13 are electrically connected to one another. Note that the gate of the n-channel transistor 101 and the gate of the n-channel transistor 102 have the same potential.

When the potentials φ of the gates of the n-channel transistors 101 and 102 are high, the logic circuit 120 performs arithmetic processing in a manner similar to that in a conventional NAND circuit, like the logic circuit 100.

The following shows circuit operation when the power supply is OFF during the operation of the logic circuit 120. In a conventional NAND circuit, when the power supply is OFF during the circuit operation, a data during the arithmetic processing is volatilized.

In contrast, since the n-channel transistors 101 and 102 have extremely low off-state current, after the potentials φ of the gates of the n-channel transistors 101 and 102 are made low, even when the power supply is OFF, the logic circuit 120 can hold a potential of the node N_5 because at least the node N_5 can be brought into a floating state by making the potentials φ of the gates of the n-channel transistors 101 and 102 low. Note that the potential can be held for a sufficiently long period without providing a capacitor at the retention node (node N_5); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 101 and 102 high, an input potential signal does not need to be supplied when the power supply is ON again, and the arithmetic processing can be started again immediately. Further, power consumption of the logic circuit 120 can be reduced.

The logic circuit 130 includes the n-channel transistors 101, 102, 103, and 104, an n-channel transistor 107, and the p-channel transistors 105 and 106. In particular, the n-channel transistors 101, 102, and 107 have extremely low off-state current.

In the logic circuit 130, the first input terminal 11, the gate of the n-channel transistor 103, and the gate of the p-channel transistor 105 are electrically connected to one another; the second input terminal 12, the gate of the n-channel transistor 104, and the gate of the p-channel transistor 106 are electrically connected to one another; the high-potential-side power supply potential line for supplying a high-potential-side power supply potential (VDD), the first terminal of the p-channel transistor 105, and the first terminal of the p-channel transistor 106 are electrically connected to one another; the second terminal of the p-channel transistor 105 is electrically connected to the first terminal of the n-channel transistor 101; the second terminal of the p-channel transistor 106 is electrically connected to a first terminal of an n-channel transistor 107; the low-potential-side power supply potential line for supplying a low-potential-side power supply potential (VSS) is electrically connected to the first terminal of the n-channel transistor 104; the second terminal of the n-channel transistor 104 is electrically connected to the first terminal of the n-channel transistor 103; the second terminal of the n-channel transistor 103 is electrically connected to the first terminal of the n-channel transistor 102; and the second terminal of the n-channel transistor 101, the second terminal of the n-channel transistor 102, a second terminal of the n-channel transistor 107, and the output terminal 13 are electrically connected to one another. Note that the gate of the n-channel transistor 101, the gate of the n-channel transistor 102, and a gate of the n-channel transistor 107 have the same potential.

When the potentials φ of the gates of the n-channel transistors 101, 102, and 107 are high, the logic circuit 130 performs arithmetic processing in a manner similar to that in a conventional NAND circuit.

The following shows circuit operation when the power supply is OFF during the operation of the logic circuit 130. In a conventional NAND circuit, when the power supply is OFF during the circuit operation, a data during the arithmetic processing is volatilized.

In contrast, since the n-channel transistors 101, 102, and 107 have extremely low off-state current, after the potentials φ of the gates of the n-channel transistors 101, 102, and 107 are made low, even when the power supply is OFF, the logic circuit 130 can hold the potential of the node N_5 because the node N_5 can be brought into a floating state. Note that the potential can be held for a sufficiently long period without providing a capacitor at the retention node (node N_5); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 101, 102, and 107 high, an input potential signal does not need to be supplied when the power supply is ON again, and the arithmetic processing can be started again immediately. Further, power consumption of the logic circuit 130 can be reduced.

In the logic circuits 100 110, 120, and 130, the n-channel transistors 101, 102, and 107 are transistors having extremely low off-state current, as described above. Each of the n-channel transistors 101, 102, and 107 has off-current characteristics similar to those of any of the transistors 15 to 19 described in Embodiment 1, the n-channel transistor 51 described in Embodiment 2, and the n-channel transistor 54 described in Embodiment 2, for example. Further, each of the n-channel transistors 101, 102, and 107 can be a transistor like any of the n-channel transistors 51 and 54, in which a channel formation region is formed using an oxide semiconductor where the concentration of hydrogen serving as a carrier donor is extremely reduced, in particular an oxide semiconductor having the above-described hydrogen concentration. Note that the carrier concentration in the oxide semiconductor is preferably similar to that in the n-channel transistors 51 and 54.

In the logic circuits 100, 110, 120, and 130, there is no particular limitation on the n-channel transistors 103 and 104 and the p-channel transistors 105 and 106 as long as a transistor is formed using a substrate including a semiconductor material.

As in the case of the n-channel transistors 101, 102, and 107, by forming the channel formation regions of the n-channel transistors 103 and 104 using an oxide semiconductor where the concentration of hydrogen serving as a carrier donor is extremely reduced to the above hydrogen concentration, the logic circuits 100, 110, 120, and 130 can have further reduced power consumption.

In terms of microfabrication, the NAND circuit according to one embodiment of the invention is preferably configured like any of the logic circuits 100, 110, and 120 where transistors having extremely low off-state current are arranged such that the number of transistor elements is reduced as much as possible because the number of the elements is smaller and thus the transistors occupy a smaller area than in the logic circuit 130. Further, in terms of high-speed operation of the circuit, the NAND circuit according to one embodiment of the invention is preferably configured like any of the logic circuits 110, 120, and 130 where the potential of the node electrically connected to the output terminal is held, i.e., the circuit where the potential obtained by arithmetic processing is held, because the arithmetic processing can be started again more immediately than in the logic circuit 100.

Furthermore, in the NAND circuits (the logic circuits 100, 110, 120, and 130) according to embodiments of the invention, the configuration other than the transistors having extremely low off-state current (the configuration corresponding to a conventional NAND circuit) is not limited to a CMOS circuit. For example, the p-channel transistors which are components of the circuit configuration may be replaced with n-channel enhancement transistors, as in the logic circuits 50 and 55. By applying the n-channel enhancement transistor in place of the p-channel transistor which is a component of the circuit configuration, the transistors in the logic circuits 100, 110, 120, and 130 can have the same conductivity type. Thus, the fabrication steps can be reduced, the yield of the logic circuits 100, 110, 120, and 130 can be increased, and the manufacturing cost can be reduced. The n-channel enhancement transistor may also be a transistor in which a channel formation region is formed using an oxide semiconductor having the above hydrogen concentration. In this manner, even when the transistors in the logic circuit are only n-channel transistors, the logic circuits 100, 110, 120, and 130 can have lower power consumption.

From the above, by reducing the power consumption of the logic circuits 100, 110, 120, and 130, a semiconductor device including at least one of the logic circuits 100, 110, 120, and 130 can also have lower power consumption. Further, by reducing the power consumption of the logic circuits 100, 110, 120, and 130, an external circuit for operating the logic circuits 100, 110, 120, and 130 can have a lighter load. Thus, the functionality of a semiconductor device including at least one of the logic circuits 100, 110, 120, and 130 and the external circuit can be expanded.

Note that the contents of this embodiment or part thereof can be combined freely with the contents of other embodiments or part thereof.

Embodiment 4

This embodiment shows another example of the logic circuit described in Embodiment 1. Specifically, a NOR circuit is described with reference to FIGS. 6A and 6B. Note that in some circuit diagrams, a circuit symbol using a dotted line and "OS" are shown together in order to indicate that the transistor includes an oxide semiconductor. Further, for the logic circuits described in this embodiment, the reference numerals used in Embodiment 1 are used as appropriate.

[Configuration Example and Operation Example of the Logic Circuit]

Figure 6A:
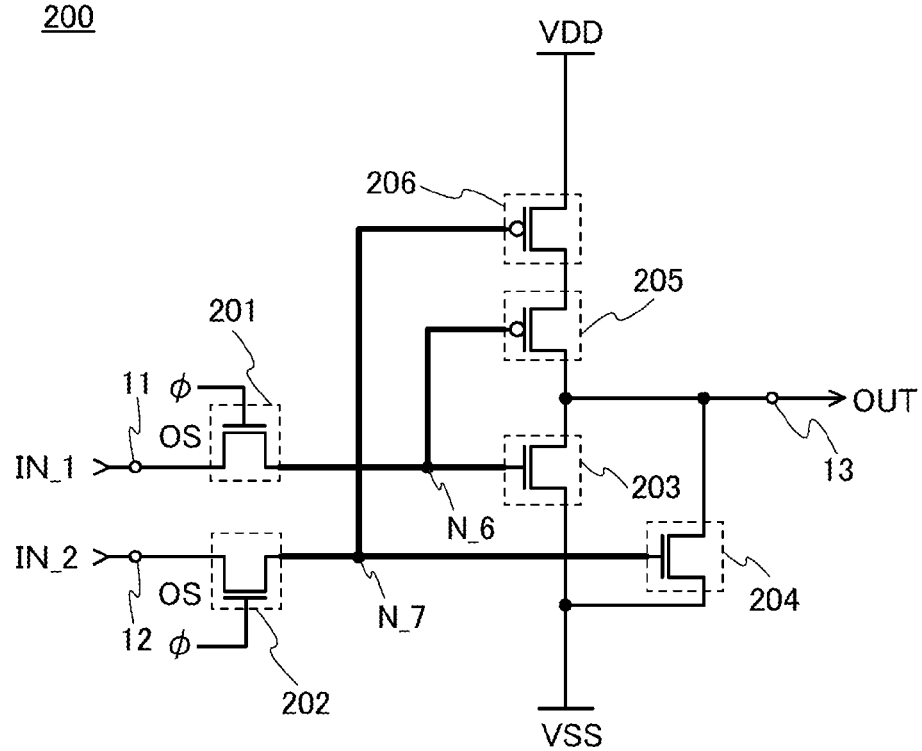
FIGS. 6A and 6B are circuit diagrams illustrating logic circuits according to embodiments of the invention.

A logic circuit 200 illustrated in FIG. 6A is a logic circuit in which an n-channel transistor is additionally provided and electrically connected to a NOR circuit. Although this embodiment shows a circuit in which the NOR circuit is configured by a CMOS circuit that is suitable for microfabrication, the NOR circuit may be configured to include a resistor, a diode, and the like. In each of FIGS. 6A and 6B, the NOR circuit has two input terminals; one of them is denoted by the first input terminal 11, and the other is denoted by the second input terminal 12.

The logic circuit 200 includes an n-channel transistor 201, an n-channel transistor 202, an n-channel transistor 203, an n-channel transistor 204, a p-channel transistor 205, and a p-channel transistor 206. In particular, the n-channel transistors 201 and 202 have extremely low off-state current.

In the logic circuits 200, a first terminal of the n-channel transistor 201 is electrically connected to the first input terminal 11; a second terminal of the n-channel transistor 201, a gate of the n-channel transistor 203, and a gate of the p-channel transistor 205 are electrically connected to one another; a first terminal of the n-channel transistor 202 is electrically connected to the second input terminal 12; a second terminal of the n-channel transistor 202, a gate of the n-channel transistor 204, and a gate of the p-channel transistor 206 are electrically connected to one another; the high-potential-side power supply potential line for supplying a high-potential-side power supply potential (VDD) is electrically connected to a first terminal of the p-channel transistor 206; a second terminal of the p-channel transistor 206 is electrically connected to a first terminal of the p-channel transistor 205; the low-potential-side power supply potential line for supplying a low-potential-side power supply potential (VSS), a first terminal of the n-channel transistor 203, and a first terminal of the n-channel transistor 204 are electrically connected to one another; and a second terminal of the n-channel transistor 203, a second terminal of the n-channel transistor 204, a second terminal of the p-channel transistor 205, and the output terminal 13 are electrically connected to one another.

When potentials ϕ of gates of the n-channel transistors 201 and 202 are made high (when the Vgs of the n-channel transistor 201 becomes higher than the threshold voltage thereof and the Vgs of the n-channel transistor 202 becomes higher than the threshold voltage thereof), the logic circuit 200 performs arithmetic processing in a manner similar to that in a conventional NOR circuit. For example, when a high-potential input potential signal is input to either the first input terminal 11 or and the second input terminal 12, a low potential, i.e., a low-potential-side power supply potential (VSS) is output from the output terminal 13. Further, when a low-potential input potential signals are input to the first input terminal 11 and the second input terminal 12, a high potential, i.e., a high-potential-side power supply potential (VDD) is output from the output terminal 13.

The following shows circuit operation when the power supply is OFF during the operation of the logic circuit 200. In a conventional NOR circuit, when the power supply is OFF during the circuit operation, a potential difference between the high-potential-side power supply potential (VDD) and the low-potential-side power supply potential (VSS) is lost, so that a data during the arithmetic processing is volatilized.

In contrast, since the n-channel transistors 201 and 202 have extremely low off-state current, after the potentials ϕ of the gates of the n-channel transistors 201 and 202 are made low (after the Vgs of the n-channel transistor 201 becomes lower than the threshold voltage thereof and the Vgs of the n-channel transistor 202 is lower than the threshold voltage thereof), even when the power supply is OFF, the logic circuit 200 can hold potentials of a node N_6 and a node N_7 because the nodes N_6 and N_7 can be brought into floating states by making the potentials ϕ of the gates of the n-channel transistors 201 and 202 low (by making the Vgs of the n-channel transistor 201 lower than the threshold voltage thereof and the Vgs of the n-channel transistor 202 lower than the threshold voltage thereof). Note that the node N_6 is a portion denoted by a thick line including a portion indicated with "N_6" in FIG. 6A, and the node N_7 is a portion denoted by a thick line including a portion indicated with "N_7" in FIG. 6A. The potentials can be held for a sufficiently long period without providing capacitors at the retention nodes (nodes N_6 and N_7); however, when the holding period needs to be longer, capacitors may be provided in such a manner that one electrode of each of the capacitors is electrically connected to the corresponding retention node and the other electrode thereof is electrically connected to the low-potential-side power supply potential line.

Then, after the power supply is ON again, by making the potentials ϕ of the gates of the n-channel transistors 201 and 202 high (by making the Vgs of the n-channel transistor 201 higher than the threshold voltage thereof and the Vgs of the n-channel transistor 202 higher than the threshold voltage thereof), the arithmetic processing can be started again based on the potentials held in the nodes N_6 and N_7. Therefore, an input potential signal does not need to be supplied when the power supply is ON again, and the arithmetic processing can be started again immediately. Further, power consumption of the logic circuit 200 can be reduced.

Figure 6B:
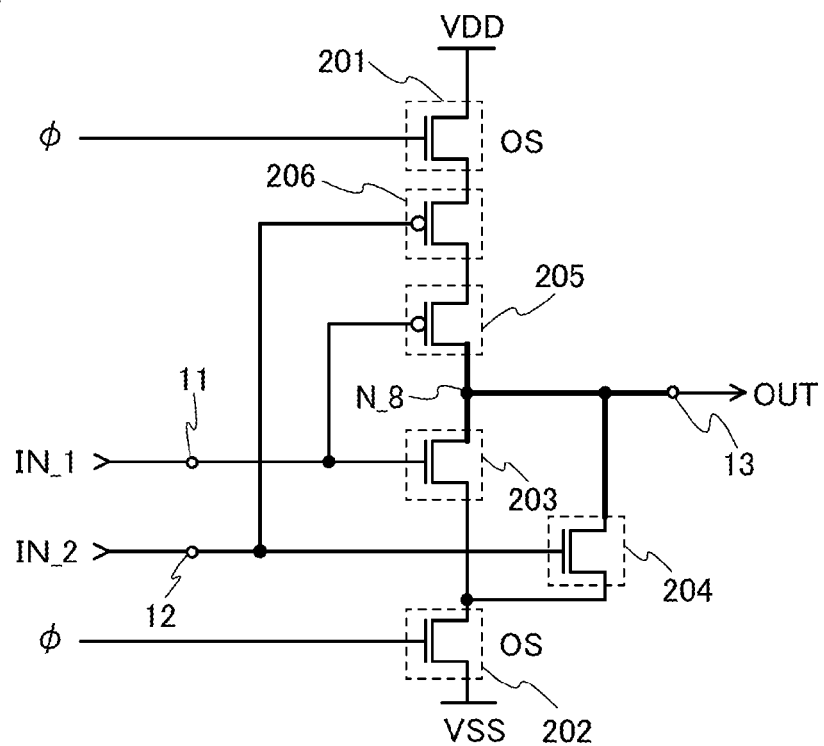

The logic circuit 200 is a mode where the potentials of the nodes electrically connected to the respective second terminals of the n-channel transistors 201 and 202 are held; there may be a modification example of the logic circuit 200 where the potential of the node electrically connected to the output terminal 13 is held. Next, a logic circuit 210 corresponding to such a mode is illustrated in FIG. 6B. Note that the logic circuit 210 is described by using the reference numerals as the logic circuit 200 in FIG. 6A as appropriate.

The logic circuit 210 includes the n-channel transistors 201, 202, 203, and 204 and the p-channel transistors 205 and 206. In the logic circuit 210, the connection relation between the transistors included in the circuit is different from that in the logic circuit 200. Note that the n-channel transistors 201 and 202 have extremely low off-state current.

In the logic circuit 210, the first input terminal 11, the gate of the n-channel transistor 203, and the gate of the p-channel transistor 205 are electrically connected to one another; the second input terminal 12, the gate of the n-channel transistor 204, and the gate of the p-channel transistor 206 are electrically connected to one another; the high-potential-side power supply potential line for supplying a high-potential-side power supply potential (VDD) is electrically connected to the first terminal of the n-channel transistor 201; the second terminal of the n-channel transistor 201 is electrically connected to the first terminal of the p-channel transistor 206; the second terminal of the p-channel transistor 206 is electrically connected to the first terminal of the p-channel transistor 205; the low-potential-side power supply potential line for supplying a low-potential-side power supply potential (VSS) is electrically connected to the first terminal of the n-channel transistor 202; the second terminal of the n-channel transistor 202, the first terminal of the n-channel transistor 203, and the first terminal of the n-channel transistor 204 are electrically connected to one another; and the second terminal of the n-channel transistor 203, the second terminal of the n-channel transistor 204, the second terminal of the p-channel transistor 205, and the output terminal 13 are electrically connected to one another. Note that the gate of the n-channel transistor 201 and the gate of the n-channel transistor 202 have the same potential.

When the potentials ϕ of the gates of the n-channel transistors 201 and 202 are high, the logic circuit 210 performs arithmetic processing in a manner similar to that in a conventional NOR circuit, like the logic circuit 200.

The following shows circuit operation when the power supply is OFF during the operation of the logic circuit 210. In a conventional NOR circuit, when the power supply is OFF during the circuit operation, a data during the arithmetic processing is volatilized.

In contrast, since the n-channel transistors 201 and 202 have extremely low off-state current, after the potentials ϕ of the gates of the n-channel transistors 201 and 202 are made low, even when the power supply is OFF, the logic circuit 210 can hold a potential of a node N_8 electrically connected to the output terminal 13 because at least the node N_8 can be brought into a floating state by making the potentials ϕ of the gates of the n-channel transistors 201 and 202 low. Note that the node N_8 is a portion denoted by a thick line including a portion indicated with "N_8" in FIG.

6B. The potential can be held for a sufficiently long period without providing a capacitor at the retention node (node N_8); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 201 and 202 high, an input potential signal does not need to be supplied when the power supply is ON again, and the arithmetic processing can be started again immediately. Further, power consumption of the logic circuit 210 can be reduced.

Figure 7A:
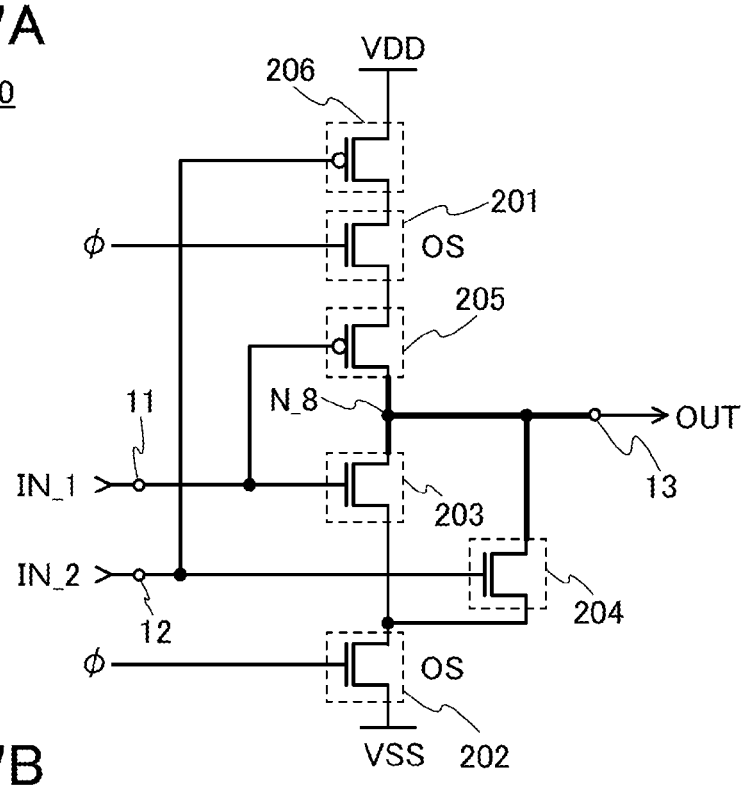
FIGS. 7A and 7B are circuit diagrams illustrating logic circuits according to embodiments of the invention.
Figure 7B:
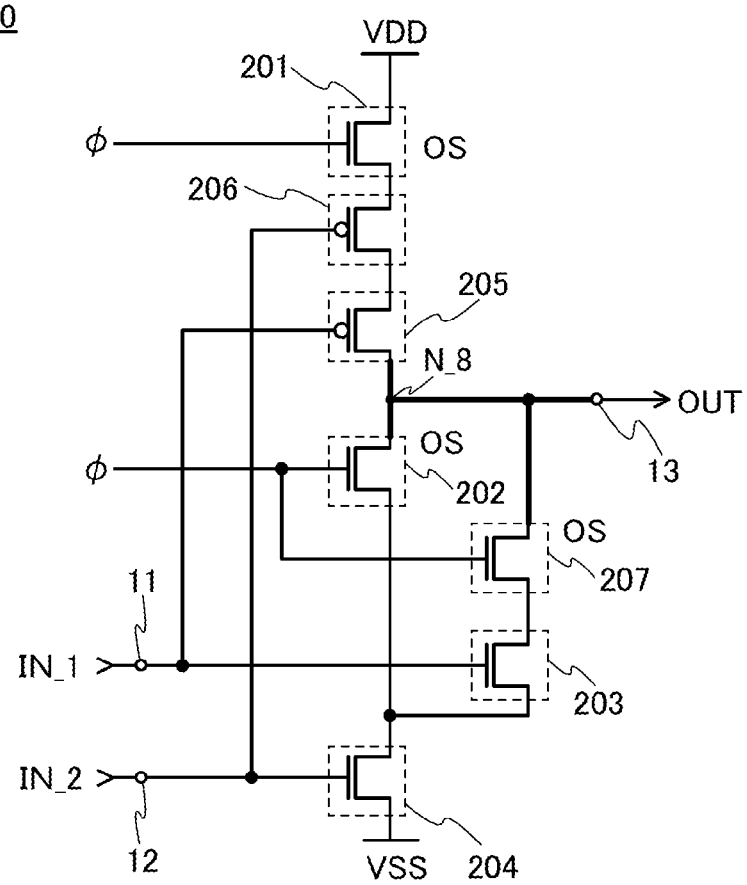

In this embodiment, the positions of the n-channel transistors 201 and 202 having extremely low off-state current are not limited to those in the logic circuits 200 and 210 as long as the n-channel transistors 201 and 202 are arranged in current paths (leakage paths) for reducing an input potential to be held when the power supply is OFF. FIGS. 7A and 7B illustrate other examples of the logic circuit in which the positions of the transistors having extremely low off-state current are different from those in the logic circuits 200 and 210. FIG. 7A is a circuit diagram illustrating one of the examples, a logic circuit 220; and FIG. 7B is a circuit diagram illustrating another example, a logic circuit 230. Note that in the logic circuits 220 and 230, the reference numerals used in the logic circuit 200 in FIG. 6A are used as appropriate.

The logic circuit 220 includes the n-channel transistors 201, 202, 203, and 204 and the p-channel transistors 205 and 206. Note that the n-channel transistors 201 and 202 have extremely low off-state current.

In the logic circuit 220, the first input terminal 11, the gate of the n-channel transistor 203, and the gate of the p-channel transistor 205 are electrically connected to one another; the second input terminal 12, the gate of the n-channel transistor 204, and the gate of the p-channel transistor 206 are electrically connected to one another; the high-potential-side power supply potential line for supplying a high-potential-side power supply potential (VDD) is electrically connected to the first terminal of the p-channel transistor 206; the second terminal of the p-channel transistor 206 is electrically connected to the first terminal of the n-channel transistor 201; the second terminal of the n-channel transistor 201 is electrically connected to the first terminal of the p-channel transistor 205; the low-potential-side power supply potential line for supplying a low-potential-side power supply potential (VSS) is electrically connected to the first terminal of the n-channel transistor 202; the second terminal of the n-channel transistor 202, the first terminal of the n-channel transistor 203, and the first terminal of the n-channel transistor 204 are electrically connected to one another; and the second terminal of the n-channel transistor 203, the second terminal of the n-channel transistor 204, the second terminal of the p-channel transistor 205, and the output terminal 13 are electrically connected to one another. Note that the gate of the n-channel transistor 201 and the gate of the n-channel transistor 202 have the same potential.

When the potentials φ of the gates of the n-channel transistors 201 and 202 are high, the logic circuit 220 performs arithmetic processing in a manner similar to that in a conventional NOR circuit.

The following shows circuit operation when the power supply is OFF during the operation of the logic circuit 220.

In a conventional NOR circuit, when the power supply is OFF during the circuit operation, a data during the arithmetic processing is volatilized.

In contrast, since the n-channel transistors 201 and 202 have extremely low off-state current, after the potentials φ of the gates of the n-channel transistors 201 and 202 are made low, even when the power supply is OFF, the logic circuit 220 can hold a potential of the node N_8 because at least the node N_8 can be brought into a floating state by making the potentials φ of the gates of the n-channel transistors 201 and 202 low. Note that the potential can be held for a sufficiently long period without providing a capacitor at the retention node (node N_8); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 201 and 202 high, an input potential signal does not need to be supplied when the power supply is ON again, and the arithmetic processing can be started again immediately. Further, power consumption of the logic circuit 220 can be reduced.

The logic circuit 230 includes the n-channel transistors 201, 202, 203, 204, an n-channel transistor 207, and the p-channel transistors 205 and 206. Note that the n-channel transistors 201, 202, and 207 have extremely low off-state current.

In the logic circuit 230, the first input terminal 11, the gate of the n-channel transistor 203, and the gate of the p-channel transistor 205 are electrically connected to one another; the second input terminal 12, the gate of the n-channel transistor 204, and the gate of the p-channel transistor 206 are electrically connected to one another; the high-potential-side power supply potential line for supplying a high-potential-side power supply potential (VDD) is electrically connected to the first terminal of the n-channel transistor 201; the second terminal of the n-channel transistor 201 is electrically connected to the first terminal of the p-channel transistor 206; the second terminal of the p-channel transistor 206 is electrically connected to the first terminal of the p-channel transistor 205; the low-potential-side power supply potential line for supplying a low-potential-side power supply potential (VSS) is electrically connected to the first terminal of the n-channel transistor 204; the second terminal of the n-channel transistor 204, the first terminal of the n-channel transistor 202, and the first terminal of the n-channel transistor 203 are electrically connected to one another; the second terminal of the n-channel transistor 203 is electrically connected to the first terminal of the n-channel transistor 207; and the second terminal of the n-channel transistor 202, the second terminal of the n-channel transistor 207, the second terminal of the p-channel transistor 205, and the output terminal 13 are electrically connected to one another. Note that the gate of the n-channel transistor 201, the gate of the n-channel transistor 202, and a gate of the n-channel transistor 207 have the same potential.

When the potentials φ of the gates of the n-channel transistors 201, 202, and 207 are high, the logic circuit 230 performs arithmetic processing in a manner similar to that in a conventional NOR circuit.

The following shows circuit operation when the power supply is OFF during the operation of the logic circuit 230.

In a conventional NOR circuit, when the power supply is OFF during the circuit operation, a data during the arithmetic processing is volatilized.

In contrast, since the n-channel transistors 201, 202, and 207 have extremely low off-state current, after the potentials ϕ of the gates of the n-channel transistors 201, 202, and 207 are made low, even when the power supply is OFF, the logic circuit 230 can hold the potential of the node N_8 because at least the node N_8 can be brought into a floating state by making the potentials ϕ of the gates of the n-channel transistors 201, 202, and 207 low. Note that the potential can be held for a sufficiently long period without providing a capacitor at the retention node (node N_8); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials ϕ of the gates of the n-channel transistors 201, 202, and 207 high, an input potential signal does not need to be supplied when the power supply is ON again, and the arithmetic processing can be started again immediately. Further, power consumption of the logic circuit 230 can be reduced.

In the logic circuits 200, 210, 220, and 230, the n-channel transistors 201, 202, and 207 are transistors having extremely low off-state current. Each of the n-channel transistors 201, 202, and 207 has off-current characteristics similar to those of any of the transistors 15 to 19 described in Embodiment 1, the n-channel transistor 51 described in Embodiment 2, and the n-channel transistor 54 described in Embodiment 2, for example. Further, each of the n-channel transistors 201, 202, and 207 can be a transistor like any of the n-channel transistors 51 and 54, in which a channel formation region is formed using an oxide semiconductor where the concentration of hydrogen serving as a carrier donor is extremely reduced, in particular an oxide semiconductor having the above-described hydrogen concentration. Note that the carrier concentration in the oxide semiconductor is preferably similar to that in the n-channel transistors 51 and 54.

In the logic circuits 200, 210, 220, and 230, there is no particular limitation on the n-channel transistors 203 and 204 and the p-channel transistors 205 and 206 as long as a transistor is formed using a substrate including a semiconductor material.

As in the case of the n-channel transistors 201, 202, and 207, by forming the channel formation regions of the n-channel transistors 203 and 204 using an oxide semiconductor where the concentration of hydrogen serving as a carrier donor is extremely reduced to the above hydrogen concentration, the logic circuits 200, 210, 220, and 230 can have further reduced power consumption.

In terms of microfabrication, the NOR circuit according to one embodiment of the invention is preferably configured like any of the logic circuits 200, 210, 220, and 230 where transistors having extremely low off-state current are arranged such that the number of transistor elements is reduced as much as possible because the number of the elements is smaller and thus the transistors occupy a smaller area than in the logic circuit 230. Further, in terms of high-speed operation of the circuit, the NOR circuit according to one embodiment of the invention is preferably configured like any of the logic circuits 210, 220, and 230 where the potential of the node electrically connected to the output terminal is held, i.e., the circuit where the potential obtained by arithmetic processing is held, because the arithmetic processing can be started again more immediately than in the logic circuit 200.

Furthermore, in the NOR circuits (the logic circuits 200, 210, 220, and 230) according to embodiments of the invention, the configuration other than the transistors having extremely low off-state current (the configuration corresponding to a conventional NOR circuit) is not limited to a CMOS circuit. For example, the p-channel transistors which are components of the circuit configuration may be replaced with n-channel enhancement transistors, as in the logic circuits 50 and 55. By applying the n-channel enhancement transistor in place of the p-channel transistor which is a component of the circuit configuration, the transistors in the logic circuits 200, 210, 220, and 230 can have the same conductivity type. Thus, the fabrication steps can be reduced, the yield of the logic circuits 200, 210, 220, and 230 can be increased, and the manufacturing cost can be reduced. The n-channel enhancement transistor may also be a transistor in which a channel formation region is formed using an oxide semiconductor having the above hydrogen concentration. In this manner, even when the transistors in the logic circuit are only n-channel transistors, the logic circuits 200, 210, 220, and 230 can have lower power consumption.

From the above, by reducing the power consumption of the logic circuits 200, 210, 220, and 230, a semiconductor device including at least one of the logic circuits 200, 210, 220, and 230 can also have lower power consumption. Further, by reducing the power consumption of the logic circuits 200, 210, 220, and 230, an external circuit for operating the logic circuits 200, 210, 220, and 230 can have a lighter load. Thus, the functionality of a semiconductor device including at least one of the logic circuits 200, 210, 220, and 230 and the external circuit can be expanded.

Note that the contents of this embodiment or part thereof can be combined freely with the contents of other embodiments or part thereof.

Embodiment 5

This embodiment shows another example of the logic circuit described in Embodiment 1. Specifically, an AND circuit is described with reference to FIG. 8. Note that in some circuit diagrams, a circuit symbol using a dotted line and "OS" are shown together in order to indicate that the transistor includes an oxide semiconductor. Further, for the logic circuits described in this embodiment, the reference numerals used in Embodiment 1 are used as appropriate.

[Configuration Example and Operation Example of the Logic Circuit]

Figure 8:
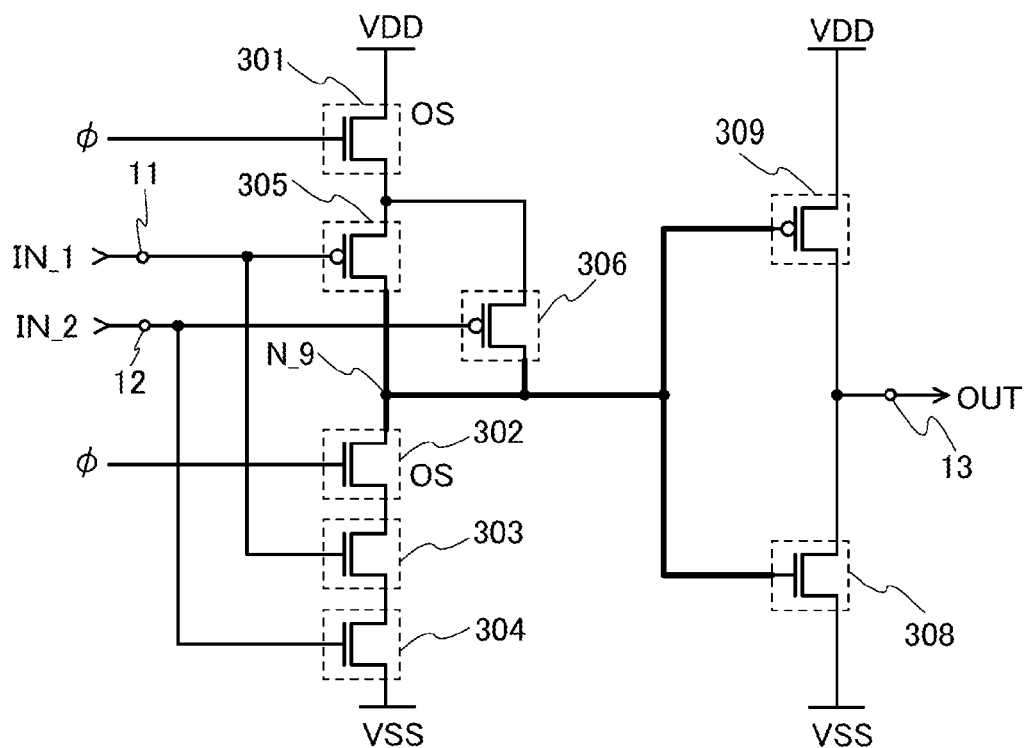
FIG. 8 is a circuit diagram illustrating a logic circuit according to one embodiment of the invention.

A logic circuit 300 illustrated in FIG. 8 is a logic circuit in which an n-channel transistor is additionally provided and electrically connected to an AND circuit. Although this embodiment shows a circuit in which the AND circuit is configured by a CMOS circuit that is suitable for microfabrication, the AND circuit may be configured to include a resistor, a diode, and the like. In FIG. 8, the AND circuit has two input terminals; one of them is denoted by the first input terminal 11, and the other is denoted by the second input terminal 12.

The logic circuit 300 includes an n-channel transistor 301, an n-channel transistor 302, an n-channel transistor 303, an n-channel transistor 304, an n-channel transistor 308, a p-channel transistor 305, a p-channel transistor 306, and a p-channel transistor 309. In particular, the n-channel transistors 301 and 302 have extremely low off-state current.

The AND circuit is a logic circuit in which the NAND circuit described in Embodiment 3 is electrically connected to the NOT circuit described in Embodiment 2. That is, in the AND circuit, the output terminal of the NAND circuit can be regarded as the input terminal of the NOT circuit. In the AND circuit, the NAND circuit includes the n-channel transistors 303 and 304 and the p-channel transistors 305 and 306, and the NOT circuit includes the n-channel transistor 308 and the p-channel transistor 309. Further, the n-channel transistors 301 and 302 which have extremely low off-state current can be provided in the NAND circuit or in the NOT circuit. Note that the logic circuit 300 is configured such that the n-channel transistors 301 and 302 are provided in the NAND circuit.

The transistors included in the logic circuit 300 have a connection relation as follows. First, the connection relation in the NAND circuit is described.

The first input terminal 11, a gate of the n-channel transistor 303, and a gate of the p-channel transistor 305 are electrically connected to one another; the second input terminal 12, a gate of the n-channel transistor 304, and a gate of the p-channel transistor 306 are electrically connected to one another; the high-potential-side power supply potential line for supplying a high-potential-side power supply potential (VDD) is electrically connected to a first terminal of the n-channel transistor 301; a second terminal of the n-channel transistor 301, a first terminal of the p-channel transistor 305, and a first terminal of the p-channel transistor 306 are electrically connected to one another; the low-potential-side power supply potential line for supplying a low-potential-side power supply potential (VSS) is electrically connected to a first terminal of the n-channel transistor 304; a second terminal of the n-channel transistor 304 is electrically connected to a first terminal of the n-channel transistor 303; a second terminal of the n-channel transistor 303 is electrically connected to a first terminal of the n-channel transistor 302; and a second terminal of the p-channel transistor 305, a second terminal of the p-channel transistor 306, and a second terminal of the n-channel transistor 302 are electrically connected to one another. Note that a gate of the n-channel transistor 301 and a gate of the n-channel transistor 302 have the same potential.

Next, the connection relation in the NOT circuit in the logic circuit 300 is described.

A gate of the n-channel transistor 308, a gate of the p-channel transistor 309, the second terminal of the p-channel transistor 305, the second terminal of the p-channel transistor 306, and the second terminal of the n-channel transistor 302 are electrically connected to one another; the high-potential-side power supply potential line for supplying a high-potential-side power supply potential (VDD) is electrically connected to a first terminal of the p-channel transistor 309; the low-potential-side power supply potential line for supplying a low-potential-side power supply potential (VSS) is electrically connected to a first terminal of the n-channel transistor 308; and a second terminal of the p-channel transistor 309, a second terminal of the n-channel transistor 308, and the output terminal 13 are electrically connected to one another.

When the potentials $\phi$ of the gates of the n-channel transistors 301 and 302 are made high (when the Vgs of the n-channel transistor 301 becomes higher than the threshold voltage thereof and the Vgs of the n-channel transistor 302 becomes higher than the threshold voltage thereof), the logic circuit 300 performs arithmetic processing in a manner similar to that in a conventional AND circuit. For example, when high-potential input potential signals are input to the first input terminal 11 and the second input terminal 12, a high potential, i.e., a high-potential-side power supply potential (VDD) is output from the output terminal 13. Further, when a low-potential input potential signal is input to either the first input terminal 11 or the second input terminal 12, a low potential, i.e., a low-potential-side power supply potential (VSS) is output from the output terminal 13.

The following shows circuit operation when the power supply is OFF during the operation of the logic circuit 300. In a conventional AND circuit, when the power supply is OFF during the circuit operation, a potential difference between the high-potential-side power supply potential (VDD) and the low-potential-side power supply potential (VSS) is lost, so that a data during the arithmetic processing is volatilized.

In contrast, since the n-channel transistors 301 and 302 have extremely low off-state current, after the potentials $\phi$ of the gates of the n-channel transistors 301 and 302 are made low (after the Vgs of the n-channel transistor 301 becomes lower than the threshold voltage thereof and the Vgs of the n-channel transistor 302 is lower than the threshold voltage thereof), even when the power supply is OFF during the circuit operation, the logic circuit 300 can hold a potential of a node N_9 because at least the node N_9 can be brought into a floating state by making the potentials $\phi$ of the gates of the n-channel transistors 301 and 302 low (by making the Vgs of the n-channel transistor 301 lower than the threshold voltage thereof and the Vgs of the n-channel transistor 302 lower than the threshold voltage thereof). Note that the node N_9 is a portion denoted by a thick line including a portion indicated with "N_9" in FIG. 8. The potential can be held for a sufficiently long period without providing a capacitor at the retention node (node N_9); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials $\phi$ of the gates of the n-channel transistors 301 and 302 high, the arithmetic processing can be started again based on the potential held in the node N_9. Therefore, an input potential signal does not need to be supplied when the power supply is ON again, and the arithmetic processing can be started again immediately. Further, power consumption of the logic circuit 300 can be reduced.

Figure 9:
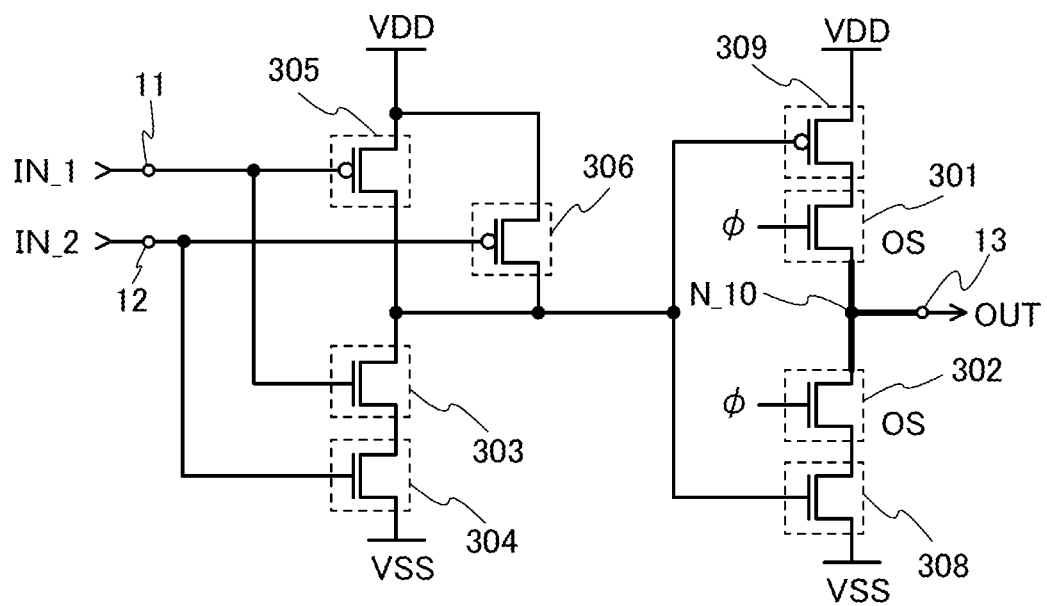
FIG. 9 is a circuit diagram illustrating a logic circuit according to one embodiment of the invention.

The logic circuit 300 is a mode where the n-channel transistors 301 and 302 are provided in the NAND circuit; there may be a modification example of the logic circuit 300 where the n-channel transistors 301 and 302 are provided in the NOT circuit and the potential of the node electrically connected to the output terminal 13 is held. Next, a logic circuit 310 corresponding to such a mode is illustrated in FIG. 9. Note that the logic circuit 310 is described by using the reference numerals as the logic circuit 300 in FIG. 8 as appropriate.

The logic circuit 310 includes the n-channel transistors 301, 302, 303, 304, and 308 and the p-channel transistors 305, 306, and 309, like the logic circuit 300. In particular, the n-channel transistors 301 and 302 have extremely low off-state current.

The NAND circuit includes the n-channel transistors 303 and 304 and the p-channel transistors 305 and 306, and the NOT circuit includes the n-channel transistor 308 and the p-channel transistor 309. Further, the logic circuit 310 is configured such that the n-channel transistors 301 and 302 are provided in the NOT circuit.

The transistors included in the logic circuit 310 have a connection relation as follows. First, the connection relation in the NAND circuit is described.

The first input terminal 11, the gate of the n-channel transistor 303, and the gate of the p-channel transistor 305 are electrically connected to one another; the second input terminal 12, the gate of the n-channel transistor 304, and the gate of the p-channel transistor 306 are electrically connected to one another; the high-potential-side power supply potential line for supplying a high-potential-side power supply potential (VDD), the first terminal of the p-channel transistor 305, and the first terminal of the p-channel transistor 306 are electrically connected to one another; the low-potential-side power supply potential line for supplying a low-potential-side power supply potential (VSS) is electrically connected to the first terminal of the n-channel transistor 304; the second terminal of the n-channel transistor 304 is electrically connected to the first terminal of the n-channel transistor 303; the second terminal of the p-channel transistor 305, the second terminal of the p-channel transistor 306, and the second terminal of the n-channel transistor 303 are electrically connected to one another.

Next, the connection relation in the NOT circuit in the logic circuit 310 is described.

The gate of the n-channel transistor 308, the gate of the p-channel transistor 309, the second terminal of the p-channel transistor 305, the second terminal of the p-channel transistor 306, and the second terminal of the n-channel transistor 303 are electrically connected to one another; the high-potential-side power supply potential line for supplying a high-potential-side power supply potential (VDD) is electrically connected to the first terminal of the p-channel transistor 309; the second terminal of the p-channel transistor 309 is electrically connected to the first terminal of the n-channel transistor 301; the low-potential-side power supply potential line for supplying a low-potential-side power supply potential (VSS) is electrically connected to the first terminal of the n-channel transistor 308; the second terminal of the n-channel transistor 308 is electrically connected to the first terminal of the n-channel transistor 302; and the second terminal of the n-channel transistor 301, the second terminal of the n-channel transistor 302, and the output terminal 13 are electrically connected to one another. Note that the gate of the n-channel transistor 301 and the gate of the n-channel transistor 302 have the same potential.

When the potentials $\phi$ of the gates of the n-channel transistors 301 and 302 are made high, the logic circuit 310 performs arithmetic processing in a manner similar to that in a conventional AND circuit, like the logic circuit 300.

The following shows circuit operation when the power supply is OFF during the operation of the logic circuit 310. In a conventional AND circuit, when the power supply is OFF during the circuit operation, a data during the arithmetic processing is volatilized.

In contrast, since the n-channel transistors 301 and 302 have extremely low off-state current, after the potentials $\phi$ of the gates of the n-channel transistors 301 and 302 are made low, even when the power supply is OFF, the logic circuit 310 can hold a potential of a node N_10 because the node N_10 can be brought into a floating state by making the potentials $\phi$ of the gates of the n-channel transistors 301 and 302 low. Note that the node N_10 is a portion denoted by a thick line including a portion indicated with "N_10" in FIG. 9. The potential can be held for a sufficiently long period without providing a capacitor at the retention node (node N_10); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials $\phi$ of the gates of the n-channel transistors 301 and 302 high, an input potential signal does not need to be supplied when the power supply is ON again, and power consumption of the logic circuit 310 for performing the arithmetic processing can be reduced.

As described above, the AND circuit is a logic circuit in which the NAND circuit described in Embodiment 3 is electrically connected to the NOT circuit described in Embodiment 2; therefore, the AND circuit can be configured by combining a variety of modes of the NAND circuit described in Embodiment 3 and of the NOT circuit described in Embodiment 2 as appropriate. For example, it is possible to configure the AND circuit according to one embodiment of the invention by electrically connecting any one of the logic circuits 100, 110, 120, and 130 described in Embodiment 3 and a conventional NOT circuit or by electrically connecting a conventional NAND circuit and either the logic circuit 50 or the logic circuit 55 described in Embodiment 2.

In the logic circuits 300 and 310, the n-channel transistors 301 and 302 are transistors having extremely low off-state current, as described above. Each of the n-channel transistors 301 and 302 has off-current characteristics similar to those of any of the transistors 15 to 19 described in Embodiment 1, the n-channel transistor 51 described in Embodiment 2, and the n-channel transistor 54 described in Embodiment 2, for example. Further, each of the n-channel transistors 301 and 302 can be a transistor like any of the n-channel transistors 51 and 54, in which a channel formation region is formed using an oxide semiconductor where the concentration of hydrogen serving as a carrier donor is extremely reduced, in particular an oxide semiconductor having the above-described hydrogen concentration. Note that the carrier concentration in the oxide semiconductor is preferably similar to that in the n-channel transistors 51 and 54 described in Embodiment 2.

In the logic circuits 300 and 310, there is no particular limitation on the n-channel transistors 303, 304, and 308 and the p-channel transistors 305, 306, and 309 as long as a transistor is formed using a substrate including a semiconductor material.

As in the case of the n-channel transistors 301 and 302, by forming the channel formation regions of the n-channel transistors 303, 304, and 308 using an oxide semiconductor where the concentration of hydrogen serving as a carrier donor is extremely reduced to the above hydrogen concentration, an effect of reducing the power consumption of the logic circuits 300 and 310 is increased.

In terms of microfabrication, the AND circuit according to one embodiment of the invention is preferably configured like the logic circuits 300 and 310 where transistors having extremely low off-state current are arranged such that the number of transistor elements is reduced as much as possible because the expansion of the area occupied by the transistors can be minimized. Further, in terms of high-speed operation of the circuit, the AND circuit according to one embodiment of the invention is preferably configured like the logic circuit 310 where the potential of the node electrically connected to the output terminal 13 is held, i.e., the circuit where the potential obtained by arithmetic processing is held, because the arithmetic processing can be started again more immediately than in the logic circuit 300.

Furthermore, in the AND circuits (the logic circuits 300 and 310) according to embodiments of the invention, the configuration other than the transistors having extremely low off-state current (the configuration corresponding to a conventional AND circuit) is not limited to a CMOS circuit. For example, the p-channel transistors which are components of the circuit configuration may be replaced with n-channel enhancement transistors, as in the logic circuits 50 and 55. By applying the n-channel enhancement transistor in place of the p-channel transistor which is a component of the circuit configuration, the transistors in the logic circuits 300 and 310 can have the same conductivity type. Thus, the fabrication steps can be reduced, the yield of the logic circuits 300 and 310 can be increased, and the manufacturing cost can be reduced. The n-channel enhancement transistor may also be a transistor in which a channel formation region is formed using an oxide semiconductor having the above hydrogen concentration. In this manner, even when the transistors in the logic circuit are only n-channel transistors, the logic circuits 300 and 310 can have lower power consumption.

From the above, by reducing the power consumption of the logic circuits 300 and 310, a semiconductor device including at least one of the logic circuit 300 and the logic circuit 310 can also have lower power consumption. Further, by reducing the power consumption of the logic circuits 300 and 310, an external circuit for operating the logic circuits 300 and 310 can have a lighter load. Thus, the functionality of a semiconductor device including at least one of the logic circuit 300 and the logic circuit 310 can be expanded.

Note that the contents of this embodiment or part thereof can be combined freely with the contents of other embodiments or part thereof.

Embodiment 6

This embodiment shows another example of the logic circuit described in Embodiment 1. Specifically, an OR circuit is described with reference to FIG. 10. Note that in some circuit diagrams, a circuit symbol using a dotted line and "OS" are shown together in order to indicate that the transistor includes an oxide semiconductor. Further, for the logic circuits described in this embodiment, the reference numerals used in Embodiment 1 are used as appropriate.

[Configuration Example and Operation Example of the Logic Circuit]

Figure 10:
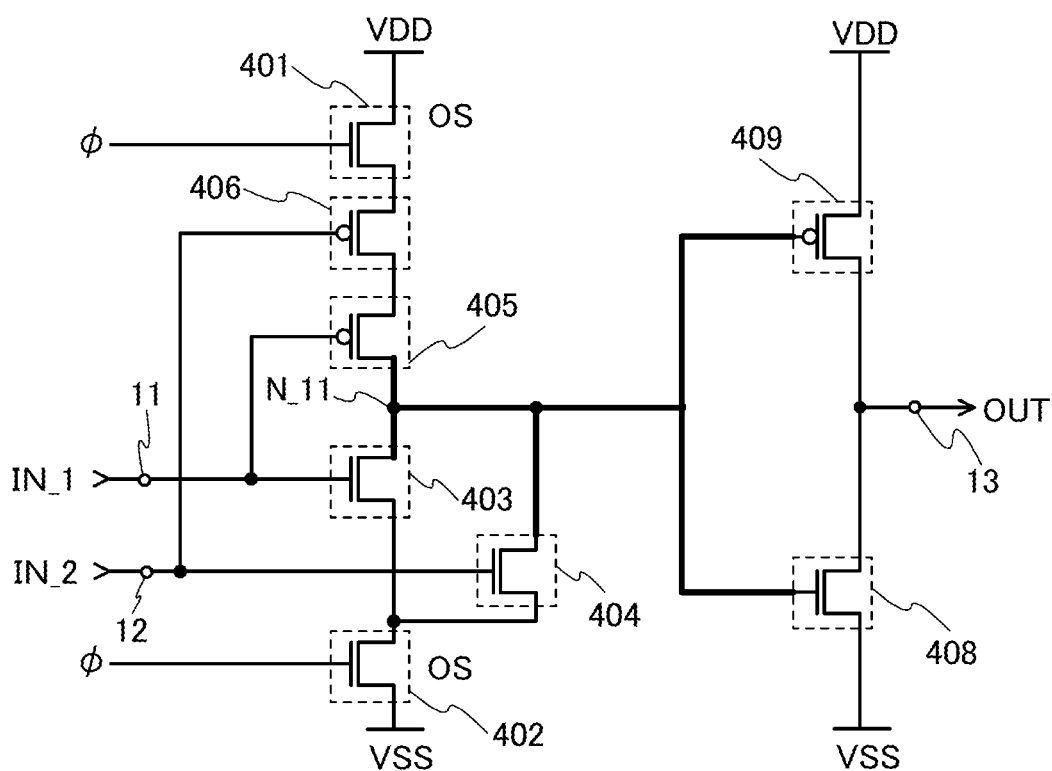
FIG. 10 is a circuit diagram illustrating a logic circuit according to one embodiment of the invention.

A logic circuit 400 illustrated in FIG. 10 is a logic circuit in which an n-channel transistor is additionally provided and electrically connected to an OR circuit. Although this embodiment shows a circuit in which the OR circuit is configured by a CMOS circuit that is suitable for microfabrication, the OR circuit may be configured to include a resistor, a diode, and the like. In FIG. 10, the OR circuit has two input terminals; one of them is denoted by the first input terminal 11, and the other is denoted by the second input terminal 12.

The logic circuit 400 includes an n-channel transistor 401, an n-channel transistor 402, an n-channel transistor 403, an n-channel transistor 404, an n-channel transistor 408, a p-channel transistor 405, a p-channel transistor 406, and a p-channel transistor 409. In particular, the n-channel transistors 401 and 402 have extremely low off-state current.

The OR circuit described in this embodiment is a logic circuit in which the NOR circuit described in Embodiment 4 is electrically connected to the NOT circuit described in Embodiment 2. That is, the output terminal of the NOR circuit can be regarded as the input terminal of the NOT circuit. In the OR circuit, the NOR circuit includes the n-channel transistors 403 and 404, and the p-channel transistors 405 and 406, and the NOT circuit includes the n-channel transistor 408 and the p-channel transistor 409. Further, the n-channel transistors 401 and 402 which have extremely low off-state current can be provided in the NOR circuit or in the NOT circuit. Note that the logic circuit 400 is configured such that the n-channel transistors 401 and 402 are provided in the NOR circuit.

The transistors included in the logic circuit 400 have a connection relation as follows. First, the connection relation in the NOR circuit is described.

The first input terminal 11, a gate of the n-channel transistor 403, and a gate of the p-channel transistor 405 are electrically connected to one another; the second input terminal 12, a gate of the n-channel transistor 404, and a gate of the p-channel transistor 406 are electrically connected to one another; the high-potential-side power supply potential line for supplying a high-potential-side power supply potential (VDD) is electrically connected to a first terminal of the n-channel transistor 401; a second terminal of the n-channel transistor 401 is electrically connected to a first terminal of the p-channel transistor 406; a second terminal of the p-channel transistor 406 is electrically connected to a first terminal of the p-channel transistor 405; the low-potential-side power supply potential line for supplying a low-potential-side power supply potential (VSS) is electrically connected to a first terminal of the n-channel transistor 402; a second terminal of the n-channel transistor 402, a first terminal of the n-channel transistor 403, and a first terminal of the n-channel transistor 404 are electrically connected to one another; and a second terminal of the n-channel transistor 403, a second terminal of the n-channel transistor 404, and a second terminal of the p-channel transistor 405 are electrically connected to one another. Note that a gate of the n-channel transistor 401 and a gate of the n-channel transistor 402 have the same potential.

Next, the connection relation in the NOT circuit in the logic circuit 400 is described.

A gate of the n-channel transistor 408, a gate of the p-channel transistor 409, the second terminal of the n-channel transistor 403, the second terminal of the n-channel transistor 404, and the second terminal of the p-channel transistor 405 are electrically connected to one another; the high-potential-side power supply potential line for supplying a high-potential-side power supply potential (VDD) is electrically connected to a first terminal of the p-channel transistor 409; the low-potential-side power supply potential line for supplying a low-potential-side power supply potential (VSS) is electrically connected to a first terminal of the n-channel transistor 408; and a second terminal of the n-channel transistor 408, a second terminal of the p-channel transistor 409, and the output terminal 13 are electrically connected to one another.

When the potentials φ of the gates of the n-channel transistors 401 and 402 are made high (when the Vgs of the n-channel transistor 401 becomes higher than the threshold voltage thereof and the Vgs of the n-channel transistor 402 becomes higher than the threshold voltage thereof), the logic circuit 400 performs arithmetic processing in a manner similar to that in a conventional OR circuit. For example, when a high-potential input potential signal is input to either the first input terminal 11 or the second input terminal 12, a high potential, i.e., a high-potential-side power supply potential (VDD) is output from the output terminal 13. Further, when low-potential input potential signals are input to the first input terminal 11 and the second input terminal 12, a low potential, i.e., a low-potential-side power supply potential (VSS) is output from the output terminal 13.

The following shows circuit operation when the power supply is OFF during the operation of the logic circuit 400. In a conventional OR circuit, when the power supply is OFF during the circuit operation, a potential difference between the high-potential-side power supply potential (VDD) and the low-potential-side power supply potential (VSS) is lost, so that a data during the arithmetic processing is volatilized.

In contrast, since the n-channel transistors 401 and 402 have extremely low off-state current, after the potentials φ of the gates of the n-channel transistors 401 and 402 are made low (after the Vgs of the n-channel transistor 401 becomes lower than the threshold voltage thereof and the Vgs of the n-channel transistor 402 is lower than the threshold voltage thereof), even when the power supply is OFF, the logic circuit 400 can hold a potential of a node N_11 because at least the node N_11 can be brought into a floating state by making the potentials φ of the gates of the n-channel transistors 401 and 402 low. Note that the node N_11 is a portion denoted by a thick line including a portion indicated with "N_11" in FIG. 10. The potential can be held for a sufficiently long period without providing a capacitor at the retention node (node N_11); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 401 and 402 high, the arithmetic processing can be started again based on the potential held in the node N_11. Therefore, an input potential signal does not need to be supplied when the power supply is ON again, and the arithmetic processing can be started again immediately. Further, power consumption of the logic circuit 400 can be reduced.

Figure 11:
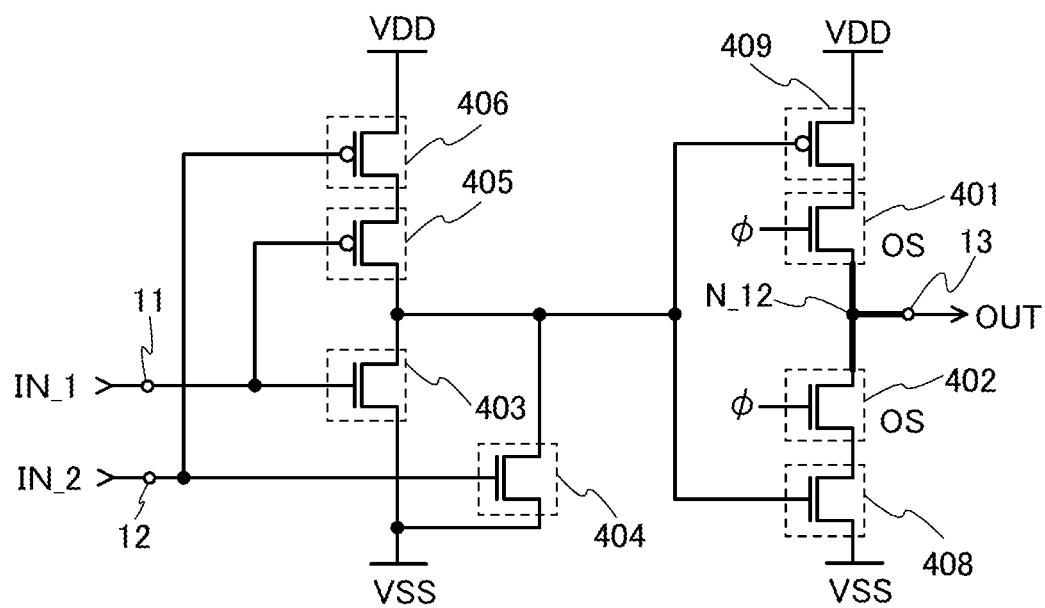
FIG. 11 is a circuit diagram illustrating a logic circuit according to one embodiment of the invention.

The logic circuit 400 is a mode where the n-channel transistors 401 and 402 are provided in the NOR circuit; there may be a modification example of the logic circuit 400 where the n-channel transistors 401 and 402 are provided in the NOT circuit and the potential of the node electrically connected to the output terminal 13 is held. Next, a logic circuit 410 corresponding to such a mode is illustrated in FIG. 11. Note that the logic circuit 410 is described by using the reference numerals as the logic circuit 400 in FIG. 10 as appropriate.

The logic circuit 410 includes the n-channel transistors 401, 402, 403, 404, and 408 and the p-channel transistors 405, 406, and 409, like the logic circuit 400. In particular, the n-channel transistors 401 and 402 have extremely low off-state current.

The NOR circuit includes the n-channel transistors 403 and 404 and the p-channel transistors 405 and 406, and the NOT circuit includes the n-channel transistor 408 and the p-channel transistor 409. Further, the logic circuit 410 is configured such that the n-channel transistors 401 and 402 which have extremely low off-state current are provided in the NOT circuit.

The transistors included in the logic circuit 410 have a connection relation as follows. First, the connection relation in the NOR circuit is described.

The first input terminal 11, the gate of the n-channel transistor 403, and the gate of the p-channel transistor 405 are electrically connected to one another; the second input terminal 12, the gate of the n-channel transistor 404, and the gate of the p-channel transistor 406 are electrically connected to one another; the high-potential-side power supply potential line for supplying a high-potential-side power supply potential (VDD) is electrically connected to the first terminal of the p-channel transistor 406; the second terminal of the p-channel transistor 406 is electrically connected to the first terminal of the p-channel transistor 405; the low-potential-side power supply potential line for supplying a low-potential-side power supply potential (VSS), the first terminal of the n-channel transistor 403, and the first terminal of the n-channel transistor 404 are electrically connected to one another; and the second terminal of the n-channel transistor 403, the second terminal of the n-channel transistor 404, and the second terminal of the p-channel transistor 405 are electrically connected to one another.

Next, the connection relation in the NOT circuit in the logic circuit 410 is described.

The gate of the n-channel transistor 408, the gate of the p-channel transistor 409, the second terminal of the n-channel transistor 403, the second terminal of the n-channel transistor 404, and the second terminal of the p-channel transistor 405 are electrically connected to one another; the high-potential-side power supply potential line for supplying a high-potential-side power supply potential (VDD) is electrically connected to the first terminal of the p-channel transistor 409; the second terminal of the p-channel transistor 409 is electrically connected to the first terminal of the n-channel transistor 401; the low-potential-side power supply potential line for supplying a low-potential-side power supply potential (VSS) is electrically connected to the first terminal of the n-channel transistor 408; the second terminal of the n-channel transistor 408 is electrically connected to the first terminal of the n-channel transistor 402; and the second terminal of the n-channel transistor 401, the second terminal of the n-channel transistor 402, and the output terminal 13 for outputting an output potential signal (OUT) are electrically connected to one another. Note that the gate of the n-channel transistor 401 and the gate of the n-channel transistor 402 have the same potential.

When the potentials φ of the gates of the n-channel transistors 401 and 402 are made high, the logic circuit 410 performs arithmetic processing in a manner similar to that in a conventional OR circuit, like the logic circuit 400.

The following shows circuit operation when the power supply is OFF during the operation of the logic circuit 410. In a conventional OR circuit, when the power supply is OFF during the circuit operation, a data during the arithmetic processing is volatilized.

In contrast, since the n-channel transistors 401 and 402 have extremely low off-state current, after the potentials φ of the gates of the n-channel transistors 401 and 402 are made low, even when the power supply is OFF, the logic circuit 410 can hold a potential of a node N_12 because the node N_12 can be brought into a floating state by making the potentials φ of the gates of the n-channel transistors 401 and 402 low. Note that the node N_12 is a portion denoted by a thick line including a portion indicated with "N_12" in FIG. 11. The potential can be held for a sufficiently long period without providing a capacitor at the retention node (node N_12); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 401 and 402 high, an input potential signal does not need to be supplied when the power supply is ON again, and the arithmetic processing can be started again immediately. Further, power consumption of the logic circuit 410 can be reduced.

As described above, the OR circuit is a logic circuit in which the NOR circuit described in Embodiment 4 is electrically connected to the NOT circuit described in Embodiment 2; therefore, the OR circuit can be configured by combining a variety of modes of the NOR circuit described in Embodiment 4 and of the NOT circuit described in Embodiment 2 as appropriate. For example, it is possible to configure the OR circuit according to one embodiment of the invention by electrically connecting any one of the logic circuits 200, 210, 220, and 230 described in Embodiment 4 and a conventional NOT circuit or by electrically connecting a conventional NOR circuit and either the logic circuit 50 or the logic circuit 55 described in Embodiment 2.

In the logic circuits 400 and 410, the n-channel transistors 401 and 402 are transistors having extremely low off-state current, as described above. Each of the n-channel transistors 401 and 402 has off-current characteristics similar to those of any of the transistor 15 described in Embodiment 1, the n-channel transistor 51 described in Embodiment 2, and the n-channel transistor 54 described in Embodiment 2, for example. Further, each of the n-channel transistors 401 and 402 can be a transistor like any of the n-channel transistors 51 and 54, in which a channel formation region is formed using an oxide semiconductor where the concentration of hydrogen serving as a carrier donor is extremely reduced, in particular an oxide semiconductor having the above-described hydrogen concentration. Note that the carrier concentration in the oxide semiconductor is preferably similar to that in the n-channel transistors 51 and 54 described in Embodiment 2.

In the logic circuits 400 and 410, there is no particular limitation on the n-channel transistors 403, 404, and 408 and the p-channel transistors 405, 406, and 409 as long as a transistor is formed using a substrate including a semiconductor material.

As in the case of the n-channel transistors 401 and 402, by forming the channel formation regions of the n-channel transistors 403, 404, and 408 using an oxide semiconductor where the concentration of hydrogen serving as a carrier donor is extremely reduced to the above hydrogen concentration, an effect of reducing the power consumption of the logic circuits 400 and 410 for performing arithmetic processing can be increased.

In terms of microfabrication, the OR circuit according to one embodiment of the invention is preferably configured like the logic circuits 400 and 410 where transistors having extremely low off-state current are arranged such that the number of transistor elements is reduced as much as possible because the expansion of the area occupied by the transistors can be minimized. Further, in terms of high-speed operation of the circuit, the OR circuit according to one embodiment of the invention is preferably configured like the logic circuit 410 where the potential of the node electrically connected to the output terminal 13 is held, i.e., the circuit where the potential obtained by arithmetic processing is held, because the arithmetic processing can be started again more immediately than in the logic circuit 400.

Furthermore, in the OR circuits (the logic circuits 400 and 410) according to embodiments of the invention, the configuration other than the transistors having extremely low off-state current (the configuration corresponding to a conventional OR circuit) is not limited to a CMOS circuit. For example, the p-channel transistors which are components of the circuit configuration may be replaced with n-channel enhancement transistors, as in the logic circuits 50 and 55. By applying the n-channel enhancement transistor in place of the p-channel transistor which is a component of the circuit configuration, the transistors in the logic circuits 400 and 410 can have the same conductivity type. Thus, the fabrication steps can be reduced, the yield of the logic circuits 400 and 410 can be increased, and the manufacturing cost can be reduced. The n-channel enhancement transistor may also be a transistor in which a channel formation region is formed using an oxide semiconductor having the above hydrogen concentration. In this manner, even when the transistors in the logic circuit are only n-channel transistors, the logic circuits 400 and 410 can have lower power consumption.

From the above, by reducing the power consumption of the logic circuits 400 and 410, a semiconductor device including at least one of the logic circuit 400 and the logic circuit 410 can also have lower power consumption. Further, by reducing the power consumption of the logic circuits 400 and 410, an external circuit for operating the logic circuits 400 and 410 can have a lighter load. Thus, the functionality of a semiconductor device including at least one of the logic circuit 400 and the logic circuit 410 can be expanded.

Note that the contents of this embodiment or part thereof can be combined freely with the contents of other embodiments or part thereof.

Embodiment 7

This embodiment shows another example of the logic circuit described in Embodiment 1. Specifically, an XOR circuit is described with reference to FIG. 12. Note that in some circuit diagrams, a circuit symbol using a dotted line and "OS" are shown together in order to indicate that the transistor includes an oxide semiconductor. Further, for the logic circuits described in this embodiment, the reference numerals used in Embodiment 1 are used as appropriate.

[Configuration Example and Operation Example of the Logic Circuit]

Figure 12:
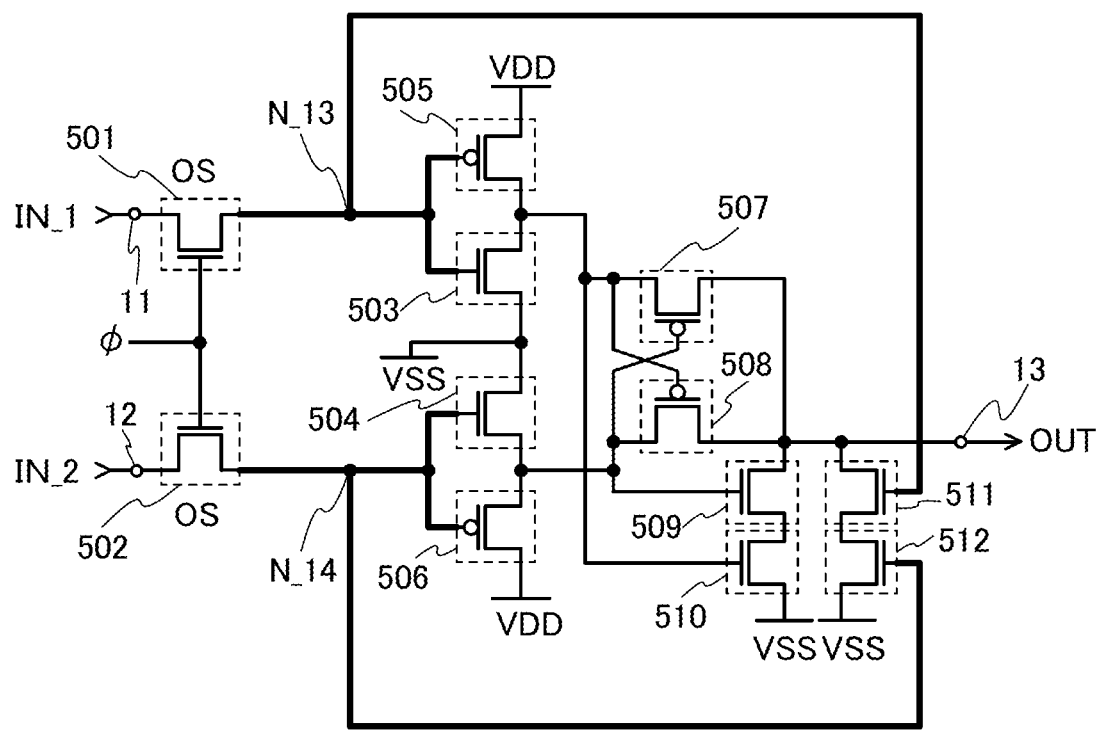
FIG. 12 is a circuit diagram illustrating a logic circuit according to one embodiment of the invention.

A logic circuit 500 illustrated in FIG. 12 is a logic circuit in which an n-channel transistor is additionally provided and electrically connected to an XOR circuit. Although this embodiment shows a circuit in which the XOR circuit is configured by a CMOS circuit that is suitable for microfabrication, the XOR circuit may be configured to include a resistor, a diode, and the like. In FIG. 12, the XOR circuit has two input terminals; one of them is denoted by the first input terminal 11, and the other is denoted by the second input terminal 12.

The logic circuit 500 includes an n-channel transistor 501, an n-channel transistor 502, an n-channel transistor 503, an n-channel transistor 504, an n-channel transistor 509, an n-channel transistor 510, an n-channel transistor 511, an n-channel transistor 512, a p-channel transistor 505, a p-channel transistor 506, a p-channel transistor 507, and a p-channel transistor 508. In particular, the n-channel transistors 501 and 502 have extremely low off-state current.

The transistors included in the logic circuit 500 have a connection relation as follows.

The first input terminal 11 is electrically connected to a first terminal of the n-channel transistor 501. The second input terminal 12 is electrically connected to a first terminal of the n-channel transistor 502.

A second terminal of the n-channel transistor 501, a gate of the n-channel transistor 503, a gate of the n-channel transistor 511, and a gate of the p-channel transistor 505 are electrically connected to one another; and a second terminal of the n-channel transistor 502, a gate of the n-channel transistor 504, a gate of the n-channel transistor 512, and a gate of the p-channel transistor 506 are electrically connected to one another.

A first terminal of the p-channel transistor 505, a first terminal of the p-channel transistor 506, and the high-potential-side power supply potential line for supplying a high-potential-side power supply potential (VDD) are electrically connected to one another. A second terminal of the p-channel transistor 505 is electrically connected to a first terminal of the n-channel transistor 503. A second terminal of the p-channel transistor 506 is electrically connected to a first terminal of the n-channel transistor 504. A second terminal of the n-channel transistor 503, a second terminal of the n-channel transistor 504, and the low-potential-side power supply potential line for supplying a low-potential-side power supply potential (VSS) are electrically connected to one another.

The first terminal of the n-channel transistor 503, the second terminal of the p-channel transistor 505, a gate of the p-channel transistor 508, a gate of the n-channel transistor 510, and a first terminal of the p-channel transistor 507 are electrically connected to one another.

The first terminal of the n-channel transistor 504, the second terminal of the p-channel transistor 506, a gate of the p-channel transistor 507, a gate of the n-channel transistor 509, and a first terminal of the p-channel transistor 508 are electrically connected to one another.

A first terminal of the n-channel transistor 510 is electrically connected to the low-potential-side power supply potential line for supplying a low-potential-side power supply potential (VSS); and a second terminal of the n-channel transistor 510 is electrically connected to a first terminal of the n-channel transistor 509.

A first terminal of the n-channel transistor 512 is electrically connected to the low-potential-side power supply potential line for supplying a low-potential-side power supply potential (VSS); and a second terminal of the n-channel transistor 512 is electrically connected to a first terminal of the n-channel transistor 511.

The output terminal 13, a second terminal of the p-channel transistor 507, a second terminal of the p-channel transistor 508, a second terminal of the n-channel transistor 509, and a second terminal of the n-channel transistor 511 are electrically connected to one another.

Note that a gate of the n-channel transistor 501 and a gate of the n-channel transistor 502 have the same potential.

When the potentials $\phi$ of the gates of the n-channel transistors 501 and 502 are high (when the Vgs of the n-channel transistor 501 is higher than the threshold voltage thereof and the Vgs of the n-channel transistor 502 is higher than the threshold voltage thereof), the logic circuit 500 performs arithmetic processing in a manner similar to that in a conventional XOR circuit. For example, when high-potential input potential signals are input to the first input terminal 11 and the second input terminal 12, a low potential, i.e., a low-potential-side power supply potential (VSS) is output from the output terminal 13. Further, when a high-potential input potential signal is input to either the first input terminal 11 or the second input terminal 12 and a low-potential input potential signal is input to the other, a high potential, i.e., a high-potential-side power supply potential (VDD) is output from the output terminal 13. Furthermore, when low-potential input potential signals are input to the first input terminal 11 and the second input terminal 12, a low potential, i.e., a low-potential-side power supply potential (VSS) is output from the output terminal 13.

The following shows circuit operation when the power supply is OFF during the operation of the logic circuit 500. In a conventional XOR circuit, when the power supply is OFF during the circuit operation, a potential difference between the high-potential-side power supply potential (VDD) and the low-potential-side power supply potential (VSS) is lost, so that a data during the arithmetic processing is volatilized.

In contrast, since the n-channel transistors 501 and 502 have extremely low off-state current, after the potentials $\phi$ of the gates of the n-channel transistors 501 and 502 are made low (after the Vgs of the n-channel transistor 501 becomes lower than the threshold voltage thereof and the Vgs of the n-channel transistor 502 is lower than the threshold voltage thereof), even when the power supply is OFF, the logic circuit 500 can hold potentials of a node N_13 and a node N_14 because the nodes N_13 and N_14 can be brought into floating states by making the potentials $\phi$ of the gates of the n-channel transistors 501 and 502 low. Note that the node N_13 is a portion denoted by a thick line including a portion indicated with "N_13" in FIG. 12, and the node N_14 is a portion denoted by a thick line including a portion indicated with "N_14" in FIG. 12. The potentials can be held for a sufficiently long period without providing capacitors at the retention nodes (nodes N_13 and N_14); however, when the holding period needs to be longer, capacitors may be provided in such a manner that one electrode of each of the capacitors is electrically connected to the corresponding retention node and the other electrode thereof is electrically connected to the low-potential-side power supply potential line.

Then, after the power supply is ON again, by making the potentials $\phi$ of the gates of the n-channel transistors 501 and 502 high, the arithmetic processing can be started again based on the potentials held in the nodes N_13 and N_14. Therefore, an input potential signal does not need to be supplied when the power supply is ON again, and the arithmetic processing can be started again immediately. Further, power consumption of the logic circuit 500 can be reduced.

Figure 13:
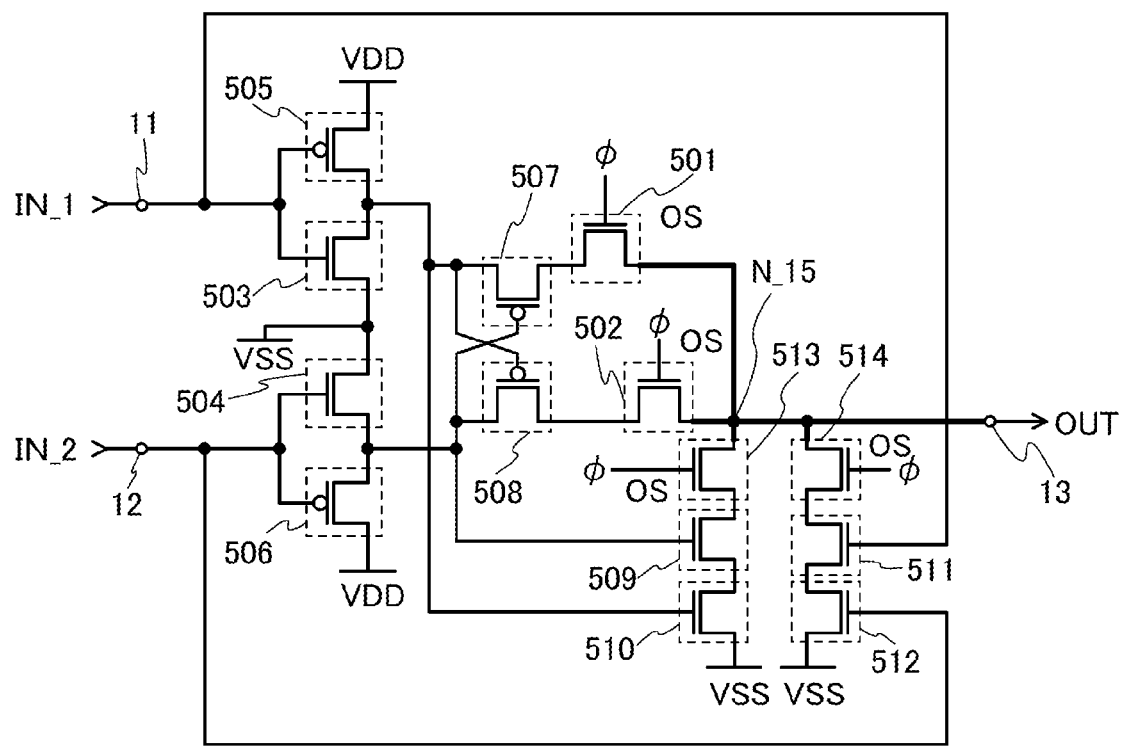
FIG. 13 is a circuit diagram illustrating a logic circuit according to one embodiment of the invention.

In this embodiment, the positions of the n-channel transistors 501 and 502 having extremely low off-state current are not limited to those in the logic circuit 500 as long as the n-channel transistors 501 and 502 are arranged in a current path (leakage path) for reducing an input potential to be held when the power supply is OFF. FIG. 13 illustrates another example of the logic circuit in which the positions of the transistors having extremely low off-state current are different from those in the logic circuits 500. FIG. 13 is a circuit diagram illustrating one of the examples, a logic circuit 520. Note that in the logic circuit 520, the reference numerals used in the logic circuit 500 in FIG. 12 are used as appropriate.

The logic circuit 520 includes the n-channel transistors 501, 502, 503, 504, 509, 510, 511, and 512, an n-channel transistor 513, an n-channel transistor 514, and the p-channel transistors 505, 506, 507, and 508. In particular, the n-channel transistors 501, 502, 513, and 514 have extremely low off-state current.

The transistors included in the logic circuit 520 have a connection relation as follows.

The first input terminal 11, the gate of the n-channel transistor 503, the gate of the n-channel transistor 511, and the gate of the p-channel transistor 505 are electrically connected to one another. The second input terminal 12, the gate of the n-channel transistor 504, the gate of the n-channel transistor 512, and the gate of the p-channel transistor 506 are electrically connected to one another.

The first terminal of the p-channel transistor 505, the first terminal of the p-channel transistor 506, and the high-potential-side power supply potential line for supplying a high-potential-side power supply potential (VDD) are electrically connected to one another. The second terminal of the p-channel transistor 505 is electrically connected to the first terminal of the n-channel transistor 503. The second terminal of the p-channel transistor 506 is electrically connected to the first terminal of the n-channel transistor 504. The second terminal of the n-channel transistor 503, the second terminal of the n-channel transistor 504, and the low-potential-side power supply potential line for supplying a low-potential-side power supply potential (VSS) are electrically connected to one another.

The first terminal of the n-channel transistor 503, the second terminal of the p-channel transistor 505, the gate of the p-channel transistor 508, the gate of the n-channel transistor 510, and the first terminal of the p-channel transistor 507 are electrically connected to one another.

The first terminal of the n-channel transistor 504, the second terminal of the p-channel transistor 506, the gate of the p-channel transistor 507, the gate of the n-channel transistor 509, and the first terminal of the p-channel transistor 508 are electrically connected to one another.

The second terminal of the p-channel transistor 507 is electrically connected to the first terminal of the n-channel transistor 501. The second terminal of the p-channel transistor 508 is electrically connected to the first terminal of the n-channel transistor 502.

The first terminal of the n-channel transistor 510 is electrically connected to the low-potential-side power supply potential line for supplying a low-potential-side power supply potential (VSS); and the second terminal of the n-channel transistor 510 is electrically connected to the first terminal of the n-channel transistor 509. The second terminal of the n-channel transistor 509 is electrically connected to a first terminal of the n-channel transistor 513.

The first terminal of the n-channel transistor 512 is electrically connected to the low-potential-side power supply potential line for supplying a low-potential-side power supply potential (VSS); and the second terminal of the n-channel transistor 512 is electrically connected to a first terminal of the n-channel transistor 511. The second terminal of the n-channel transistor 511 is electrically connected to a first terminal of the n-channel transistor 514.

The output terminal 13, the second terminal of the n-channel transistor 501, the second terminal of the n-channel transistor 502, a second terminal of the n-channel transistor 513, and a second terminal of the n-channel transistor 514 are electrically connected to one another.

Note that the gate of the n-channel transistor 501, the gate of the n-channel transistor 502, a gate of the n-channel transistor 513, and a gate of the n-channel transistor 514 have the same potential.

When the potentials φ of the gates of the n-channel transistors 501, 502, 513, and 514 are made high, the logic circuit 520 performs arithmetic processing in a manner similar to that in a conventional XOR circuit, like the logic circuit 500.

The following shows circuit operation when the power supply is OFF during the operation of the logic circuit 520. In a conventional XOR circuit, when the power supply is OFF during the circuit operation, a data during the arithmetic processing is volatilized.

In contrast, since the n-channel transistors 501, 502, 513, and 514 have extremely low off-state current, after the potentials φ of the gates of the n-channel transistors 501, 502, 513, and 514 are made low, even when the power supply is OFF, the logic circuit 520 can hold a potential of a node N_15 because the node N_15 can be brought into a floating state by making the potentials φ of the gates of the n-channel transistors 501, 502, 513, and 514 low. Note that the node N_15 is a portion denoted by a thick line including a portion indicated with "N_15" in FIG. 13. The potential can be held for a sufficiently long period without providing a capacitor at the retention node (node N_15); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 501, 502, 513, and 514 high, an input potential signal does not need to be supplied when the power supply is ON again, and the arithmetic processing can be started again immediately. Further, power consumption of the logic circuit 520 can be reduced.

The XOR circuit according to one embodiment of the invention can be configured by combining logic circuits according to embodiments of the invention as appropriate, and thus is not limited to the logic circuits 500 and 520.

In the logic circuits 500 and 520, the n-channel transistors 501, 502, 513, and 514 are transistors having extremely low off-state current, as described above. Each of the n-channel transistors 501, 502, 513, and 514 has off-current characteristics similar to those of any of the transistors 15 to 19 described in Embodiment 1, the n-channel transistor 51 described in Embodiment 2, and the n-channel transistor 54 described in Embodiment 2, for example. Further, each of the n-channel transistors 501, 502, 513, and 514 can be a transistor like any of the n-channel transistors 51 and 54, in which a channel formation region is formed using an oxide semiconductor where the concentration of hydrogen serving as a carrier donor is extremely reduced, in particular an oxide semiconductor having the above-described hydrogen concentration. Note that the carrier concentration in the oxide semiconductor is preferably similar to that in the n-channel transistors 51 and 54 described in Embodiment 2.

In the logic circuits 500 and 520, there is no particular limitation on the n-channel transistors 503, 504, 509, 510, 511 and 512 and the p-channel transistors 505, 506, 507, and 508 as long as a transistor is formed using a substrate including a semiconductor material.

As in the case of the n-channel transistors 501, 502, 513, and 514, by forming the channel formation regions of the n-channel transistors 503, 504, 509, 510, 511, and 512 using an oxide semiconductor where the concentration of hydrogen serving as a carrier donor is extremely reduced to the above hydrogen concentration, an effect of reducing the power consumption of the logic circuits 500 and 520 for performing arithmetic processing can be increased.

In terms of microfabrication, the XOR circuit according to one embodiment of the invention is preferably configured like the logic circuit 500 where transistors having extremely low off-state current are arranged such that the number of transistor elements is reduced as much as possible because the expansion of the area occupied by the transistors can be minimized. Further, in terms of high-speed operation of the circuit, the XOR circuit according to one embodiment of the invention is preferably configured like the logic circuit 520 where the potential of the node electrically connected to the output terminal 13 is held, i.e., the circuit where the potential obtained by arithmetic processing is held, because the arithmetic processing can be started again more immediately than in the logic circuit 500.

Furthermore, in the XOR circuits (the logic circuits 500 and 520) according to embodiments of the invention, the configuration other than the transistors having extremely low off-state current (the configuration corresponding to a conventional XOR circuit) is not limited to a CMOS circuit. For example, the p-channel transistors which are components of the circuit configuration may be replaced with n-channel enhancement transistors, as in the logic circuits 50 and 55. By applying the n-channel enhancement transistor in place of the p-channel transistor which is a component of the circuit configuration, the transistors in the logic circuits 500 and 520 can have the same conductivity type. Thus, the fabrication steps can be reduced, the yield of the logic circuits 500 and 520 can be increased, and the manufacturing cost can be reduced. The n-channel enhancement transistor may also be a transistor in which a channel formation region is formed using an oxide semiconductor having the above hydrogen concentration. Therefore, although the transistors in the logic circuit are only n-channel transistors, the logic circuits 500 and 520 can have lower power consumption.

In the above manner, by reducing the power consumption of the logic circuits 500 and 520, a semiconductor device including at least one of the logic circuit 500 and the logic circuit 520 can also have lower power consumption. Further, by reducing the power consumption of the logic circuits 500 and 520, an external circuit for operating the logic circuits 500 and 520 can have a lighter load. Thus, the functionality of a semiconductor device including at least one of the logic circuit 500 and the logic circuit 520 can be expanded.

Note that the contents of this embodiment or part thereof can be combined freely with the contents of other embodiments or part thereof.

Embodiment 8

This embodiment shows another example of the logic circuit described in Embodiment 1. Specifically, an XNOR circuit is described with reference to FIG. 14. Note that in some circuit diagrams, a circuit symbol using a dotted line and "OS" are shown together with a transistor in order to indicate that the transistor includes an oxide semiconductor. Further, for the logic circuits described in this embodiment, the reference numerals used in Embodiment 1 are used as appropriate.

[Configuration Example and Operation Example of the Logic Circuit]

Figure 14:
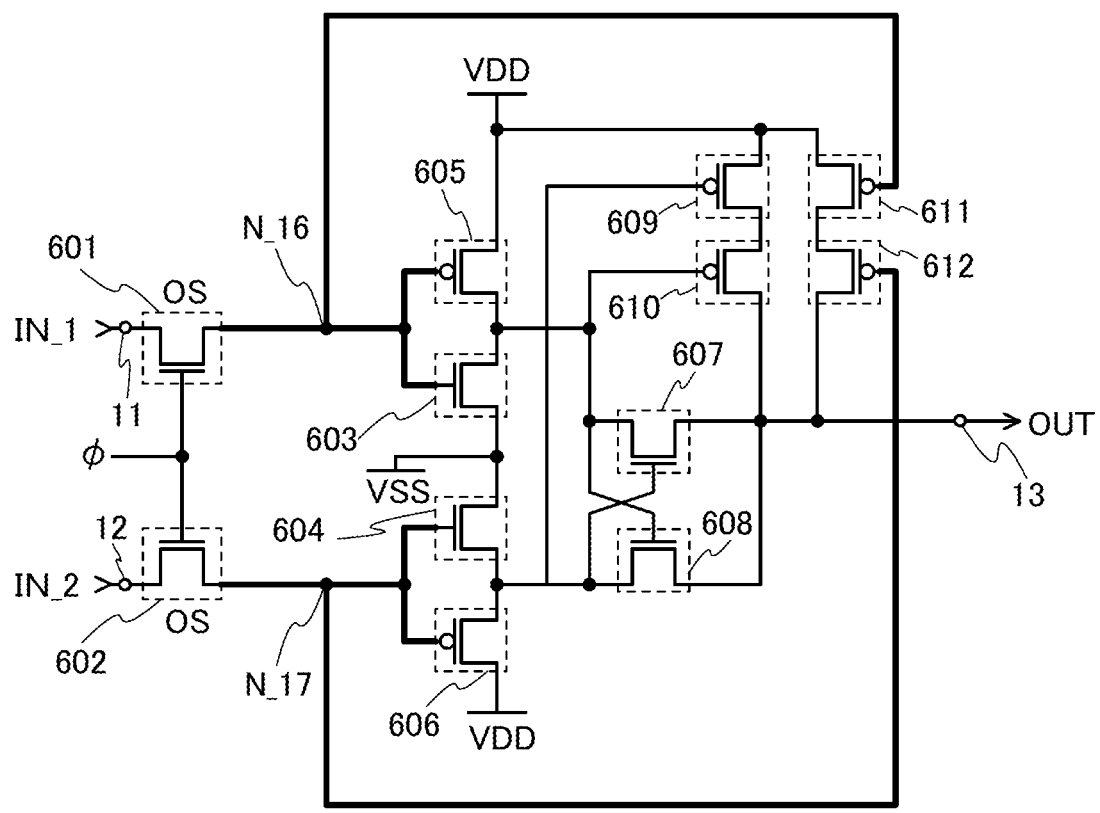
FIG. 14 is a circuit diagram illustrating a logic circuit according to one embodiment of the invention.

A logic circuit 600 illustrated in FIG. 14 is a logic circuit in which an n-channel transistor is additionally provided and electrically connected to an XNOR circuit. Although this embodiment shows a circuit in which the XNOR circuit is configured by a CMOS circuit that is suitable for microfabrication, the XNOR circuit may be configured to include a resistor, a diode, and the like. In FIG. 14, the XNOR circuit has two input terminals; one of them is denoted by the first input terminal 11, and the other is denoted by the second input terminal 12.

The logic circuit 600 includes an n-channel transistor 601, an n-channel transistor 602, an n-channel transistor 603, an n-channel transistor 604, an n-channel transistor 607, an n-channel transistor 608, a p-channel transistor 605, a p-channel transistor 606, a p-channel transistor 609, a p-channel transistor 610, a p-channel transistor 611, and a p-channel transistor 612. In particular, the n-channel transistors 601 and 602 have extremely low off-state current.

The transistors included in the logic circuit 600 have a connection relation as follows.

The first input terminal 11 is electrically connected to a first terminal of the n-channel transistor 601. The second input terminal 12 is electrically connected to a first terminal of the n-channel transistor 602.

A second terminal of the n-channel transistor 601, a gate of the p-channel transistor 605, a gate of the p-channel transistor 611, and a gate of the n-channel transistor 603 are electrically connected to one another; and a second terminal of the n-channel transistor 602, a gate of the p-channel transistor 606, a gate of the p-channel transistor 612, and a gate of the n-channel transistor 604 are electrically connected to one another.

A first terminal of the p-channel transistor 605, a first terminal of the p-channel transistor 606, and the high-potential-side power supply potential line for supplying a high-potential-side power supply potential (VDD) are electrically connected to one another.

A second terminal of the p-channel transistor 605 is electrically connected to a first terminal of the n-channel transistor 603. A second terminal of the p-channel transistor 606 is electrically connected to a first terminal of the n-channel transistor 604. A second terminal of the n-channel transistor 603, a second terminal of the n-channel transistor 604, and the low-potential-side power supply potential line for supplying a low-potential-side power supply potential (VSS) are electrically connected to one another.

The first terminal of the n-channel transistor 603, the second terminal of the p-channel transistor 605, a gate of the n-channel transistor 608, a first terminal of the n-channel transistor 607, and a gate of the p-channel transistor 610 are electrically connected to one another.

The first terminal of the n-channel transistor 604, the second terminal of the p-channel transistor 606, a gate of the n-channel transistor 607, a first terminal of the n-channel transistor 608, and a gate of the p-channel transistor 609 are electrically connected to one another.

A first terminal of the p-channel transistor 609, a first terminal of the p-channel transistor 611, and the high-potential-side power supply potential line for supplying a high-potential-side power supply potential (VDD) are electrically connected to one another. A second terminal of the p-channel transistor 609 is electrically connected to a first terminal of the p-channel transistor 610. A second terminal of the p-channel transistor 611 is electrically connected to a first terminal of the p-channel transistor 612.

The output terminal 13, a second terminal of the n-channel transistor 607, a second terminal of the n-channel transistor 608, a second terminal of the p-channel transistor 610, and a second terminal of the p-channel transistor 612 are electrically connected to one another.

Note that a gate of the n-channel transistor 601 and a gate of the n-channel transistor 602 have the same potential.

When the potentials φ of the gates of the n-channel transistors 601 and 602 are high (when the Vgs of the n-channel transistor 601 is higher than the threshold voltage thereof and the Vgs of the n-channel transistor 602 is higher than the threshold voltage thereof), the logic circuit 600 performs arithmetic processing in a manner similar to that in a conventional XNOR circuit. For example, when high-potential input potential signals are input to the first input terminal 11 and the second input terminal 12, a high potential, i.e., a high-potential-side power supply potential (VDD)

is output from the output terminal 13. Further, when a high-potential input potential signal is input to either the first input terminal 11 or the second input terminal 12 and a low-potential input potential signal is input to the other, a low potential, i.e., a low-potential-side power supply potential (VSS) is output from the output terminal 13. Furthermore, when low-potential input potential signals are input to the first input terminal 11 and the second input terminal 12, a high potential, i.e., a high-potential-side power supply potential (VDD) is output from the output terminal 13.

The following shows circuit operation when the power supply is OFF during the operation of the logic circuit 600. In a conventional XNOR circuit, when the power supply is OFF during the circuit operation, a potential difference between the high-potential-side power supply potential (VDD) and the low-potential-side power supply potential (VSS) is lost, so that a data during the arithmetic processing is volatilized.

In contrast, since the n-channel transistors 601 and 602 have extremely low off-state current, after the potentials φ of the gates of the n-channel transistors 601 and 602 are made low (after the Vgs of the n-channel transistor 601 becomes lower than the threshold voltage thereof and the Vgs of the n-channel transistor 602 is lower than the threshold voltage thereof), even when the power supply is OFF, the logic circuit 600 can hold potentials of a node N_16 and a node N_17 because the nodes N_16 and N_17 can be brought into floating states by making the potentials φ of the gates of the n-channel transistors 601 and 602 low. Note that the node N_16 is a portion denoted by a thick line including a portion indicated with "N_16" in FIG. 14, and the node N_17 is a portion denoted by a thick line including a portion indicated with "N_17" in FIG. 14. The potentials can be held for a sufficiently long period without providing capacitors at the retention nodes (nodes N_16 and N_17); however, when the holding period needs to be longer, capacitors may be provided in such a manner that one electrode of each of the capacitors is electrically connected to the corresponding retention node and the other electrode thereof is electrically connected to the low-potential-side power supply potential line.

Then, after the power supply is ON again, by making the potentials φ of the gates of the n-channel transistors 601 and 602 high, the arithmetic processing can be started again based on the potentials held in the nodes N_16 and N_17. Therefore, an input potential signal does not need to be supplied when the power supply is ON again, and the arithmetic processing can be started again immediately. Further, power consumption of the logic circuit 600 can be reduced.

Figure 15:
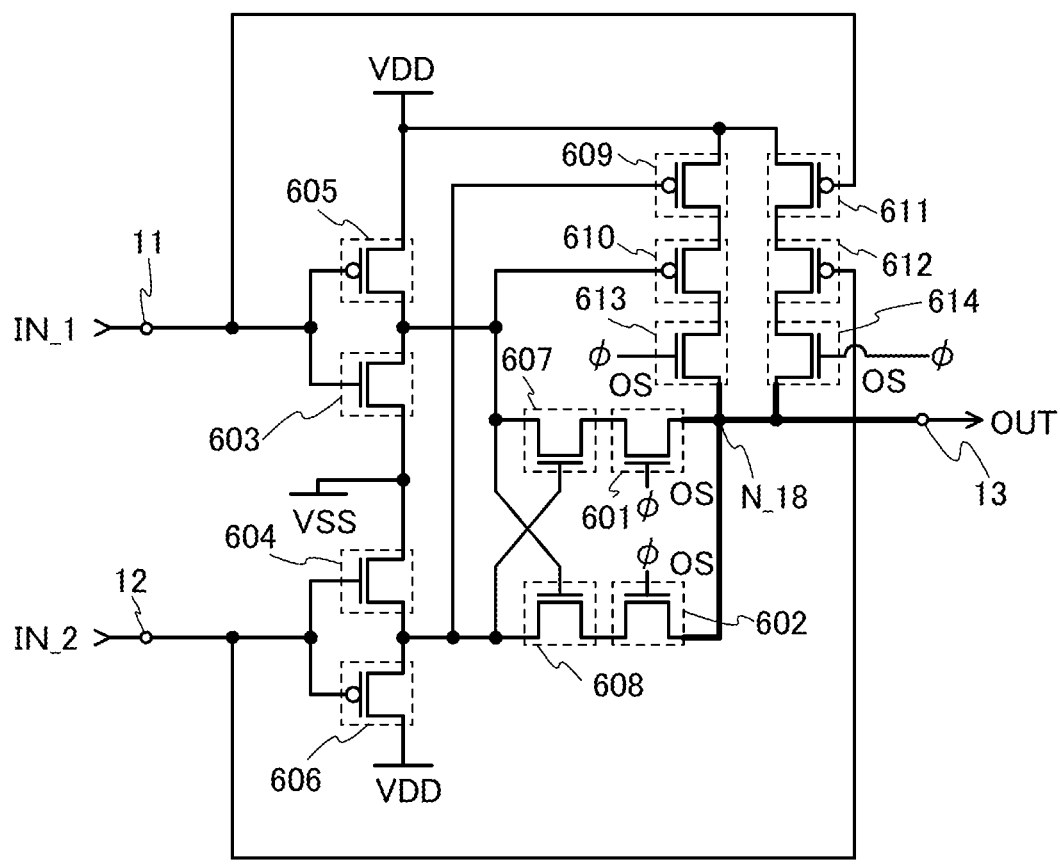
FIG. 15 is a circuit diagram illustrating a logic circuit according to one embodiment of the invention.

In this embodiment, the positions of the n-channel transistors 601 and 602 having extremely low off-state current are not limited to those in the logic circuit 600 as long as the n-channel transistors 601 and 602 are arranged in a current path (leakage path) for reducing an input potential to be held when the power supply is OFF. FIG. 15 illustrates another example of the logic circuit in which the positions of the transistors having extremely low off-state current are different from those in the logic circuits 600. FIG. 15 is a circuit diagram illustrating one of the examples, a logic circuit 620. Note that in the logic circuit 620, the reference numerals used in the logic circuit 600 in FIG. 14 are used as appropriate.

The logic circuit 620 includes the n-channel transistors 601, 602, 603, 604, 607, and 608, an n-channel transistor 613, an n-channel transistor 614, and the p-channel transistors 605, 606, 609, 610, 611, and 612. In particular, the n-channel transistors 601, 602, 613, and 614 have extremely low off-state current.

The transistors included in the logic circuit 620 have a connection relation as follows.

The first input terminal 11, the gate of the p-channel transistor 605, the gate of the p-channel transistor 611, and the gate of the n-channel transistor 603 are electrically connected to one another. The second input terminal 12, the gate of the p-channel transistor 606, the gate of the p-channel transistor 612, and the gate of the n-channel transistor 604 are electrically connected to one another.

The first terminal of the p-channel transistor 605, the first terminal of the p-channel transistor 606, and the high-potential-side power supply potential line for supplying a high-potential-side power supply potential (VDD) are electrically connected to one another. The second terminal of the p-channel transistor 605 is electrically connected to the first terminal of the n-channel transistor 603. The second terminal of the p-channel transistor 606 is electrically connected to the first terminal of the n-channel transistor 604. The second terminal of the n-channel transistor 603, the second terminal of the n-channel transistor 604, and the low-potential-side power supply potential line for supplying a low-potential-side power supply potential (VSS) are electrically connected to one another.

The first terminal of the n-channel transistor 603, the second terminal of the p-channel transistor 605, the gate of the n-channel transistor 608, the first terminal of the n-channel transistor 607, and the gate of the p-channel transistor 610 are electrically connected to one another.

The first terminal of the n-channel transistor 604, the second terminal of the p-channel transistor 606, the gate of the n-channel transistor 607, the gate of the p-channel transistor 609, and the first terminal of the n-channel transistor 608 are electrically connected to one another.

The second terminal of the n-channel transistor 607 is electrically connected to the first terminal of the n-channel transistor 601. The second terminal of the n-channel transistor 608 is electrically connected to the first terminal of the n-channel transistor 602.

The first terminal of the p-channel transistor 609 is electrically connected to the high-potential-side power supply potential line for supplying a high-potential-side power supply potential (VDD). The second terminal of the p-channel transistor 609 is electrically connected to the first terminal of the p-channel transistor 610. The second terminal of the p-channel transistor 610 is electrically connected to a first terminal of the n-channel transistor 613.

The first terminal of the p-channel transistor 611 is electrically connected to the high-potential-side power supply potential line for supplying a high-potential-side power supply potential (VDD). The second terminal of the p-channel transistor 611 is electrically connected to the first terminal of the p-channel transistor 612. The second terminal of the p-channel transistor 612 is electrically connected to a first terminal of the n-channel transistor 614.

The output terminal 13, the second terminal of the n-channel transistor 601, the second terminal of the n-channel transistor 602, the second terminal of the n-channel transistor 613, and a second terminal of the n-channel transistor 614 are electrically connected to one another.

Note that the gate of the n-channel transistor 601, the gate of the n-channel transistor 602, a gate of the n-channel transistor 613, and a gate of the n-channel transistor 614 have the same potential.

When the potentials φ of the gates of the n-channel transistors 601, 602, 613, and 614 are made high, the logic circuit 620 performs arithmetic processing in a manner similar to that in a conventional XNOR circuit, like the logic circuit 600.

The following shows circuit operation when the power supply is OFF during the operation of the logic circuit 620. In a conventional XNOR circuit, when the power supply is OFF during the circuit operation, a data during the arithmetic processing is volatilized.

In contrast, since the n-channel transistors 601, 602, 613, and 614 have extremely low off-state current, after the potentials φ of the gates of the n-channel transistors 601, 602, 613, and 614 are made low, even when the power supply is OFF, the logic circuit 620 can hold a potential of a node N_18 because the node N_18 can be brought into a floating state by making the potentials φ of the gates of the n-channel transistors 601, 602, 613, and 614 low. Note that the node N_18 is a portion denoted by a thick line including a portion indicated with "N_18" in FIG. 15. The potential can be held for a sufficiently long period without providing a capacitor at the retention node (node N_18); however, when the holding period needs to be longer, a capacitor may be provided in such a manner that one electrode of the capacitor is electrically connected to the retention node and the other electrode thereof is electrically connected to the low-potential-side power supply potential line.

Then, after the power supply is ON again, by making the potentials φ of the gates of the n-channel transistors 601, 602, 613, and 614 high, an input potential signal does not need to be supplied when the power supply is ON again, and the arithmetic processing can be started again immediately. Further, power consumption of the logic circuit 620 can be reduced.

The XNOR circuit according to one embodiment of the invention can be configured by combining logic circuits according to embodiments of the invention as appropriate, and thus is not limited to the logic circuits 600 and 620.

In the logic circuits 600 and 620, the n-channel transistors 601, 602, 613, and 614 are transistors having extremely low off-state current, as described above. Each of the n-channel transistors 601, 602, 613, and 614 has off-current characteristics similar to those of any of the transistors 15 to 19 described in Embodiment 1, the n-channel transistor 51 described in Embodiment 2, and the n-channel transistor 54 described in Embodiment 2, for example. Further, each of the n-channel transistors 601, 602, 613, and 614 can be a transistor like any of the n-channel transistors 51 and 54, in which a channel formation region is formed using an oxide semiconductor where the concentration of hydrogen serving as a carrier donor is extremely reduced, in particular an oxide semiconductor having the above-described hydrogen concentration. Note that the carrier concentration in the oxide semiconductor is preferably similar to that in the n-channel transistors 51 and 54 described in Embodiment 2.

In the logic circuits 600 and 620, there is no particular limitation on the n-channel transistors 603, 604, 607, and 608 and the p-channel transistors 605, 606, 609, 610, 611, and 612 as long as a transistor is formed using a substrate including a semiconductor material.

As in the case of the n-channel transistors 601, 602, 613, and 614, by forming the channel formation regions of the n-channel transistors 603, 604, 607, and 608 using an oxide semiconductor where the concentration of hydrogen serving as a carrier donor is extremely reduced to the above hydrogen concentration, an effect of reducing the power consumption of the logic circuits 600 and 620 for performing arithmetic processing can be increased.

In terms of microfabrication, the XNOR circuit according to one embodiment of the invention is preferably configured like the logic circuit 600 where transistors having extremely low off-state current are arranged such that the number of transistor elements is reduced as much as possible because the expansion of the area occupied by the transistors can be minimized. Further, in terms of high-speed operation of the circuit, the XNOR circuit according to one embodiment of the invention is preferably configured like the logic circuit 620 where the potential of the node electrically connected to the output terminal 13 is held, i.e., the circuit where the potential obtained by arithmetic processing is held, because the arithmetic processing can be started again more immediately than in the logic circuit 600.

Furthermore, in the XNOR circuits (the logic circuits 600 and 620) according to embodiments of the invention, the configuration other than the transistors having extremely low off-state current (the configuration corresponding to a conventional XNOR circuit) is not limited to a CMOS circuit. For example, the p-channel transistors which are components of the circuit configuration may be replaced with n-channel enhancement transistors, as in the logic circuits 50 and 55. By applying the n-channel enhancement transistor in place of the p-channel transistor which is a component of the circuit configuration, the transistors in the logic circuits 600 and 620 can have the same conductivity type. Thus, the fabrication steps can be reduced, the yield of the logic circuits 600 and 620 can be increased, and the manufacturing cost can be reduced. The n-channel enhancement transistor may also be a transistor in which a channel formation region is formed using an oxide semiconductor having the above hydrogen concentration. Therefore, although the transistors in the logic circuit are only n-channel transistors, the logic circuits 600 and 620 can have lower power consumption.

In the above manner, by reducing the power consumption of the logic circuits 600 and 620, a semiconductor device including at least one of the logic circuit 600 and the logic circuit 620 can also have lower power consumption. Further, by reducing the power consumption of the logic circuits 600 and 620, an external circuit for operating the logic circuits 600 and 620 can have a lighter load. Thus, the functionality of a semiconductor device including at least one of the logic circuit 600 and the logic circuit 620 can be expanded.

Note that the contents of this embodiment or part thereof can be combined freely with the contents of other embodiments or part thereof.

Embodiment 9

This embodiment shows a method of fabricating a transistor included in the logic circuit described in any of the above embodiments.

In the logic circuit described in any of the above embodiments, the p-channel and n-channel transistors included in the CMOS circuit are formed by a general method using a substrate including a semiconductor material. A transistor having extremely low off-state current (e.g., the n-channel transistor 51 in the logic circuit 50) can be obtained in the following manner: a p-channel transistor and an n-channel transistor are fabricated over a substrate including a semiconductor material and then a transistor including an oxide semiconductor in a channel formation region is fabricated over the p-channel and n-channel transistors. That is, the semiconductor substrate in which the p-channel and n-channel transistors are provided is used as a formation substrate and the transistor including an oxide semiconductor in a channel formation region is provided over the substrate, whereby the area occupied by the transistors in the logic circuit can be reduced; thus, microfabrication of the logic circuit can be achieved.

Figure 16:
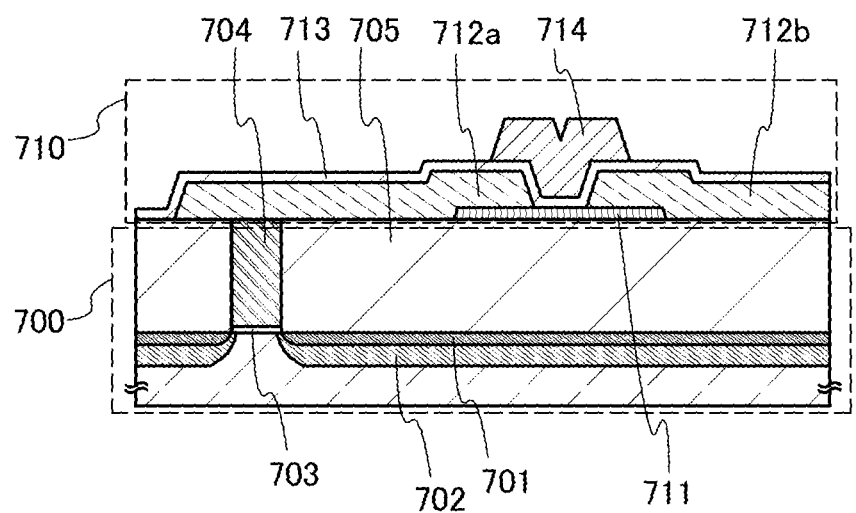
FIG. 16 is a cross-sectional view illustrating a transistor according to one embodiment of the invention.

Note that in this embodiment, one of the n-channel and p-channel transistors is formed in a semiconductor substrate for simplicity of the drawings. A semiconductor substrate 700 in which the p-channel or n-channel transistor is formed includes a high-concentration impurity region 701 serving as a source and a drain, a low-concentration impurity region 702, a gate insulating film 703, a gate electrode 704, and an interlayer insulating film 705 (see FIG. 16). Further, over the semiconductor substrate 700, a transistor 710 including an oxide semiconductor in a channel formation region is provided.

Figure 17A:
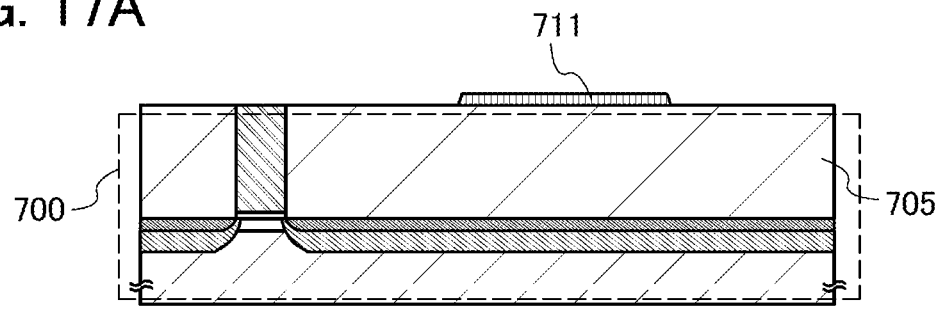
FIGS. 17A to 17D are cross-sectional views illustrating a method of fabricating a transistor according to one embodiment of the invention.
Figure 17B:
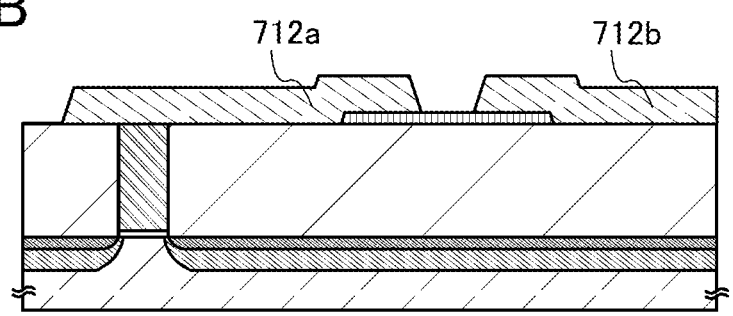
Figure 17C:
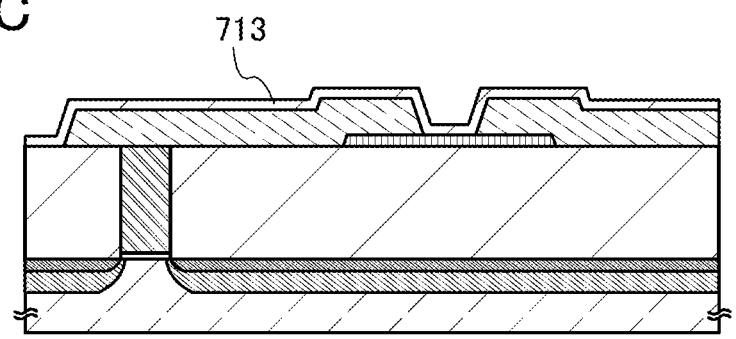
Figure 17D:
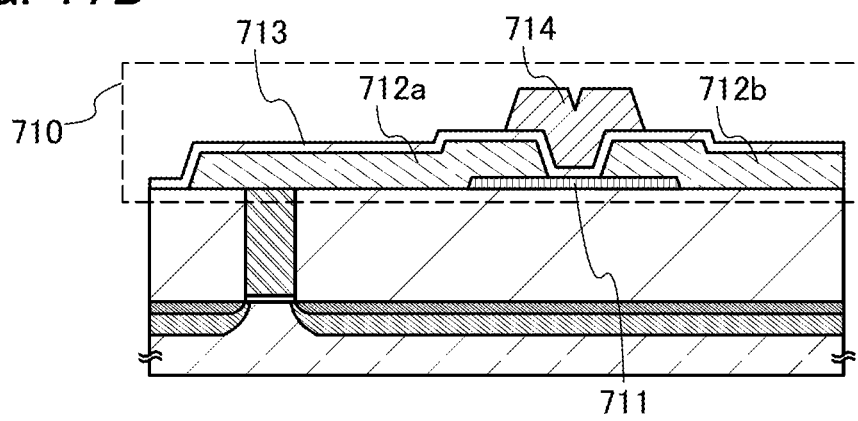

The transistor 710 includes an oxide semiconductor layer 711 formed over the semiconductor substrate 700 in which the p-channel or n-channel transistor is provided, a source electrode 712a and a drain electrode 712b which are formed separately from each other and in contact with the oxide semiconductor layer 711, a gate insulating film 713 formed over at least the channel formation region in the oxide semiconductor layer 711, and a gate electrode 714 formed over the gate insulating film 713 so as to overlap with the oxide semiconductor layer 711 (see FIG. 17D).

The interlayer insulating film 705 also serves as a base insulating film of the oxide semiconductor layer 711.

The interlayer insulating film 705 contains oxygen at least in its surface and is preferably formed using an insulating oxide in which part of the oxygen is desorbed by a heat treatment. As an insulating oxide from which part of oxygen is desorbed by a heat treatment, a material in which the oxygen proportion is higher than that in the stoichiometric composition ratio is preferably used. This is because oxygen can be supplied to the oxide semiconductor layer 711 in contact with the interlayer insulating film 705 by the heat treatment.

As the insulating oxide in which the oxygen proportion is higher than that in the stoichiometric composition ratio can be, for example, silicon oxide represented by $SiO_x$ (x>2). However, the interlayer insulating film 705 may be, without limitation, formed using silicon oxide, silicon oxynitride, silicon nitride oxide, aluminum oxide, aluminum oxynitride, gallium oxide, hafnium oxide, yttrium oxide, or the like.

Note that the interlayer insulating film 705 may be formed by a plurality of stacked films. For example, the interlayer insulating film 705 may have a stacked structure in which a silicon oxide film is formed over a silicon nitride film.

In an insulating oxide in which the oxygen proportion is higher than that in the stoichiometric composition ratio, part of the oxygen is easily desorbed by a heat treatment. The amount of desorbed oxygen (the value converted into that of oxygen atoms) obtained by TDS analysis when part of oxygen is easily desorbed by a heat treatment is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

Here, a method using the TDS analysis is described. The desorption amount of a gas in the TDS analysis is proportional to an integral value of a released gas. Thus, from the integral value of a TDS spectrum of an oxide to a reference value of a standard sample, the desorption amount of the gas can be calculated. The reference value of a standard sample refers to the ratio of the density of a predetermined atom contained in a sample (standard sample) to the integral value of a spectrum.

For example, from a TDS spectrum of a silicon wafer (standard sample) containing hydrogen at a predetermined density and a TDS spectrum of an oxide, the desorption amount ($N_{O2}$) of oxygen molecules ($O_2$) of the oxide can be obtained by the following formula.

$$N_{O2} = \frac{N_{H2}}{S_{H2}} \times S_{O2} \times \alpha \qquad \text{[Formula 1]}$$

$N_{H2}$ is a value obtained by conversion of the number of hydrogen molecules ($H_2$) desorbed from the standard sample into density. $S_{H2}$ is an integral value of a TDS spectrum of hydrogen molecules ($H_2$) of the standard sample. In other words, the reference value of the standard sample is $N_{H2}/S_{H2}$. $S_{O2}$ is an integral value of a TDS spectrum of oxygen molecules ($O_2$) of the insulating oxide. $\alpha$ is a coefficient affecting the intensity of the TDS spectrum. Refer to Japanese Published Patent Application No. H06-275697 for details of the formula 1.

Note that the desorption amount of the oxygen obtained by the TDS analysis (the value converted into that of oxygen atoms) is measured using a silicon wafer containing hydrogen atoms at $1 \times 10^{16}$ atoms/cm$^3$ as the standard sample, by using a thermal desorption spectrometer, EMD-WA1000S/W manufactured by ESCO, Ltd.

In the TDS analysis, oxygen is partly detected as an oxygen atom. The ratio between oxygen molecules and oxygen atoms can be calculated from the ionization rate of the oxygen molecules. Since the coefficient $\alpha$ includes the ionization rate of the oxygen molecules, the number of the released oxygen atoms can also be calculated through the evaluation of the number of the released oxygen molecules.

In addition, $N_{O2}$ is the amount of desorbed oxygen molecules ($O_2$). Therefore, the amount of desorbed oxygen converted into oxygen atoms is twice the number of desorbed oxygen molecules ($O_2$).

The interlayer insulating film 705 is formed by a sputtering method, a CVD method, or the like, preferably a sputtering method. When a silicon oxide film is formed as the interlayer insulating film 705, a quartz (preferably synthesized quartz) target is used as a target and an argon gas is used as a sputtering gas. Alternatively, a silicon target may be used as a target and a gas containing oxygen may be used as a sputtering gas. As the gas containing oxygen, a mixed gas of an argon gas and an oxygen gas may be used or only an oxygen gas may be used.

After the interlayer insulating film 705 is formed and before an oxide semiconductor film to be processed into the oxide semiconductor layer 711 is formed, a first heat treatment is performed. The first heat treatment is a step for removing water and hydrogen contained in the interlayer insulating film 705. Therefore, the temperature of the first heat treatment is preferably higher than or equal to a temperature at which water and hydrogen contained in the interlayer insulating film 705 is desorbed (temperature at which the amount of desorbed water and hydrogen has a peak) and lower than a temperature at which the semiconductor substrate 700 over which the p-channel or n-channel transistor is formed is changed in quality or deformed, for example, lower than the temperature of a second heat treatment performed later. In this specification, the temperature at which the semiconductor substrate 700 is changed in quality or deformed is referred to as strain point of the semiconductor substrate 700.

Then, after the oxide semiconductor film is formed, the second heat treatment is performed. The second heat treatment is a step for removing water and hydrogen from the oxide semiconductor film, which is mixed therein in formation of the oxide semiconductor film and further is a step for supplying oxygen to the oxide semiconductor film by using the interlayer insulating film 705 as a supply source of oxygen. The second heat treatment is preferably performed at higher than or equal to 200° C. and lower than the strain point of the semiconductor substrate 700, for example. However, the timing of the second heat treatment is not limited thereto, and may be after the oxide semiconductor film is processed into the oxide semiconductor layer 711. The concentration of hydrogen in the oxide semiconductor film is reduced in this manner, whereby the threshold voltage of the transistor can be prevented from shifting to the negative direction.

As the step for supplying oxygen to the oxide semiconductor film, an oxygen doping treatment may be performed by using oxygen plasma, an ion implantation method, or an ion doping method. By the oxygen doping treatment by an ion implantation method or an ion doping method, excessive oxygen can be contained in the oxide semiconductor film. By the second heat treatment or the oxygen doping treatment after the second heat treatment, variations in electrical characteristics of the transistor 710 to be fabricated can be reduced.

Note that it is preferable that in the second heat treatment, hydrogen, water, a hydroxyl group, hydride, and the like be not contained in a nitrogen gas or a rare gas such as a helium gas, a neon gas, or an argon gas. Alternatively, the purity of a nitrogen gas or a rare gas such as a helium gas, a neon gas, or an argon gas that is introduced into the heat treatment apparatus is preferably 6N (99.9999%) or higher, more preferably 7N (99.99999%) or higher (that is, the impurity concentration is 1 ppm or lower, preferably 0.1 ppm or lower).

Further, the oxide semiconductor film or the oxide semiconductor layer 711 might be crystallized to be a microcrystalline layer or a polycrystalline layer depending on conditions of the second heat treatment or a material of the oxide semiconductor film or the oxide semiconductor layer 711. For example, the oxide semiconductor film or the oxide semiconductor layer 711 may crystallize to become a microcrystalline semiconductor layer having a degree of crystallization of 90% or more, or 80% or more. Alternatively, the oxide semiconductor film or the oxide semiconductor layer 711 may become an amorphous oxide semiconductor layer containing no crystalline component depending on the conditions of the second heat treatment and the material of the oxide semiconductor film or the oxide semiconductor layer 711. Further alternatively, the oxide semiconductor film or the oxide semiconductor layer 711 may become an oxide semiconductor layer in which a microcrystalline portion (with a grain diameter of 1 nm to 20 nm, typically 2 nm to 4 nm) is mixed into an amorphous oxide semiconductor layer.

The average surface roughness (Ra) of the interlayer insulating film 705 which is a surface over which the oxide semiconductor film or the oxide semiconductor layer 711 is to be formed is preferably 1 nm or less, more preferably 0.3 nm or less in order to align the crystal orientation when the oxide semiconductor film is crystalline. By increasing the planarity of the interlayer insulating film 705 over which the oxide semiconductor film or the oxide semiconductor layer 711 is to be formed, the oxide semiconductor film or the oxide semiconductor layer 711 can have high surface planarity; thus, a transistor having higher field-effect mobility can be obtained.

Here, the average surface roughness ($R_a$) is obtained by expanding center line average surface roughness ($R_a$) which is defined by JIS B 0601:2001 (ISO 4287:1997) into three dimensions so as to be able to apply $R_a$ to a measurement surface. The average surface roughness ($R_a$) is expressed as an average value of the absolute values of deviations from a reference surface to a specific surface.

Here, the center line average roughness ($R_a$) is shown by the following formula (1) assuming that a portion having a measurement length L is picked up from a roughness curve in the direction of the center line of the roughness curve, the direction of a center line of the roughness curve of the picked portion is represented by an X-axis, the direction of longitudinal magnification (direction perpendicular to the X-axis) is represented by a Y-axis, and the roughness curve is expressed as Y=F(X).

[Formula 2]

$$R_a = \frac{1}{L}\int_0^L |F(X)| dX \quad (1)$$

When the measurement surface which is a surface represented by measurement data is expressed as Z=F(X,Y), the average surface roughness ($R_a$) is an average value of the absolute values of deviations from the reference surface to the specific surface and is shown by the following formula (2).

[Formula 3]

$$R_a = \frac{1}{S_0}\int_{Y_1}^{Y_2}\int_{X_1}^{X_2} |F(X, Y) - Z_0| dX dY \quad (2)$$

Here, the specific surface is a surface which is a target of roughness measurement, and is a rectangular region which is surrounded by four points represented by the coordinates $(X_1,Y_1)$, $(X_1,Y_2)$, $(X_2,Y_1)$, and $(X_2,Y_2)$. $S_0$ represents the area of the specific surface when the specific surface is flat ideally.

In addition, the reference surface refers to a surface parallel to an X-Y surface at the average height of the specific surface. In short, when the average value of the height of the specific surface is denoted by $Z_0$, the height of the reference surface is also denoted by $Z_0$.

The average surface roughness ($R_a$) can be measured using an atomic force microscope (AFM).

To make the average surface roughness of the interlayer insulating film 705 1 nm or less, preferably 0.3 nm or less, as described above, chemical mechanical polishing (CMP) treatment may be performed. The CMP treatment is performed before the oxide semiconductor film is formed, preferably before the first heat treatment.

Here, the CMP treatment is performed once or plural times. When the CMP treatment is performed plural times, first polishing is preferably performed with a high polishing rate followed by final polishing with a low polishing rate.

To planarize the interlayer insulating film 705, dry etching or the like may be performed instead of the CMP treatment.

Here, as the etching gas, a chlorine-based gas such as chlorine, boron chloride, silicon chloride, or carbon tetrachloride, a fluorine-based gas such as carbon tetrafluoride, sulfur fluoride, or nitrogen fluoride, or the like may be used.

To planarize the interlayer insulating film 705, a plasma treatment or the like may be performed instead of the CMP treatment. A rare gas may be used in the plasma treatment. By the plasma treatment, ions of an inert gas are sputtered onto a process surface so as to planarize minute unevenness on the process surface by the sputtering effect. Such a plasma treatment is also called reverse sputtering.

One or more of the above treatments may be performed in order to planarize the interlayer insulating film 705. For example, only the reverse sputtering may be performed, or the CMP treatment and then the dry etching may be performed. Note that it is preferable to perform the dry etching or the reverse sputtering in order to prevent the entrance of water into the interlayer insulating film 705 over which the oxide semiconductor film is to be formed. In particular, when a planarization treatment is performed after the second heat treatment, the dry etching or the reverse sputtering is preferably performed.

The oxide semiconductor layer 711 may be selectively formed, for example, in such a manner that an oxide semiconductor film is formed, an etching mask is formed thereover, and then etching is performed. Alternatively, an inkjet method or the like may be used.

For the oxide semiconductor film, it is possible to use a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide. Alternatively, it is possible to use a three-component metal oxide such as an In—Ga—Zn-based metal oxide (also referred to as IGZO), an In—Al—Zn-based metal oxide, an In—Sn—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, an In—Lu—Zn-based metal oxide, or a Sn—Ga—Zn-based metal oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide; indium oxide; tin oxide; zinc oxide; or the like. Note that an n-component metal oxide includes n kinds of metal oxides. For example, an In—Ga—Zn-based metal oxide means an oxide containing indium (In), gallium (Ga), and zinc (Zn), and there is no particular limitation on the composition ratio thereof. The In—Ga—Zn-based metal oxide may contain an element other than In, Ga, and Zn.

For example, it is possible to use an In—Ga—Zn-based metal oxide with an atomic ratio of In:Ga:Zn=1:1:1 (=1/3:1/3:1/3) or In:Ga:Zn=2:2:1 (=2/5:2/5:1/5), or any of metal oxides whose composition is in the neighborhood of the above compositions. Alternatively, it is possible to use an In—Sn—Zn-based metal oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of metal oxides whose composition is in the neighborhood of the above compositions.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, the expression "an In—Ga—Zn-based metal oxide with an atomic composition of In:Ga:Zn=a:b:c (a+b+c=1) which is in the r-neighborhood of an In—Ga—Zn-based metal oxide with an atomic ratio of In:Ga:Zn=A:B:C (A+B+C=1)" means that a, b, and c satisfy the following relation: $(a-A)^2+(b-B)^2+(c-C)^2 \leq r^2$, and r may be 0.05, for example. This relation is satisfied with the other metal oxides.

Note that it is preferable that excessive oxygen be contained in the metal oxide compared with oxygen in the stoichiometric composition ratio. Excessive oxygen prevents generation of carriers due to oxygen vacancies in the oxide semiconductor film to be formed.

Note that the energy gap of a metal oxide which can be applied to the oxide semiconductor film is preferably 2 eV or more, more preferably 2.5 eV or more, still more preferably 3 eV or more. In this manner, the off-state current of a transistor can be reduced by using a metal oxide having a wide band gap.

Note that the oxide semiconductor film contains hydrogen. Note that the hydrogen may be contained in the oxide semiconductor film in the form of a hydrogen molecule, water, a hydroxyl group, or hydride in some cases, in addition to a hydrogen atom. It is preferable that hydrogen contained in the oxide semiconductor film be as little as possible.

Note that the concentrations of an alkali metal and an alkaline earth metal in the oxide semiconductor film are preferably low, and these concentrations are preferably $1 \times 10^{18}$ atoms/cm$^3$ or lower, more preferably $2 \times 10^{16}$ atoms/cm$^3$ or lower. When an alkali metal and an alkaline earth metal are bonded to an oxide semiconductor, carriers may be generated, which causes increase in the off-state current of the transistor.

Note that there is no particular limitation on the formation method and the thickness of the oxide semiconductor film, and they can be determined in consideration of the size or the like of a transistor to be fabricated. The formation method of the oxide semiconductor film may be, for example, a sputtering method, a coating method, a printing method, a molecular beam epitaxy method, a pulsed laser deposition method, or the like. The thickness of the oxide semiconductor film is preferably 3 nm to 50 nm. This is because an oxide semiconductor film with a thickness of 50 nm or more may cause normally-on electrical characteristics of the transistor to be fabricated. Further, when the channel length of the transistor is 30 μm, the thickness of the oxide semiconductor film is set to 5 nm or less so as to prevent variations in the threshold voltage of the transistor due to the short channel length.

For example, in the case where the oxide semiconductor film is formed using an In—Zn-based metal oxide by a sputtering method, a target has a composition ratio where In/Zn is 1 to 100, preferably 1 to 20, more preferably 1 to 10 in an atomic ratio. The atomic ratio of Zn is in the above preferred range, whereby the field-effect mobility can be improved. Here, when the atomic ratio of the compound is In:Zn:O=X:Y:Z, it is preferable to satisfy the relation of Z>1.5X+Y so that excessive oxygen is contained.

In the case where the oxide semiconductor film is formed using an In—Sn—Zn-based metal oxide by a sputtering method, a target has a composition ratio of In:Sn:Zn=1:2:2, 2:1:3, 1:1:1, 20:45:35, or the like in an atomic ratio. It is preferable that the In—Sn—Zn-based metal oxide also contain excessive oxygen.

In this embodiment, as a preferable example, the oxide semiconductor film is formed by a sputtering method using an In—Ga—Zn-based metal oxide target. A rare gas (for example, argon), an oxygen gas, or a mixed gas of a rare gas and an oxygen gas may be used as a sputtering gas.

Examples of the In—Ga—Zn-based metal oxide target include a target having a composition ratio of $In_2O_3:Ga_2O_3:ZnO=1:1:1$ [molar ratio], a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], and a target having a composition ratio of $In_2O_3:Ga_2O_3:ZnO=2:1:8$ [molar ratio].

A high-purity gas in which hydrogen, water, a hydroxyl group, hydride, or the like is removed is preferably used as the sputtering gas for the formation of the oxide semiconductor film. To make the sputtering gas a high-purity gas, a gas attached to an inner wall or the like of a treatment chamber is removed and the semiconductor substrate 700 over which the p-channel or n-channel transistor is formed is subjected to a heat treatment before the oxide semiconductor film is formed. Alternatively, a sputtering gas introduced to the treatment chamber is a high-purity gas. In that case, the purity of an argon gas is 9N (99.9999999%) or higher, the dew point is −121° C., and the concentrations of water and hydrogen are 0.1 ppb and 0.5 ppb, respectively. The purity of an oxygen gas is 8N (99.999999%) or higher, the dew point is −112° C., and the concentrations of water and hydrogen are each 1 ppb. The oxide semiconductor film is formed in a state where the semiconductor substrate 700 over which the p-channel or n-channel transistor is formed is kept at high temperature, whereby the impurity concentration in the oxide semiconductor film can be reduced. Here, the temperature of the semiconductor substrate 700 over which the p-channel or n-channel transistor is formed is higher than or equal to 100° C. and lower than or equal to 600° C., preferably higher than or equal to 200° C. and lower than or equal to 490° C.

Note that the oxide semiconductor film may have a single crystal structure or a non-single-crystal structure. The non-single-crystal structure means any of an amorphous structure, an amorphous structure partly including a crystalline portion, a polycrystalline structure, a microcrystalline structure, and the like.

In the case of an oxide semiconductor film having an amorphous structure, a planar surface can be obtained relatively easily, so that when a transistor is fabricated by using this oxide semiconductor film, interface scattering can be reduced, and relatively high field-effect mobility can be obtained relatively easily.

With the use of an oxide semiconductor film having a crystalline structure (i.e., a single crystalline structure, an amorphous structure partly including a crystalline portion, a polycrystalline structure, and a microcrystalline structure), defects in a bulk can be further reduced, and when the planarity of a surface of the oxide semiconductor film is increased, higher mobility than that using the oxide semiconductor film having the amorphous structure can be obtained. To increase the planarity of the surface, the oxide semiconductor film is preferably formed over a planar surface (in this embodiment, the interlayer insulating film 705) having an average surface roughness ($R_a$) of 1 nm or less, more preferably 0.3 nm or less, as described above.

In the case where the oxide semiconductor film has a crystalline structure, a c-axis aligned crystalline oxide semiconductor (CAAC-OS) film is preferably used. When the oxide semiconductor film is a CAAC-OS film, the reliability of the transistor can be increased.

Note that a CAAC-OS film means an oxide semiconductor film including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis varies in the a-b plane (or the surface, or at the interface) (the crystal rotates around the c-axis).

In a broad sense, the CAAC-OS film means a non-single-crystal oxide semiconductor film including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis.

The CAAC-OS film is not a single crystal, but this does not mean that the CAAC-OS film is composed of only an amorphous component. Although the CAAC-OS film includes a crystal portion, a boundary between one crystal portion and another crystal portion is not clear in some cases.

Nitrogen may be substituted for part of oxygen included in the CAAC-OS film. The c-axes of individual crystal portions included in the CAAC-OS film may be aligned in one direction (e.g., a direction perpendicular to a surface of a substrate over which the CAAC-OS film is formed, or a surface, a film surface, or an interface of the CAAC-OS film). Alternatively, normals to the a-b planes of individual crystal portions included in the CAAC-OS film may be aligned in one direction (e.g., a direction perpendicular to the surface of the substrate, or the surface, the film surface, or the interface of the CAAC-OS film).

The CAAC-OS film may be a conductor, a semiconductor, or an insulator depending on its composition or the like. Further, the CAAC-OS film may transmit or not transmit visible light depending on its composition or the like.

As an example of such a CAAC-OS film, there is a material which is formed into a film shape and has a triangular or hexagonal atomic arrangement when observed from the direction perpendicular to a surface of the film or, a surface of a substrate, or an interface and in which metal atoms are arranged in a layered manner or metal atoms and oxygen atoms (or nitrogen atoms) are arranged in a layered manner when a cross section of the film is observed.

A crystal structure of the CAAC-OS film is described in detail. In the description below, in principle, the upward direction corresponds to the c-axis direction and a plane perpendicular to the c-axis direction corresponds to the a-b plane in FIGS. 18A to 18E, FIGS. 19A to 19C, and FIGS. 20A to 20C. When the expressions "an upper half" and "a lower half" are simply used, they refer to an upper half above the a-b plane and a lower half below the a-b plane. Furthermore, in FIGS. 18A to 18E, O surrounded by a circle represents a tetracoordinate O atom, and O surrounded by a double circle represents a tricoordinate O atom.

Figure 18A:
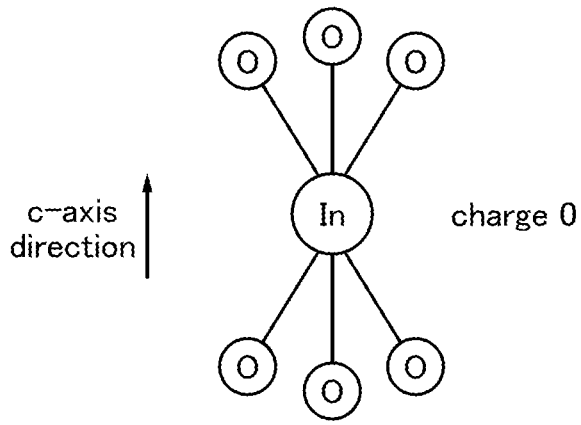
FIGS. 18A to 18E are diagrams illustrating structures of oxide materials according to one embodiment of the invention.

FIG. 18A illustrates a structure including one hexacoordinate indium (hereinafter referred to as In) atom and six tetracoordinate oxygen (hereinafter referred to as tetracoordinate O) atoms proximate to the In atom. Here, a structure including one metal atom and oxygen atoms proximate thereto is referred to as small group. The structure in FIG. 18A is actually an octahedral structure, but is illustrated as a planar structure for simplicity. Note that three tetracoordinate O atoms exist in each of an upper half and a lower half in FIG. 18A. In the small group illustrated in FIG. 18A, electric charge is 0.

Figure 18D:
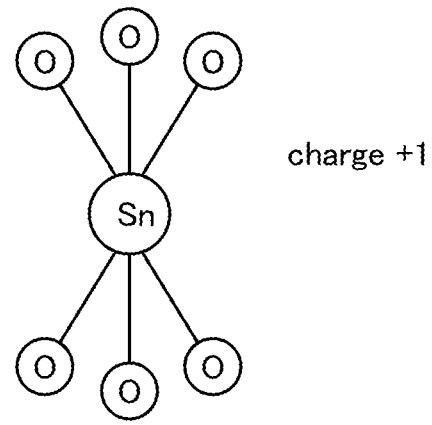
Figure 18B:
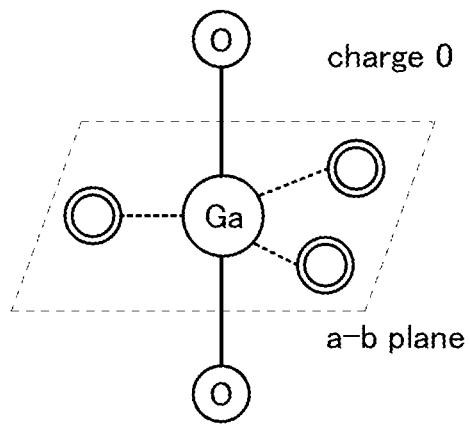

FIG. 18B illustrates a structure including one pentacoordinate gallium (hereinafter referred to as Ga) atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 18B. An In atom can also have the structure illustrated in FIG. 18B because an In atom can have five ligands. In the small group illustrated in FIG. 18B, electric charge is 0.

Figure 18E:
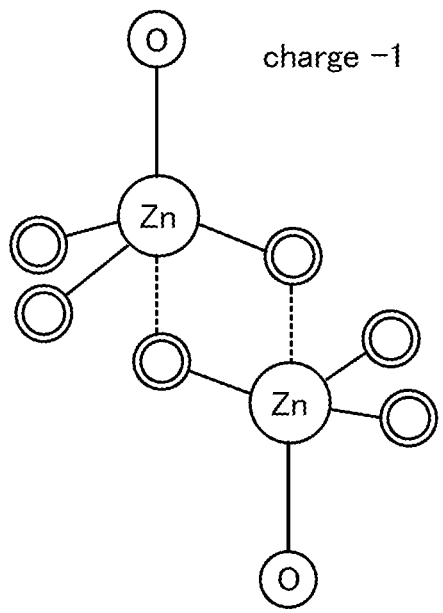
Figure 18C:
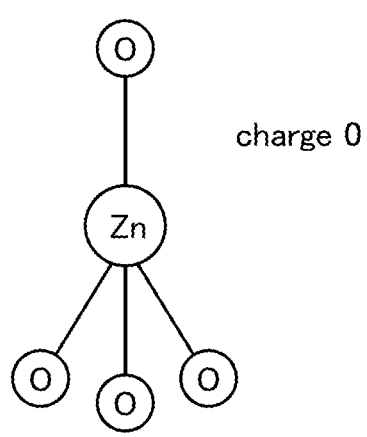

FIG. 18C illustrates a structure including one tetracoordinate zinc (hereinafter referred to as Zn) atom and four tetracoordinate O atoms proximate to the Zn atom. In FIG. 18C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 18C. In the small group illustrated in FIG. 18C, electric charge is 0.

FIG. 18D illustrates a structure including one hexacoordinate Sn atom and six tetracoordinate O atoms proximate to the Sn atom. In FIG. 18D, three tetracoordinate O atoms exist in each of an upper half and a lower half. In the small group illustrated in FIG. 18D, electric charge is +1.

FIG. 18E illustrates a small group including two Zn atoms. In FIG. 18E, one tetracoordinate O atom exists in each of an upper half and a lower half. In the small group illustrated in FIG. 18E, electric charge is −1.

Here, a plurality of small groups form a medium group, and a plurality of medium groups form a large group (also referred to as unit cell).

Now, a rule of bonding between the small groups is described. The three O atoms in the upper half with respect to the hexacoordinate In atom in FIG. 18A each have three proximate In atoms in the downward direction, and the three O atoms in the lower half each have three proximate In atoms in the upward direction. The one O atom in the upper half with respect to the pentacoordinate Ga atom in FIG. 18B has one proximate Ga atom in the downward direction, and the one O atom in the lower half has one proximate Ga atom in the upward direction. The one O atom in the upper half with respect to the tetracoordinate Zn atom in FIG. 18C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the total number of the proximate metal atoms below and above the O atom is 4. Accordingly, when the total number of tetracoordinate O atoms above a metal atom and below another metal atom is 4, the two kinds of small groups including the metal atoms can be bonded to each other. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 19A illustrates a model of a medium group included in a layered structure of an In—Sn—Zn—O-based material. FIG. 19B illustrates a large group including three medium groups. Note that FIG. 19C illustrates an atomic arrangement in the case where the layered structure in FIG. 19B is observed from the c-axis direction.

In FIG. 19A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 19A, one tetracoordinate O atom existing in each of an upper half and a lower half with respect to an In atom is denoted by circled 1. FIG. 19A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 19A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 18E can be given. For example, with one small group including two Zn atoms, electric charge of one small group including a Sn atom can be cancelled, so that the total electric charge of the layered structure can be 0.

An In atom can have either 5 ligands or 6 ligands. Specifically, when the large group illustrated in FIG. 19B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: the above-described four-component metal oxides, three-component metal oxides, or two-component metal oxides.

Figures 20A, 20B, 20C:
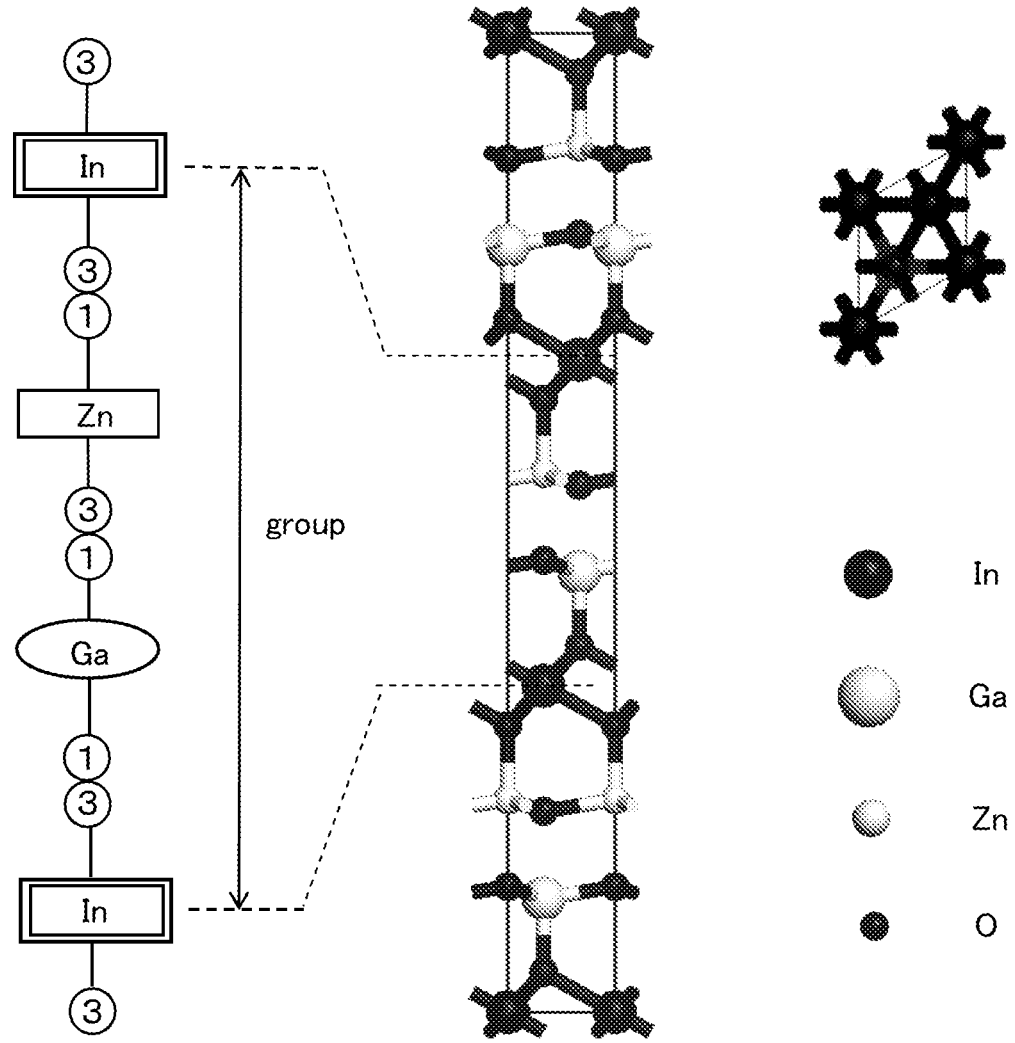
FIGS. 20A to 20C are diagrams illustrating the structure of an oxide material according to one embodiment of the invention.

As an example, FIG. 20A illustrates a model of a medium group included in a layered structure of an In—Ga—Zn—O-based material.

In the medium group included in the layered structure of the In—Ga—Zn—O-based material in FIG. 20A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 20B illustrates a large group including three medium groups. Note that FIG. 20C illustrates an atomic arrangement in the case where the layered structure in FIG. 20B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 20A but also a medium group in which the arrangement of the In atom, the Ga atom, and the Zn atom is different from that in FIG. 20A.

The actually measured field-effect mobility of an insulated gate transistor which can be used for a transistor included in a logic circuit according to one embodiment of the invention can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the field-effect mobility $\mu$ can be expressed as the following formula (3). Here, E represents the height of the potential barrier, k represents the Boltzmann constant, and T represents the absolute temperature.

[Formula 4]

$$\mu = \mu_0 \exp\left(-\frac{E}{kT}\right) \quad (3)$$

When the potential barrier is assumed to be attributed to a defect, the height of the potential barrier E can be expressed as the following formula (4) according to the Levinson model.

[Formula 5]

$$E = \frac{e^2 N^2}{8\varepsilon n} = \frac{e^3 N^2 t}{8\varepsilon C_{ox} V_g} \quad (4)$$

Here, e represents the elementary charge, N represents the average defect density per unit area in a channel, $\varepsilon$ represents the permittivity of the semiconductor, n represents carrier surface density of the channel, $C_{ox}$ represents the capacitance per unit area, $V_g$ represents the gate voltage, and t represents the thickness of the channel.

In the case where the thickness of the semiconductor layer used in the insulated gate transistor is less than or equal to 30 nm, the thickness of the channel formation region may be regarded as being the same as the thickness of the semiconductor layer. The drain current $I_d$ in a linear region can be expressed as the following formula (5).

[Formula 6]

$$I_d = \frac{W \mu V_g V_d C_{ox}}{L} \exp\left(-\frac{E}{kT}\right) \quad (5)$$

Here, L represents the channel length and W represents the channel width, and L and W are each 10 μm. In addition, $V_d$ represents the drain voltage. When dividing both sides of the above equation by $V_g$ and then taking logarithms of both sides, the following formula (6) can be obtained.

[Formula 7]

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad (6)$$

The right side of the formula (6) is a function of $V_g$. From the formula (6), it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 $cm^2/V \cdot s$ from the formulas (3) and (4). The measured mobility of an In—Sn—Zn oxide including a defect is approximately 40 $cm^2/V \cdot s$. However, assuming that no defect exists inside the semiconductor and at the interface between the semiconductor and an insulating film, the mobility $\mu_0$ of the oxide semiconductor is expected to be 120 $cm^2/V \cdot s$.

Note that even when no defect exists inside an oxide semiconductor film, scattering at an interface between a channel formation region and a gate insulating film affects the transport property of the transistor. In other words, mobility $\mu_1$ at a position that is away by distance x from the interface between the channel formation region and the gate insulating film can be expressed as the following formula (7).

[Formula 8]

$$\frac{1}{\mu_1} = \frac{1}{\mu_0} + \frac{D}{B}\exp\left(-\frac{x}{l}\right) \quad (7)$$

Here, D represents the electric field in the gate direction, and B and l are constants. B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of the formula (7) is increased and accordingly the mobility $\mu_1$ is decreased.

Figure 21:
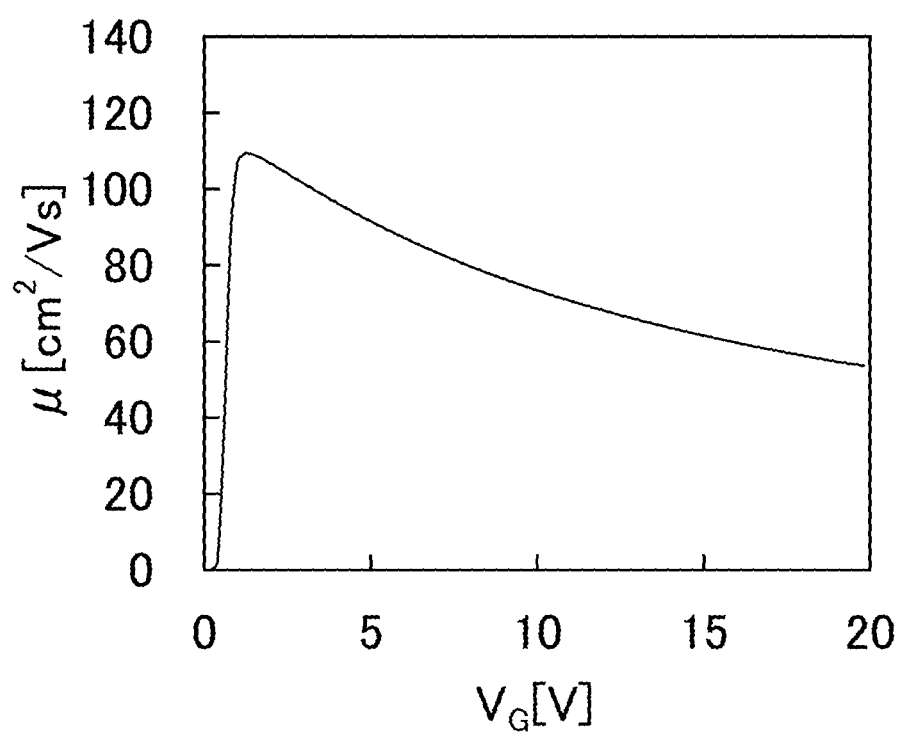
FIG. 21 is a graph showing results of calculation of a gate voltage dependence of field-effect mobility in a transistor including an oxide semiconductor.

Calculation results of the mobility $\mu_2$ of a transistor whose channel formation region includes an ideal oxide semiconductor without a defect inside the semiconductor are shown in FIG. 21. For the calculation, device simulation software Sentaurus Device manufactured by Synopsys, Inc. was used, and the bandgap, the electron affinity, the relative permittivity, and the thickness of the oxide semiconductor were assumed to be 3.1 eV, 4.6 eV, 15, and 30 nm, respectively. These values were obtained by measurement of a thin film that was formed by a sputtering method. Further, the work functions of a gate electrode, a source electrode, and a drain electrode were assumed to be 5.5 eV, 4.6 eV, and 4.6 eV, respectively. The thickness of a gate insulating film was assumed to be 30 nm, and the relative permittivity thereof was assumed to be 4.1. The channel length and the channel width were each assumed to be 10 μm, and the drain voltage $V_d$ was assumed to be 0.1 V.

As shown in FIG. 21, the field-effect mobility has a peak of more than 100 cm$^2$/V·s at a gate voltage that is a little over 1 V and is decreased as the gate voltage becomes higher because the influence of interface scattering is increased. Note that in order to reduce interface scattering, it is desirable that a surface of the oxide semiconductor layer be flat at the atomic level (atomic layer flatness).

Calculation results of electrical characteristics of minute transistors which are fabricated using an oxide semiconductor having such a mobility are shown in FIGS. 22A to 22C, FIGS. 23A to 23C, and FIGS. 24A to 24C. FIGS. 25A and 25B illustrate cross-sectional structures of the transistors used for the calculation. The transistors illustrated in FIGS. 25A and 25B each include a semiconductor region 1030a and a semiconductor region 1030c which have n$^+$-type conductivity in an oxide semiconductor layer. The resistivities of the semiconductor region 1030a and the semiconductor region 1030c are $2\times10^{-3}$ Ωcm.

The transistor illustrated in FIG. 25A is formed over a base insulator 1010 and an embedded insulator 1020 which is embedded in the base insulator 1010 and formed of aluminum oxide. The transistor includes the semiconductor region 1030a, the semiconductor region 1030c, an intrinsic semiconductor region 1030b serving as a channel formation region therebetween, and a gate 1050. The width of the gate 1050 is 33 nm.

A gate insulator 1040 is formed between the gate 1050 and the semiconductor region 1030b. In addition, a sidewall insulator 1060a and a sidewall insulator 1060b are formed on both side surfaces of the gate 1050, and an insulator 1070 is formed over the gate 1050 so as to prevent a short circuit between the gate 1050 and another wiring. The sidewall insulator has a width of 5 nm. A source 1080a and a drain 1080b are provided in contact with the semiconductor region 1030a and the semiconductor region 1030c, respectively. Note that the channel width of this transistor is 40 nm.

The transistor of FIG. 25B is the same as the transistor of FIG. 25A in that it is formed over the base insulator 1010 and the embedded insulator 1020 formed of aluminum oxide and that it includes the semiconductor region 1030a, the semiconductor region 1030c, the intrinsic semiconductor region 1030b provided therebetween, the gate 1050 having a width of 33 nm, the gate insulator 1040, the sidewall insulator 1060a, the sidewall insulator 1060b, the insulator 1070, the source 1080a, and the drain 1080b.

The transistor illustrated in FIG. 25A is different from the transistor illustrated in FIG. 25B in the conductivity type of semiconductor regions under the sidewall insulator 1060a and the sidewall insulator 1060b. In the transistor illustrated in FIG. 25A, the semiconductor regions under the sidewall insulator 1060a and the sidewall insulator 1060b are part of the semiconductor region 1030a having n$^+$-type conductivity and part of the semiconductor region 1030c having n$^+$-type conductivity, whereas in the transistor illustrated in FIG. 25B, the semiconductor regions under the sidewall insulator 1060a and the sidewall insulator 1060b are part of the intrinsic semiconductor region 1030b. In other words, in the semiconductor layer of FIG. 25B, a region having a width of $L_{off}$ which overlaps with neither the semiconductor region 1030a (the semiconductor region 1030c) nor the gate 1050 is provided. This region is called offset region, and the width $L_{off}$ is called offset length. As is seen from the drawing, the offset length is equal to the width of the sidewall insulator 1060a (the sidewall insulator 1060b).

Figure 22A:
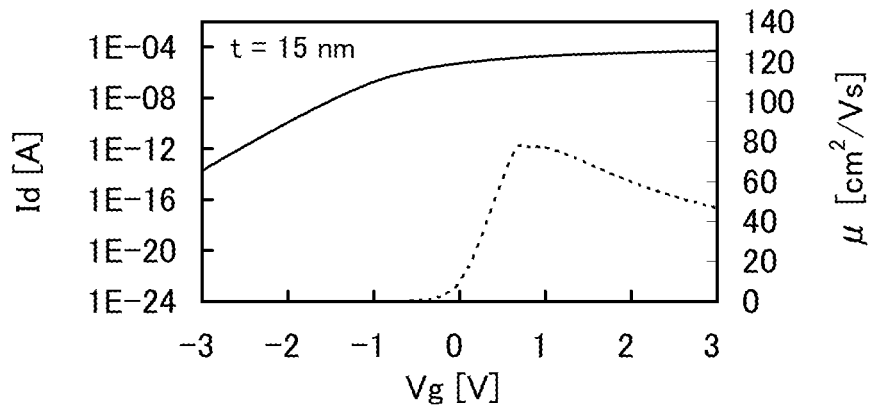
FIGS. 22A to 22C are graphs each showing results of calculation of a gate voltage dependence of drain current and mobility in a transistor including an oxide semiconductor.
Figure 22B:
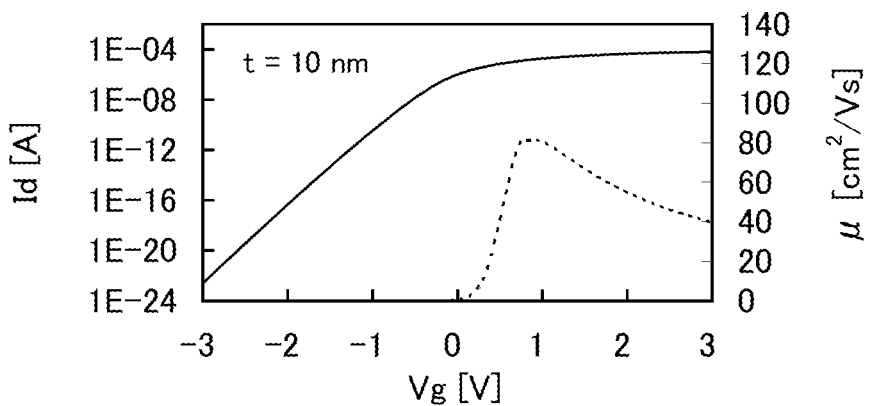
Figure 22C:
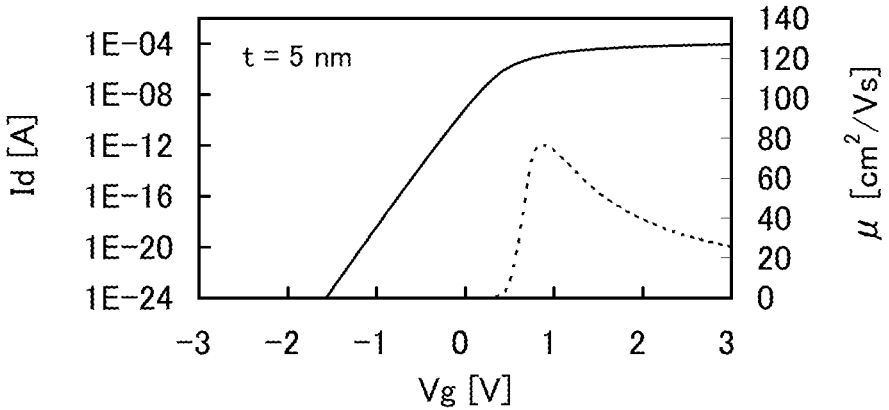

The other parameters used in calculation are as described above. For the calculation, the same device simulation software manufactured by Synopsys, Inc. was used. FIGS. 22A to 22C show the gate voltage $V_g$ (potential difference between the gate and the source) dependence of the drain current $I_d$ (solid line) and the mobility μ (dotted line) of the transistor having the structure illustrated in FIG. 25A. The drain current $I_d$ is obtained by calculation under the assumption that the drain voltage (potential difference between the drain and the source) is +1 V and the mobility μ is obtained by calculation under the assumption that the drain voltage is +0.1 V.

FIG. 22A shows the gate voltage $V_g$ dependence of the drain current $I_d$ and the mobility μ of the transistor in the case where the thickness of the gate insulator is 15 nm, FIG. 22B shows that of the transistor in the case where the thickness of the gate insulator is 10 nm, and FIG. 22C shows that of the transistor in the case where the thickness of the gate insulator is 5 nm. As the gate insulator is thinner, in particular, the drain current $I_d$ in an off state (off-state current) is significantly decreased. In contrast, there is no noticeable change in the peak value of the mobility μ and the drain current $I_d$ in an on state (on current). The graphs show that the drain current exceeds 10 μA, which is required in a memory element and the like, at a gate voltage of around 1 V.

Figure 23A:
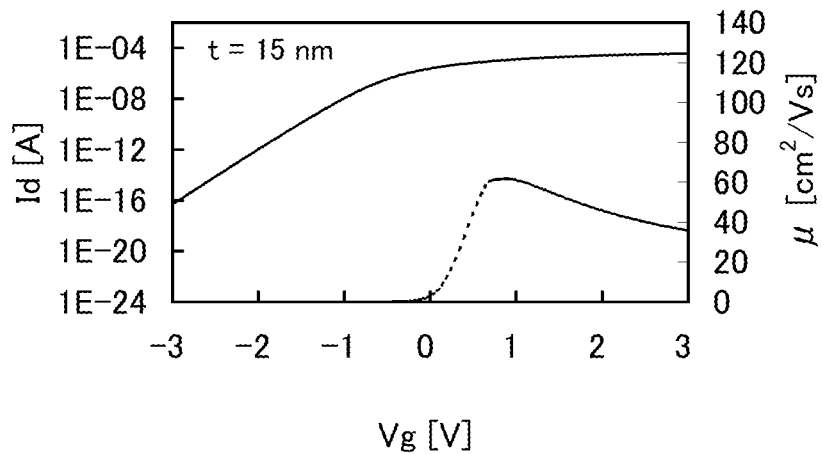
FIGS. 23A to 23C are graphs each showing results of calculation of a gate voltage dependence of drain current and mobility in a transistor including an oxide semiconductor.
Figure 23B:
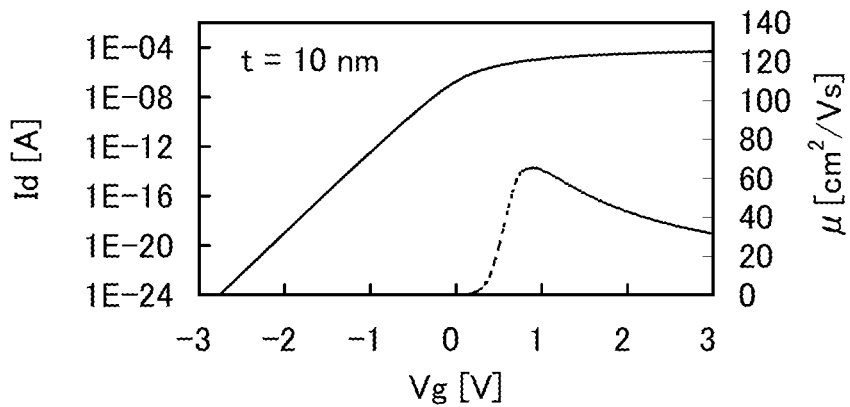
Figure 23C:
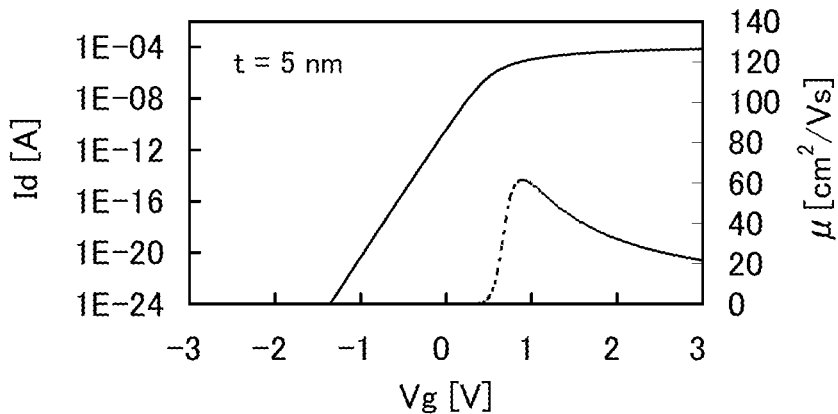

FIGS. 23A to 23C show the gate voltage $V_g$ dependence of the drain current $I_d$ (solid line) and the mobility μ (dotted line) of the transistor having the structure illustrated in FIG.

25B where the offset length $L_{off}$ is 5 nm. The drain current $I_d$ is obtained by calculation under the assumption that the drain voltage is +1 V and the mobility µ is obtained by calculation under the assumption that the drain voltage is +0.1 V. FIG. 23A shows the gate voltage $V_g$ dependence of the drain current $I_d$ and the mobility µ of the transistor in the case where the thickness of the gate insulator is 15 nm, FIG. 23B shows that of the transistor in the case where the thickness of the gate insulator is 10 nm, and FIG. 23C shows that of the transistor in the case where the thickness of the gate insulator is 5 nm.

Figure 24A:
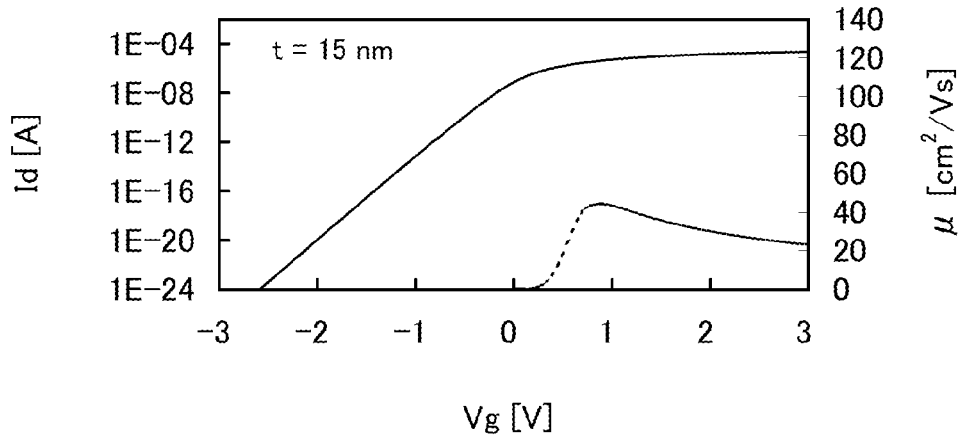
FIGS. 24A to 24C are graphs each showing results of calculation of a gate voltage dependence of drain current and mobility in a transistor including an oxide semiconductor.
Figure 24B:
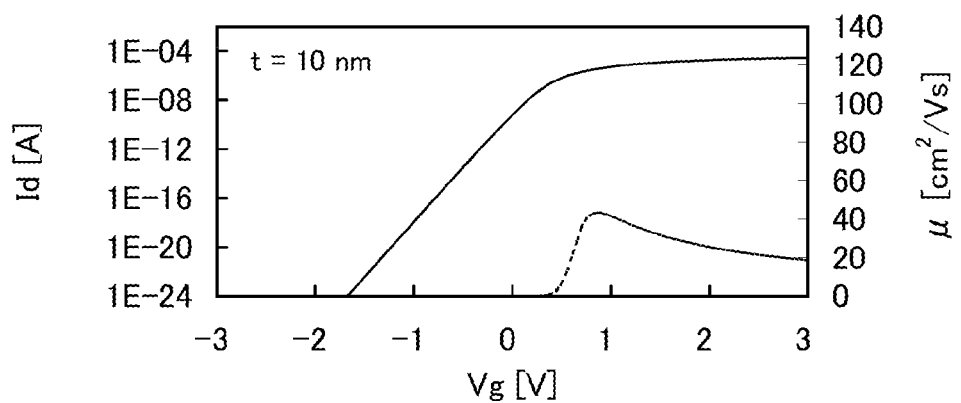
Figure 24C:
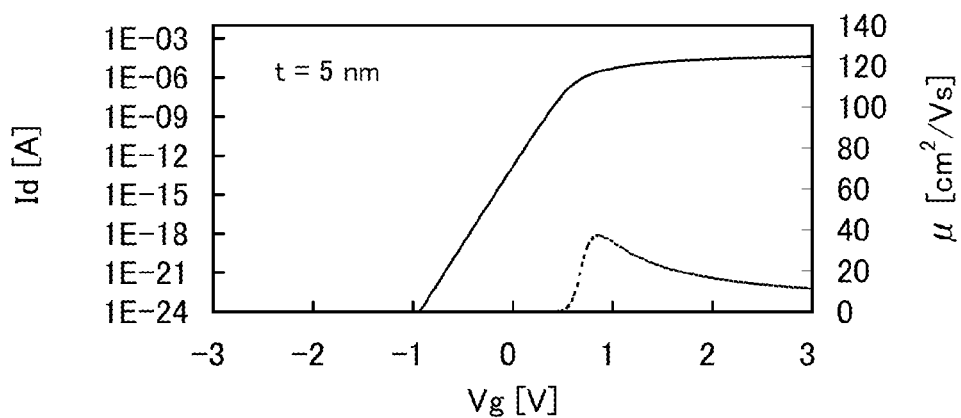
Figure 25A:
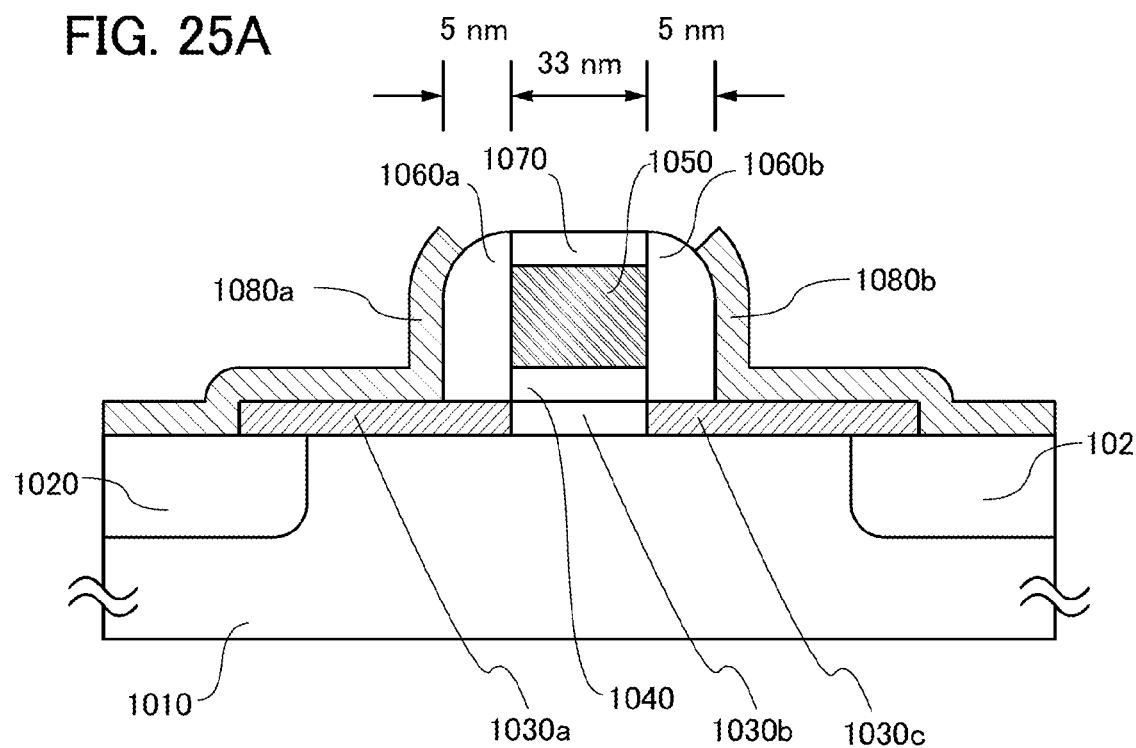
FIGS. 25A and 25B are diagrams illustrating cross-sectional structures of transistors which are used for calculation.
Figure 25B:
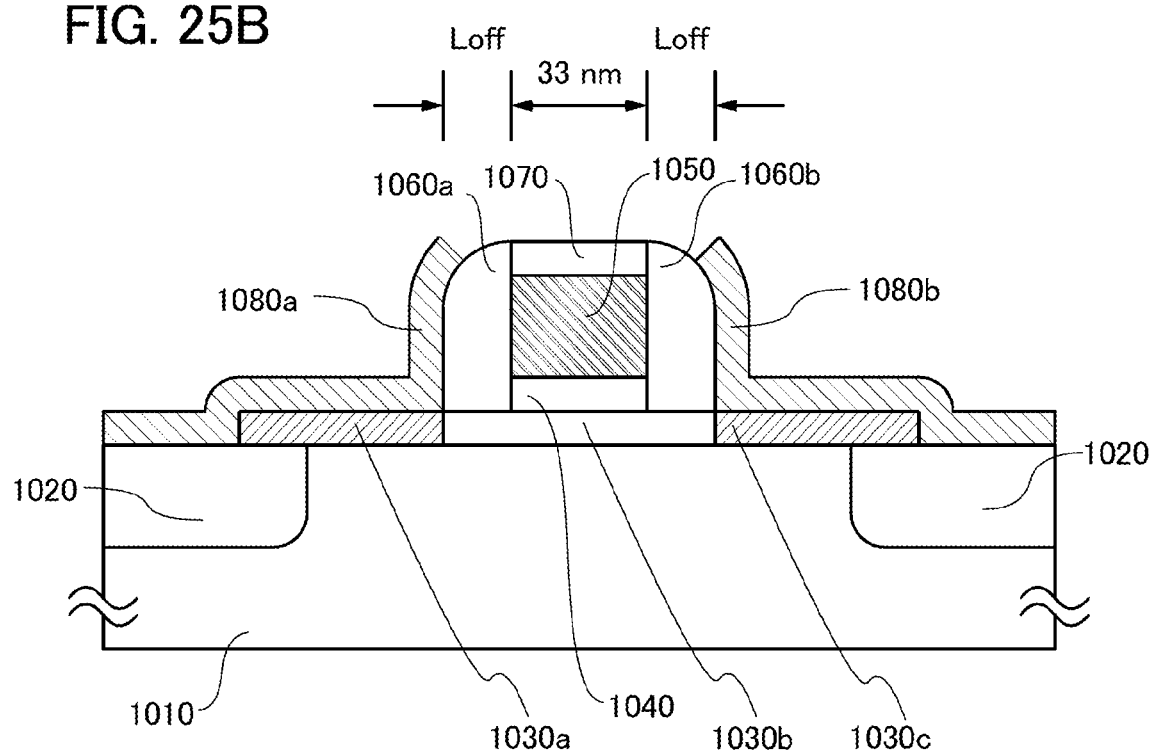

Further, FIGS. 24A to 24C show the gate voltage $V_g$ dependence of the drain current $I_d$ (solid line) and the mobility µ (dotted line) of the transistor having the structure illustrated in FIG. 25B where the offset length $L_{off}$ is 15 nm. The drain current $I_d$ is obtained by calculation under the assumption that the drain voltage is +1 V and the mobility µ is obtained by calculation under the assumption that the drain voltage is +0.1 V. FIG. 24A shows the gate voltage dependence $V_g$ of the drain current $I_d$ and the mobility µ of the transistor in the case where the thickness of the gate insulator is 15 nm, FIG. 24B shows that of the transistor in the case where the thickness of the gate insulator is 10 nm, and FIG. 24C shows that of the transistor in the case where the thickness of the gate insulator is 5 nm.

In either of the structures, as the gate insulator is thinner, the off-state current is significantly decreased, whereas no noticeable change arises in the peak value of the mobility µ and the on-state current.

Note that the peak of the mobility µ is approximately 80 cm$^2$/V·s in FIGS. 22A to 22C, approximately 60 cm$^2$/V·s in FIGS. 23A to 23C, and approximately 40 cm$^2$/V·s in FIGS. 24A to 24C; thus, the peak of the mobility µ is decreased as the offset length $L_{off}$ is increased. Further, the same applies to the off-state current. The on current is also decreased as the offset length $L_{off}$ is increased; however, the decrease in the on current is much more gradual than the decrease in the off-state current. Further, the graphs show that in either of the structures, the drain current exceeds 10 µA, which is required in a memory element and the like, at a gate voltage of around 1 V.

Here, a method for forming the CAAC-OS film is described.

First, an oxide semiconductor film is formed by a sputtering method, a molecular beam epitaxy method, an atomic layer deposition method, a pulsed laser deposition method, or the like. Note that by forming an oxide semiconductor film while keeping the semiconductor substrate 700 at high temperature, the ratio of a crystalline portion to an amorphous portion can be high. At this time, the temperature of the semiconductor substrate 700 is, for example, higher than or equal to 150° C. and lower than or equal to 700° C., preferably higher than or equal to 150° C. and lower than or equal to 450° C., more preferably higher than or equal to 200° C. and lower than or equal to 350° C.

Here, the oxide semiconductor film formed may be subjected to a heat treatment. By the heat treatment, the ratio of the crystalline portion to the amorphous portion can be higher. In this heat treatment, the temperature applied to the semiconductor substrate 700 over which the p-channel or n-channel transistor is provided is, for example, higher than or equal to 200° C. and lower than the strain point of the semiconductor substrate 700, more preferably higher than or equal to 250° C. and lower than or equal to 450° C. The heat treatment is performed for 3 minutes or longer and preferably performed for 3 minutes or longer and 24 hours or shorter. When the time for the heat treatment is increased, the ratio of the crystalline portion to the amorphous portion can be even higher; however, the productivity is decreased. Note that the heat treatment may be performed in, without limitation, an oxidizing atmosphere or an inert atmosphere. This heat treatment may be performed under a reduced pressure.

The oxidizing atmosphere is an atmosphere containing an oxidizing gas. Examples of the oxidizing gas include oxygen, ozone, nitrous oxide, and the like. It is preferable that components (e.g., water and hydrogen) which are not preferably contained in the oxide semiconductor film be removed from the oxidizing atmosphere as much as possible. For example, the purity of oxygen, ozone, or nitrous oxide is higher than or equal to 8N (99.999999%), preferably higher than or equal to 9N (99.9999999%).

The oxidizing atmosphere may contain an inert gas such as a rare gas. Note that the oxidizing atmosphere contains an oxidizing gas at a concentration of 10 ppm or higher.

Note that an inert atmosphere contains an inert gas (e.g., a nitrogen gas or a rare gas) and contains a reactive gas such as an oxidizing gas at a concentration of less than 10 ppm.

Note that a rapid thermal anneal (RTA) apparatus may be used for all the heat treatments. With the use of the RTA apparatus, only in a short time, the heat treatments can be performed at higher temperature. Thus, the oxide semiconductor film can have an even higher ratio of the crystalline portion to the amorphous portion and the productivity can be prevented from decreasing.

However, the apparatus used for all the heat treatments is not limited to the RTA apparatus; for example, an apparatus provided with a unit that heats an object to be processed by thermal conduction or thermal radiation from a resistance heater or the like may be used. Examples of the heat treatment apparatus used for all the heat treatments include an electric furnace and a rapid thermal anneal (RTA) apparatus such as a gas rapid thermal anneal (GRTA) apparatus or a lamp rapid thermal anneal (LRTA) apparatus. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed using a high-temperature gas as a heat medium. Here, the temperature of the high-temperature gas is preferably higher than the heat temperature of the object to be processed.

With the use of an In—Ga—Zn-based metal oxide in which the nitrogen concentration is $1\times10^{17}$ atoms/cm$^3$ to $5\times10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

The CAAC-OS film can be formed in the above manner.

The CAAC-OS film has high orderliness of a bond between metal and oxygen as compared to an oxide semiconductor film having an amorphous structure. In other words, in an oxide semiconductor film having an amorphous structure, the number of oxygen atoms coordinating to a metal atom may vary according to the kind of an adjacent metal, whereas in the CAAC-OS film, the number of oxygen atoms coordinating to a metal atom is substantially equal. Therefore, oxygen vacancies are hardly observed even at a microscopic level, and charge transfer and instability of electric conductivity due to hydrogen atoms (including hydrogen ions), alkali metal atoms, or the like can be prevented.

Therefore, a transistor is formed using the CAAC-OS film for a channel formation region, whereby the amount of change in the threshold voltage of the transistor between before and after light irradiation or a bias-temperature stress (BT) test performed on the transistor can be suppressed, and the transistor can have stable electrical characteristics.

Next, an etching mask is formed over the oxide semiconductor film and etching is performed, so that the oxide semiconductor layer 711 is formed (see FIG. 17A).

Then, the source electrode 712a and the drain electrode 712b are formed separately from each other and in contact with the oxide semiconductor layer 711 (see FIG. 17B).

The source electrode 712a and the drain electrode 712b may be selectively formed in such a manner that, for example, a conductive film (e.g., a metal film or a silicon film to which an impurity element imparting one conductivity type is added) is formed by a sputtering method, an etching mask is formed over the conductive film, and etching is performed. Alternatively, an inkjet method or the like may be used. Note that the conductive film to be the source electrode 712a and the drain electrode 712b may be formed with a single layer or by a plurality of stacked layers. For example, the conductive film may have a three-layer structure in which an Al layer is sandwiched between Ti layers. Note that the source electrode 712a and the drain electrode 712b also serve as signal lines.

Next, the gate insulating film 713 is formed over at least the channel formation region in the oxide semiconductor layer 711 (see FIG. 17C).

The gate insulating film 713 may be formed by, for example, a sputtering method using an insulating material (e.g., silicon nitride, silicon nitride oxide, silicon oxynitride, or silicon oxide). Note that the gate insulating film 713 may be formed with a single layer or by a plurality of stacked layers. In this embodiment, for example, a stacked structure of two layers in which a silicon oxynitride layer is stacked over a silicon nitride layer is employed. Note that in the case where the gate insulating film 713 is formed by a sputtering method, hydrogen and water can be prevented from entering the oxide semiconductor layer 711. Further, the gate insulating film 713 is preferably an insulating oxide film because oxygen can be supplied to compensate for oxygen vacancies.

Note that "silicon nitride oxide" contains more nitrogen than oxygen. Further, "silicon oxynitride" contains more oxygen than nitrogen.

The oxide semiconductor film may be processed by dry etching. For example, a chlorine gas or a mixed gas of a boron trichloride gas and a chlorine gas may be used as an etching gas used for the dry etching. However, there is no limitation thereto; wet etching may be used or another method capable of processing the oxide semiconductor film may be used.

The gate insulating film 713 contains oxygen at least in a portion in contact with the oxide semiconductor layer 711 and is preferably formed using an insulating oxide in which part of the oxygen is desorbed by a heat treatment. In other words, any of the materials given as the material of the interlayer insulating film 705 is preferably used. When the portion of the gate insulating film 713, which is in contact with the oxide semiconductor layer 711, is formed using silicon oxide, oxygen can be supplied to the oxide semiconductor layer 711 and reduction in the resistance of the transistor can be prevented.

Note that when the gate insulating film 713 is formed using a high-k material such as hafnium silicate (HfSiO$_x$ (x>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), hafnium oxide, yttrium oxide, or lanthanum oxide, gate leakage current can be reduced. Here, the gate leakage current refers to leakage current which flows between a gate electrode and a source or drain electrode. Further, a layer formed using the high-k material and a layer formed using any of silicon oxide, silicon oxynitride, silicon nitride, silicon nitride oxide, aluminum oxide, aluminum oxynitride, and gallium oxide may be stacked. Note that even when the gate insulating film 713 has a stacked structure, the portion in contact with the oxide semiconductor layer 711 is preferably formed using the above insulating oxide. Further, in order not to release oxygen from the oxide semiconductor layer 711, aluminum oxide or the like which hardly transmit oxygen is preferably formed over the insulating oxide. For example, as the gate insulating film 713, silicon oxide deposited by a sputtering method, aluminum oxide deposited by a sputtering method, and silicon oxynitride may be stacked in that order.

The thickness of the gate insulating film 713 is 1 nm to 300 nm, preferably 5 nm to 50 nm. When the thickness of the gate insulating film 713 is 5 nm or more, the gate leakage current can be particularly reduced.

Here, a third heat treatment may be further performed in an inert gas atmosphere or an oxygen gas atmosphere. Note that the third heat treatment can be performed under the same conditions as the second heat treatment, for example, at higher than or equal to 200° C. and lower than the strain point of the semiconductor substrate 700, preferably higher than or equal to 200° C. and lower than or equal to 400° C., more preferably higher than or equal to 250° C. and lower than or equal to 350° C. Hydrogen and water remaining in the oxide semiconductor layer 711 can be diffused into the gate insulating film 713 by the third heat treatment. Further, oxygen can be supplied to the oxide semiconductor layer 711 by the third heat treatment in which the gate insulating film 713 serves as a supply source.

The third heat treatment can be performed once or plural times either or both after the formation of the gate insulating film 713 over the oxide semiconductor layer 711 or/and after the formation of the conductive film to be the gate electrode 714.

By the heat treatments or the like, the hydrogen concentration in the oxide semiconductor layer 711 is preferably $5.0 \times 10^{19}$ atoms/cm$^3$ or lower, more preferably $5.0 \times 10^{18}$ atoms/cm$^3$ or lower.

Next, a conductive film is formed over the gate insulating film 713, an etching mask is formed over the conductive film, and etching is performed, so that the gate electrode 714 is formed (see FIG. 17D). Note that the gate electrode serves at least as a scan line.

The gate electrode 714 may be formed using the same material and method as the source electrode 712a and the drain electrode 712b.

Although not illustrated, a dopant is preferably added to the oxide semiconductor layer 711 by using the gate electrode 714 as a mask, so that a source region and a drain region are formed in the oxide semiconductor layer 711. Note that, here, the dopant may be added by an ion implantation method or an ion doping method. Alternatively, the dopant may be added by performing a plasma treatment in an atmosphere of a gas containing the dopant. As the added dopant, nitrogen, phosphorus, boron, or the like may be used.

In the case where the etching mask is formed using a resist material, the etching mask may be removed by ashing in formation of the transistor 710 illustrated in FIG. 17D.

Although not illustrated, a protective insulating film may be formed so as to cover the transistor 710. When the protective insulating film is a single layer, an insulating film that hardly permeates oxygen, hydrogen, and water, such as an aluminum oxide film, is preferably formed. When the protective insulating film is a stacked layer, an insulating oxide film which contains more oxygen than the stoichiometric composition ratio and which releases part of the oxygen by a heat treatment and an insulating film that hardly permeates oxygen, hydrogen, and water are preferably formed. For example, a stack of the insulating oxide film exemplified for the interlayer insulating film 705 and an aluminum oxide film is formed. Note that by using the aluminum oxide film as the protective insulating film, oxygen in the oxide semiconductor layer 711 can be prevented from being released outside and hydrogen and water can be prevented from entering from the outside to the oxide semiconductor layer 711; thus, the electrical characteristics of the transistor 710 can be made favorable.

After the formation of the protective insulating film, a heat treatment similar to the second or third heat treatment may be performed.

In the above manner, the transistor in which the channel formation region is formed in the oxide semiconductor layer formed can be fabricated over the transistor provided over the semiconductor substrate.

The transistor fabricated in the above manner can have an off-state current value of 10 aA/μm ($1 \times 10^{-17}$ A/μm) or lower, 1 aA/μm ($1 \times 10^{-18}$ A/μm) or lower, 1 zA/μm ($1 \times 10^{-21}$ A/μm) or lower, or 1 yA/μm ($1 \times 10^{-24}$ A/μm) or lower per micrometer of channel width at room temperature.

At least one of the conductive layers serving as the scan line and the signal lines is preferably formed using copper because the wiring can have lower resistance.

Further, the transistor described as the transistor in which the channel formation region is formed in the oxide semiconductor layer is an example; therefore, a transistor in which a channel formation region is formed in an oxide semiconductor layer can have a variety of modes without limitation to the above transistor.

Note that the contents of this embodiment or part thereof can be combined freely with the contents of other embodiments or part thereof.

Embodiment 10

This embodiment shows advantages of using a transistor having extremely low off-state current in a logic circuit according to one embodiment of the invention.

The logic circuit according to one embodiment of the invention includes the transistor having extremely low off-state current; therefore, even after the power supply of the logic circuit is OFF, a potential input to the logic circuit or a potential obtained by arithmetic processing can be kept. This is because the semiconductor device according to one embodiment of the invention has a nonvolatile property due to the transistor including an oxide semiconductor.

By providing, instead of the transistor having extremely low off-state current, an element which does not allow the potential input to the logic circuit or the potential obtained by arithmetic processing to be decreased even after the power supply of the logic circuit is OFF, the nonvolatile property can be obtained similarly to one embodiment of the invention. For example, a magnetic tunnel junction element (MTJ element) utilizing spintronics is known as the element which does not allow the potential to be decreased. The MTJ element stores data by setting a low-resistance state when the directions of spins in films provided above and below an insulating film are parallel, or a high-resistance state when the directions thereof are anti-parallel. Thus, its operation principle is quite different from that of a memory including an oxide semiconductor described in this embodiment.

Now, comparison is made between a nonvolatile logic circuit including the MTJ element and a nonvolatile logic circuit including the transistor including an oxide semiconductor, which is the transistor having extremely low off-state current, with reference to Table 1.

TABLE 1

| | Spintronics (MTJ element) | Oxide semiconductor/Si |
|---|---|---|
| 1. Heat resistance | Curie temperature | Process temperature around 500° C. (Reliability at 150° C.) |
| 2. Driving method | Current driving | Voltage driving |
| 3. Writing principle | Changing spin direction of magnetic body | On/off of FET |
| 4. Si LSI | Suitable for bipolar LSI (MOS device is preferable for high integration because bipolar device is unsuitable for high integration. Note that W gets larger.) | Suitable for MOS LSI |
| 5. Overhead | Large (due to high Joule heat) | Smaller by 2 to 3 or more orders of magnitude than the MTJ element (due to charging and discharging of parasitic capacitance) |
| 6. Non-volatility | Utilizing spin | Utilizing low off-state current |
| 7. Number of times electric charge can be held | Without limitation | Without limitation |
| 8. 3D conversion | Difficult (at most two layers) | Easy (the number of layers is limitless) |
| 9. Integration degree ($F^2$) | 4 $F^2$ to 15 $F^2$ | Depends on the number of layers stacked in 3D conversion (it is necessary to ensure heat resistance in process of forming upper OS FET) |
| 10. Material | Magnetic rare-earth element | Oxide semiconductor material |
| 11. Bit cost | High | Low (possibly slightly high depending on oxide semiconductor material (such as In)) |
| 12. Resistance to magnetic field | Low | High |

As shown in Table 1, the MTJ element is current-driven, so that a potential is input or held by changing the direction of the magnetic spin. In contrast, the transistor including an oxide semiconductor is voltage-driven, so that a potential is input or held by switching the on and off states of the transistor.

Both the MTJ element and the transistor including an oxide semiconductor can achieve a nonvolatile logic circuit without limitation on the writing time in theory.

The MTJ element is disadvantageous in that its magnetic properties are lost when the temperature is the Curie temperature or higher because it contains a magnetic material.

Further, the MTJ element is driven by current and thus is compatible with a silicon bipolar device. However, a silicon bipolar device is unsuitable for high integration. Furthermore, the MTJ element has a problem in that its power consumption is increased with the integration, although the MTJ element requires low write current.

In order to achieve high integration of semiconductor devices, a variety of elements are stacked to obtain three-dimensional integration. However, such three-dimensional integration is difficult for semiconductor devices including MTJ elements. In contrast, semiconductor devices including transistors including an oxide semiconductor are suitable for stacked three-dimensionally stacked integration.

In principle, the MTJ element has low resistance to a magnetic field, so that the spin direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that is sensitive to metal contamination. The material cost per element of the MTJ element is expensive.

On the other hand, the transistor including an oxide semiconductor has an element structure and an operation principle which are similar to those of a silicon MOSFET except that the channel formation region is formed using a semiconductor material such as a metal oxide. Further, the transistor including an oxide semiconductor layer is not affected by a magnetic field, and does not cause soft errors due to the magnetic field. Therefore, the semiconductor device according to one embodiment of the invention has a high stability against the magnetic field compared to a nonvolatile semiconductor device including the MTJ element. Further, the semiconductor device according to one embodiment of the invention may be highly compatible with a silicon integrated circuit.

From the above, in order to achieve a nonvolatile semiconductor device, a transistor having extremely low off-state current, in particular, a transistor including an oxide semiconductor is preferably used.

Note that the contents of this embodiment or part thereof can be combined freely with the contents of other embodiments or part thereof.

This application is based on Japanese Patent Application serial no. 2011-103821 filed with Japan Patent Office on May 6, 2011, the entire contents of which are hereby incorporated by reference.

What is claimed is:

1. A logic circuit comprising:
a first input terminal;
a second input terminal;
a first transistor comprising a first oxide semiconductor layer including a channel formation region;
a second transistor comprising a second oxide semiconductor layer including a channel formation region,
an output terminal; and
a main logic circuit portion comprising a third transistor including a portion formed in a substrate including a semiconductor material,
wherein one of a source and a drain of the first transistor is electrically connected to the first input terminal and the other of the source and the drain of the first transistor is electrically connected to the main logic circuit portion,
wherein one of a source and a drain of the second transistor is electrically connected to the second input terminal and the other of the source and the drain of the second transistor is electrically connected to the main logic circuit portion, and
wherein the main logic circuit portion is electrically connected to a first power supply potential line, a second power supply potential line, and the output terminal.

2. The logic circuit according to claim 1, wherein the first transistor and the second transistor each have a leakage current in an off state per micrometer of channel width is lower than or equal to $1\times10^{-17}$ A.

3. The logic circuit according to claim 1,
wherein a first node including the other of the source and the drain of the first transistor is configured to be in a floating state when the first transistor is in an off state, and
wherein a second node including the other of the source and the drain of the second transistor is configured to be in a floating state when the second transistor is in an off state.

4. The logic circuit according to claim 1, wherein the first oxide semiconductor layer and the second oxide semiconductor layer each comprise indium, gallium, and zinc.

5. The logic circuit according to claim 1,
wherein the logic circuit is configured to output a high-potential-side power supply potential when a low-potential input signal is input to at least one of the first input terminal and the second input terminal, and
wherein the logic circuit is configured to output a low-potential-side power supply potential when a high-potential input signal is input to the first input terminal and the second input terminal.

6. The logic circuit according to claim 1,
wherein the logic circuit is configured to output a high-potential-side power supply potential when a low-potential input signal is input to the first input terminal and the second input terminal, and
wherein the logic circuit is configured to output a low-potential-side power supply potential when a high-potential input signal is input to at least one of the first input terminal and the second input terminal.

7. The logic circuit according to claim 1,
wherein the logic circuit is configured to output a high-potential-side power supply potential when a high-potential input signal is input to the first input terminal and the second input terminal, and
wherein the logic circuit is configured to output a low-potential-side power supply potential when a low-potential input signal is input to at least one of the first input terminal and the second input terminal.

8. The logic circuit according to claim 1,
wherein the logic circuit is configured to output a high-potential-side power supply potential when a high-potential input signal is input to at least one of the first input terminal and the second input terminal, and
wherein the logic circuit is configured to output a low-potential-side power supply potential when a low-potential input signal is input to the first input terminal and the second input terminal.

9. The logic circuit according to claim 1,
wherein the logic circuit is configured to output a high-potential-side power supply potential when a high-potential input signal is input to either the first input terminal or the second input terminal, and wherein the logic circuit is configured to output a low-potential-side power supply potential when either a high-potential input signal or a low-potential input signal is input to the first input terminal and the second input terminal.

10. The logic circuit according to claim 1,
wherein the logic circuit is configured to output a high-potential-side power supply potential when either a high-potential input signal or a low-potential input signal is input to the first input terminal and the second input terminal, and
wherein the logic circuit is configured to output a low-potential-side power supply potential when a high-potential input signal is input to either the first input terminal or the second input terminal.

11. The logic circuit according to claim 1, wherein the main logic circuit portion is any one of a NAND circuit, a NOR circuit, an AND circuit, an OR circuit, an XOR circuit, and an XNOR circuit.

12. A logic circuit comprising:
a first input terminal;
an output terminal; and
a main logic circuit portion comprising:
a first transistor comprising a first oxide semiconductor layer including a channel formation region;
a second transistor comprising a second oxide semiconductor layer including a channel formation region; and
a third transistor including a portion formed in a substrate including a semiconductor material,
wherein the first input terminal is electrically connected to the main logic circuit portion,
wherein one of a source and a drain of the first transistor is electrically connected to a first power supply potential line,
wherein one of a source and a drain of the second transistor is electrically connected to a second power supply potential line, and
wherein the other of the source and the drain of the first transistor, the other of the source and the drain of the second transistor, and the output terminal are electrically connected to one another.

13. The logic circuit according to claim 12, wherein the first transistor and the second transistor each have a leakage current in an off state per micrometer of channel width is lower than or equal to $1 \times 10^{-17}$ A.

14. The logic circuit according to claim 12, wherein a node including the other of the source and the drain of the first transistor is configured to be in a floating state when the first transistor and the second transistor are in off states.

15. The logic circuit according to claim 12, wherein the first oxide semiconductor layer and the second oxide semiconductor layer each comprise indium, gallium, and zinc.

16. The logic circuit according to claim 12,
wherein the logic circuit is configured to output a high-potential-side power supply potential when a low-potential input signal is input to the first input terminal, and
wherein the logic circuit is configured to output a low-potential-side power supply potential when a high-potential input signal is input to the first input terminal.

17. The logic circuit according to claim 12, wherein the main logic circuit portion is a NOT circuit.

18. The logic circuit according to claim 12, further comprising a second input terminal electrically connected to the main logic circuit portion.

19. The logic circuit according to claim 18,
wherein the logic circuit is configured to output a high-potential-side power supply potential when a low-potential input signal is input to at least one of the first input terminal and the second input terminal, and
wherein the logic circuit is configured to output a low-potential-side power supply potential when a high-potential input signal is input to the first input terminal and the second input terminal.

20. The logic circuit according to claim 18,
wherein the logic circuit is configured to output a high-potential-side power supply potential when a low-potential input signal is input to the first input terminal and the second input terminal, and
wherein the logic circuit is configured to output a low-potential-side power supply potential when a high-potential input signal is input to at least one of the first input terminal and the second input terminal.

21. The logic circuit according to claim 18,
wherein the logic circuit is configured to output a high-potential-side power supply potential when a high-potential input signal is input to the first input terminal and the second input terminal, and
wherein the logic circuit is configured to output a low-potential-side power supply potential when a low-potential input signal is input to at least one of the first input terminal and the second input terminal.

22. The logic circuit according to claim 18,
wherein the logic circuit is configured to output a high-potential-side power supply potential when a high-potential input signal is input to at least one of the first input terminal and the second input terminal, and
wherein the logic circuit is configured to output a low-potential-side power supply potential when a low-potential input signal is input to the first input terminal and the second input terminal.

23. The logic circuit according to claim 18,
wherein the logic circuit is configured to output a high-potential-side power supply potential when a high-potential input signal is input to either the first input terminal or the second input terminal, and
wherein the logic circuit is configured to output a low-potential-side power supply potential when either a high-potential input signal or a low-potential input signal is input to the first input terminal and the second input terminal.

24. The logic circuit according to claim 18,
wherein the logic circuit is configured to output a high-potential-side power supply potential when either a high-potential input signal or a low-potential input signal is input to the first input terminal and the second input terminal, and
wherein the logic circuit is configured to output a low-potential-side power supply potential when a high-potential input signal is input to either the first input terminal or the second input terminal.

25. The logic circuit according to claim 18, wherein the main logic circuit portion is any one of a NAND circuit, a NOR circuit, an AND circuit, an OR circuit, an XOR circuit, and an XNOR circuit.

26. The logic circuit according to claim 1, wherein the first transistor and the second transistor are over the third transistor.

27. The logic circuit according to claim 12, wherein the first transistor and the second transistor are over the third transistor.

* * * * *